US012040628B2

(12) United States Patent
Guedon

(10) Patent No.: US 12,040,628 B2
(45) Date of Patent: Jul. 16, 2024

(54) LDO FREE WIRELESS POWER RECEIVER HAVING REGTIFIER

(71) Applicant: STMicroelectronics Asia Pacific Pte Ltd, Singapore (SG)

(72) Inventor: Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 374 days.

(21) Appl. No.: 17/576,052

(22) Filed: Jan. 14, 2022

(65) Prior Publication Data

US 2022/0140657 A1 May 5, 2022

Related U.S. Application Data

(63) Continuation-in-part of application No. 16/930,651, filed on Jul. 16, 2020, now Pat. No. 11,368,052.

(51) Int. Cl.
*H02M 1/08* (2006.01)
*H02J 50/12* (2016.01)
*H02M 1/00* (2006.01)
*H02M 7/219* (2006.01)

(52) U.S. Cl.
CPC ........... *H02J 50/12* (2016.02); *H02M 1/0025* (2021.05); *H02M 7/219* (2013.01)

(58) Field of Classification Search
CPC ........ H02J 50/12; H02J 50/10; H02M 1/0003; H02M 1/08; H02M 7/219; H02M 7/2195
See application file for complete search history.

(56) References Cited

U.S. PATENT DOCUMENTS 6,757,875 B2 6/2004 Matsuoka
9,001,543 B2 4/2015 Knoedgen
10,312,743 B2 * 6/2019 Ouda ...................... H02M 7/02
(Continued)

FOREIGN PATENT DOCUMENTS

CN 111030314 A 4/2020
DE 102015107957 A1 12/2015
(Continued)

OTHER PUBLICATIONS

EPO Search Report for counterpart EP Appl. No. 23150769, report dated May 23, 2023, 8 pgs.
(Continued)

*Primary Examiner* — Kyle J Moody
*Assistant Examiner* — Jye-June Lee
(74) *Attorney, Agent, or Firm* — Crowe & Dunlevy LLC

(57) ABSTRACT

A bridge rectifier is controlled by control circuitry to act a "regtifier" which both regulates and rectifies without the use of a traditional voltage regulator. To accomplish this, the gate voltages of transistors of the bridge that are on during a given phase may be modulated to dissipate excess power. Gate voltages of transistors of the bridge that are off during the given phase may alternatively or additionally be modulated to dissipate excess power. The regtifier may act as two half-bridges that each power a different voltage converter, with those voltage converters powering a battery. The voltage converters may be switched capacitor voltage converters that switch synchronously with switching of the two half-bridges as they perform rectification.

19 Claims, 48 Drawing Sheets

(56) References Cited

U.S. PATENT DOCUMENTS

| | | | | |
|---|---|---|---|---|
| 10,355,514 | B2 | 7/2019 | Terry et al. | |
| 11,025,156 | B2 | 6/2021 | Huang et al. | |
| 11,368,052 | B2 | 6/2022 | Guedon | |
| 2012/0081027 | A1 | 4/2012 | Anissimov | |
| 2016/0126844 | A1* | 5/2016 | Tschirhart | H02M 3/01 363/17 |
| 2017/0149353 | A1* | 5/2017 | Hung | H02M 7/217 |
| 2019/0113570 | A1 | 4/2019 | Astrauskas | |
| 2019/0296786 | A1 | 9/2019 | Cai et al. | |
| 2020/0166960 | A1 | 5/2020 | Poletto et al. | |
| 2021/0088567 | A1* | 3/2021 | Guedon | H02M 7/219 |
| 2021/0091597 | A1* | 3/2021 | Hegde | H02M 1/32 |
| 2022/0140657 | A1 | 5/2022 | Guedon | |
| 2022/0140744 | A1 | 5/2022 | Guedon | |
| 2023/0275508 | A1 | 8/2023 | Guedon et al. | |

FOREIGN PATENT DOCUMENTS

| | | | |
|---|---|---|---|
| EP | 3940945 | A1 | 1/2022 |
| GB | 2187312 | A | 9/1987 |
| JP | 2008154377 | A | 7/2008 |

OTHER PUBLICATIONS

Cheng, Lin, et al.: "A 6.78-MHz Single-Stage Wireless Charger With Constant-Current Constant-Voltage Charging Technique," IEEE Journal of Solid-State Circuits, vol. 55, No. 4, Apr. 2020, pp. 999-1010.

EPO Search Report for family-related EP Appl. No. 21184168.9, report dated Nov. 18, 2021, 9 pages.

* cited by examiner

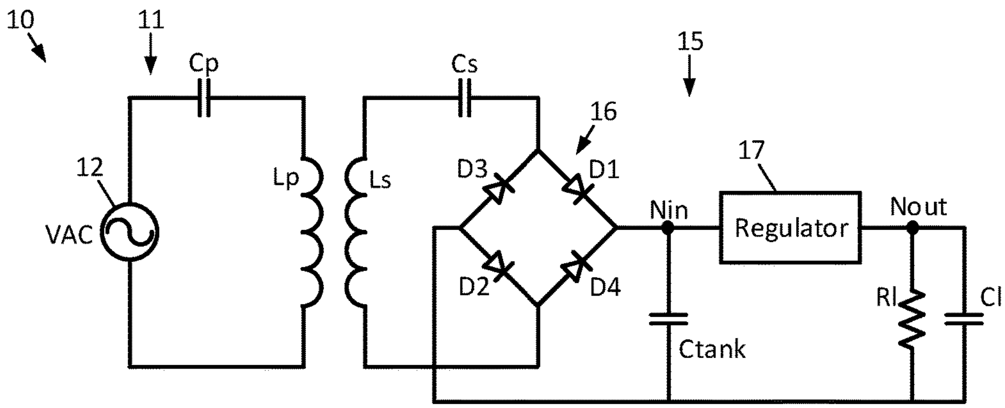
FIG. 1 (Prior Art)
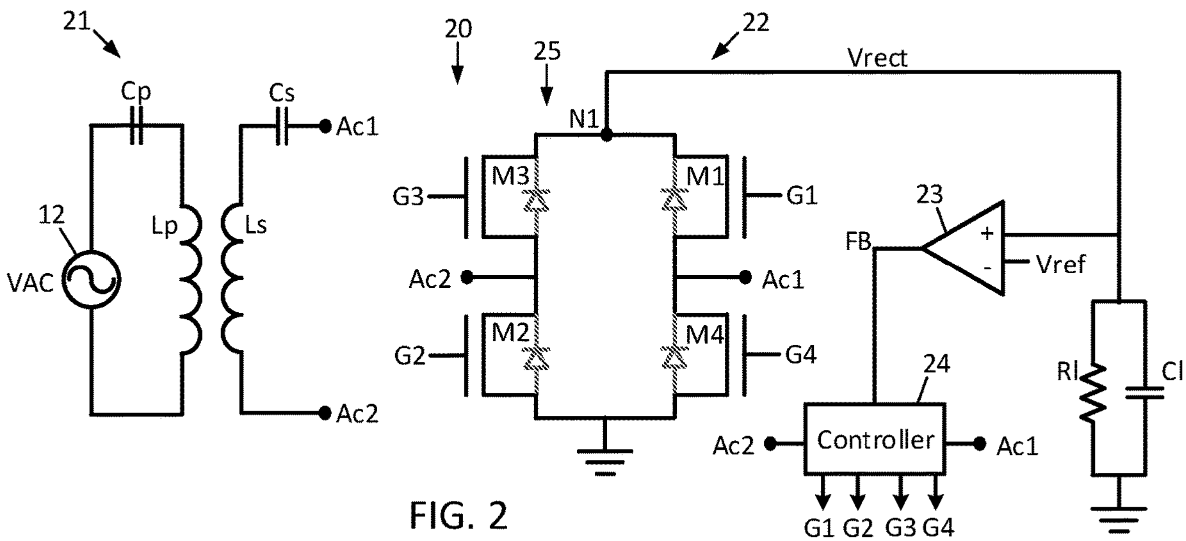
FIG. 2
FIG. 3
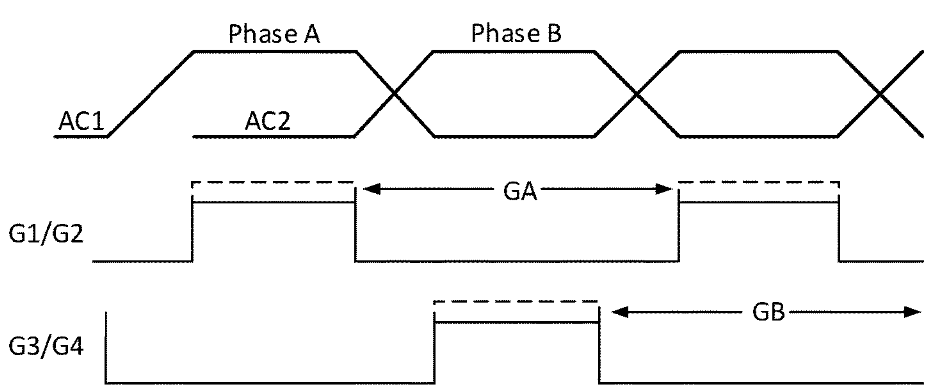

| FIG. 9A |
| --- |
| FIG. 9B |

| FIG. 22A |
|---|
| FIG. 22B |

| FIG. 24A |
|---|
| FIG. 24B |

LDO FREE WIRELESS POWER RECEIVER HAVING REGTIFIER

RELATED APPLICATION

This is a continuation-in-part of U.S. patent application Ser. No. 16/930,651, filed on Jul. 16, 2020, the contents of which is incorporated by reference in its entirety.

TECHNICAL FIELD

This disclosure is directed to the field of wireless power transmission and, in particular, to hardware, operating techniques for the hardware, and methods for causing a bridge rectifier to perform both rectification and regulation functions based on both voltage and current feedback.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. As shown in FIG. 1, a typical prior art wireless power transmission system 10 utilizes a transmitter 11 including a transmission coil Lp and a serial capacitance Cp forming a serial resonant L, C network, driven by electric power from a power source 12 (typically a wired connection, but in some cases a battery), that generates a time-varying electric field, and a receiver 15 including a receiver coil Ls and a serial capacitance Cs forming a similar serial resonant L, C network in which the time-varying electric field induces an AC current. Other possible configurations exist where L, C are in parallel on the primary side and/or the secondary side, offering four possible schemes—serial-serial, serial-parallel, parallel-serial, and parallel-parallel. Each scheme may present some advantages and/or disadvantages depending on the application, and the serial-serial configuration is the most widely used in recent developments for the mobile device market. The receiver 15 includes a bridge rectifier 16 (comprised of the illustrated diodes D1-D4) that rectifies the AC current to produce a DC current that charges a tank capacitor Ctank connected to an input node Nin of a regulator 17 to a regulator input voltage. The regulator 17, typically a low dropout amplifier, produces a regulated output voltage at its output node Nout, which is provided to a load (represented by the load resistance R1 and the load capacitance C1). While such prior art wireless power transmission systems 10 are functional and in wide use, the usage of the regulator 17 consumes a substantial amount of integrated circuit area due to its use of a large power MOS device. Since such wireless power transmission systems 10 are primarily utilized in portable electronic devices, this area consumption is undesirable. Therefore, further development into wireless power transmission systems is needed.

SUMMARY

Disclosed herein is a bridge rectifier is controlled by control circuitry to act a “regtifier” which both regulates and rectifies without the use of a traditional voltage regulator. To accomplish this, the gate voltages of transistors of the bridge that are on during a given phase may be modulated based upon feedback to dissipate excess power. Gate voltages of transistors of the bridge that are off during the given phase may alternatively or additionally be modulated based upon feedback to dissipate excess power. The regtifier may act as two half-bridges that each power a different voltage converter, with those voltage converters powering a battery. The voltage converters may be switched capacitor voltage converters that switch synchronously with switching of the two half-bridges as they perform rectification.

The feedback used for the control of the regtifier may be voltage feedback and/or current feedback, this feedback being taken either before the voltage converters or between the voltage converters and the battery.

The voltage converters may be switched capacitor voltage converters. In addition, there may also be a buck voltage converter configured to trickle charge the battery after full charging of the battery by the switched capacitor voltage converters.

BRIEF DESCRIPTION OF THE DRAWINGS

FIG. 1 is a schematic block diagram of a prior art wireless power transmission system.

FIG. 2 is a schematic block diagram of a wireless power transmission system disclosed herein in which the bridge rectifier also performs a regulation function, enabling the lack of an additional voltage regulation circuit.

FIG. 3 is a timing diagram showing voltages of the wireless power transmission system of FIG. 2 in operation, when the feedback loop is controlling the bridge rectifier to perform in-phase serial voltage regulation.

DETAILED DESCRIPTION

Figure 4:
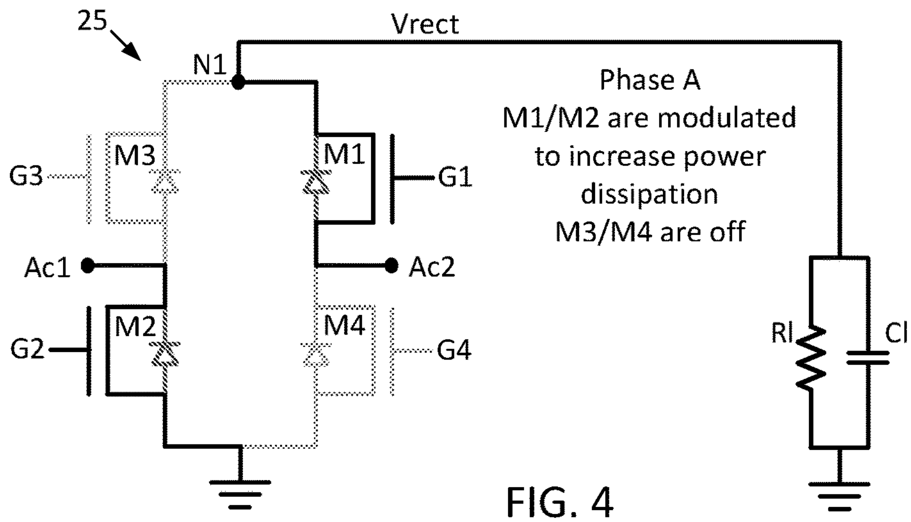
FIG. 4 is a schematic block diagram of the wireless power transmission system of FIG. 2 showing its operation during phase A of the in-phase serial voltage regulation of FIG. 3.

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that when transistors are described below as being "on", this means that those transistors are operating in the linear region or saturation region, and are not operating in the cut-off region.

A. Hardware Description

Now described with reference to FIG. 2 is a wireless power transmission system 20 including a transmitter 21 and a receiver 22. The transmitter 21 is comprised of an AC voltage source 12 coupled to a serial resonant transmitter coil Lp and capacitance Cp. The receiver 22 includes a serial resonant receiver coil Ls and capacitance Cs coupled between nodes Ac1 and Ac2, and a "regtifier" 25 (a bridge rectifier also capable of voltage regulation when controlled using techniques described below) formed by transistors M1-M4 coupled between node N1 and ground.

The regtifier is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An amplifier 23 has an inverting input terminal coupled to receive a reference voltage Vref (which is set to be equal to a desired output voltage Vrect at node N1), a non-inverting input terminal coupled to node N1, and an output coupled to control circuitry 24 and generating a feedback signal FB. A load is connected between node N1 and ground, and is represented by resistor R1 and capacitor C1. The control circuitry 24 itself receives input from the feedback signal FB, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitable modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit.

Therefore, the amplifier 23 and the control circuitry 24 form a feedback loop.

B. Operation Using In-Phase Serial Voltage Regulation

Operation of the wireless power transmission system 20 under an in-phase serial voltage regulation scheme controlled by the control circuitry 24 is now described.

Shown in the graph of FIG. 3 are waveform traces of the signals at the nodes Ac1 and Ac2. Notice that when the signal at Ac1 is positive, it is labeled as Phase A, that when the signal at Ac2 is positive, it is labeled as Phase B, and that the signals at Ac1 and Ac2 are 180° out of phase with one another.

During Phase A, corresponding to the positive phase of Ac1 and the negative phase of Ac2, the control signal GA is generated and driven to a high voltage (a level sufficient to fully turn on the transistors M1-M2) by the controller 24, and the control signal GB is generated and pulled to a low voltage (a level to fully turn off the transistors M3-M4) by the controller 24. Conversely, during Phase B, the control signal GB is driven to a high voltage by the controller 24 and the control signal GA is pulled to a low voltage by the controller 24. The controller 24 generates the gate voltages G1-G4 for the transistors M1-M4, and the values of G1-G4 depend upon the voltage values of the control signals GA and GB, the voltage of the feedback signal FB, and the current phase.

When the incoming power delivered by the regtifier 25 to the load is greater than the amount of power consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 so as to place the associated transistors M1-M4 into the linear region (ohmic region) of operation and increase the drain to source resistance of those transistors, resulting in the excess incoming power being dissipated within the activated transistors M1-M4 of the regtifier 25. This modulation continues throughout operation, with the result being that the voltage Vrect remains close to the reference voltage Vref.

When modulation of the gate voltages G1-G4 does not occur, the gate voltages G1-G2 are equal to the voltage of control signal GA.

1. Analog Control of Transistor Gates

In greater detail, as shown in FIG. 3, the gate voltages G1 and G2 are modulated during Phase A so that the transistors M1 and M2 are not fully on, increasing the drain to source resistance of transistors M1 and M2, resulting in additional power dissipation in transistors M1 and M2 over conventional operation; the gate voltages G3 and G4 remain pulled low such that the transistors M3 and M4 remain off. This configuration of the transistors M1-M4 can be seen in FIG. 4.

During Phase B, as shown in FIG. 3, the gate voltages G3 and G4 are modulated so that the transistors M3 and M4 are not fully on, increasing the drain to source resistance of transistors M3 and M4, resulting in additional power dissipation in transistors M3 and M4 over conventional operation; the gate voltages G1 and G2 remain pulled low such that the transistors M1 and M2 remain off. This configuration of the transistors M1-M4 can be seen in FIG. 5.

Figure 5:
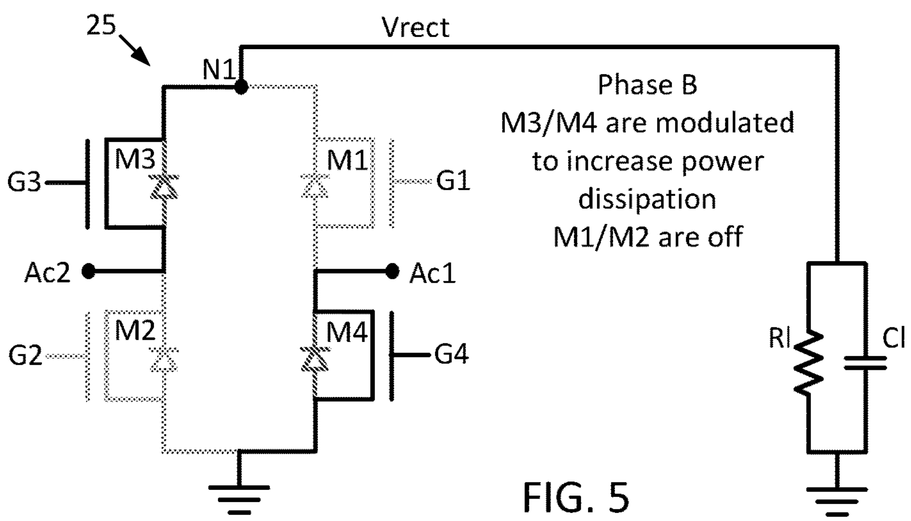
FIG. 5 is a schematic block diagram of the wireless power transmission system of FIG. 2 showing its operation during phase B of the in-phase serial voltage regulation of FIG. 3.

This operating scheme is referred to as in-phase serial regulation because the transistors M1-M4 that are conventionally fully on during a given phase are instead conductivity modulated, and as a result and as shown in FIGS. 4-5, the power dissipation is achieved by increasing the conductivity and voltage drop within elements which are in serial in the main current path to the load during the method.

Note that during Phase A, the voltage level of the gate voltages G1 and G2 need not both be modulated to increase the drain to source resistance of their respective transistors M1 and M2, and instead only one of the gate voltages G1 or G2 can be modulated to increase the drain to source resistance of its respective transistor M1 or M2 while the other control signal can remain high to keep its respective transistor M1 or M2 fully on.

Similarly, during Phase B, the voltage level of the gate voltages G3 and G4 need not both be modulated to increase the drain to source resistance of their respective transistors M3 and M4, and instead only one of the gate voltages G3 or G4 can be modulated to increase the drain to source resistance of its respective transistor M3 or M4 while the other control signal can remain high to keep its respective transistor M3 or M4 fully on.

The choice of applying the technique to one or more elements is to be appreciated/considered versus the maximum amount of excess power to be dissipated by the system.

Figures 9, 9A:
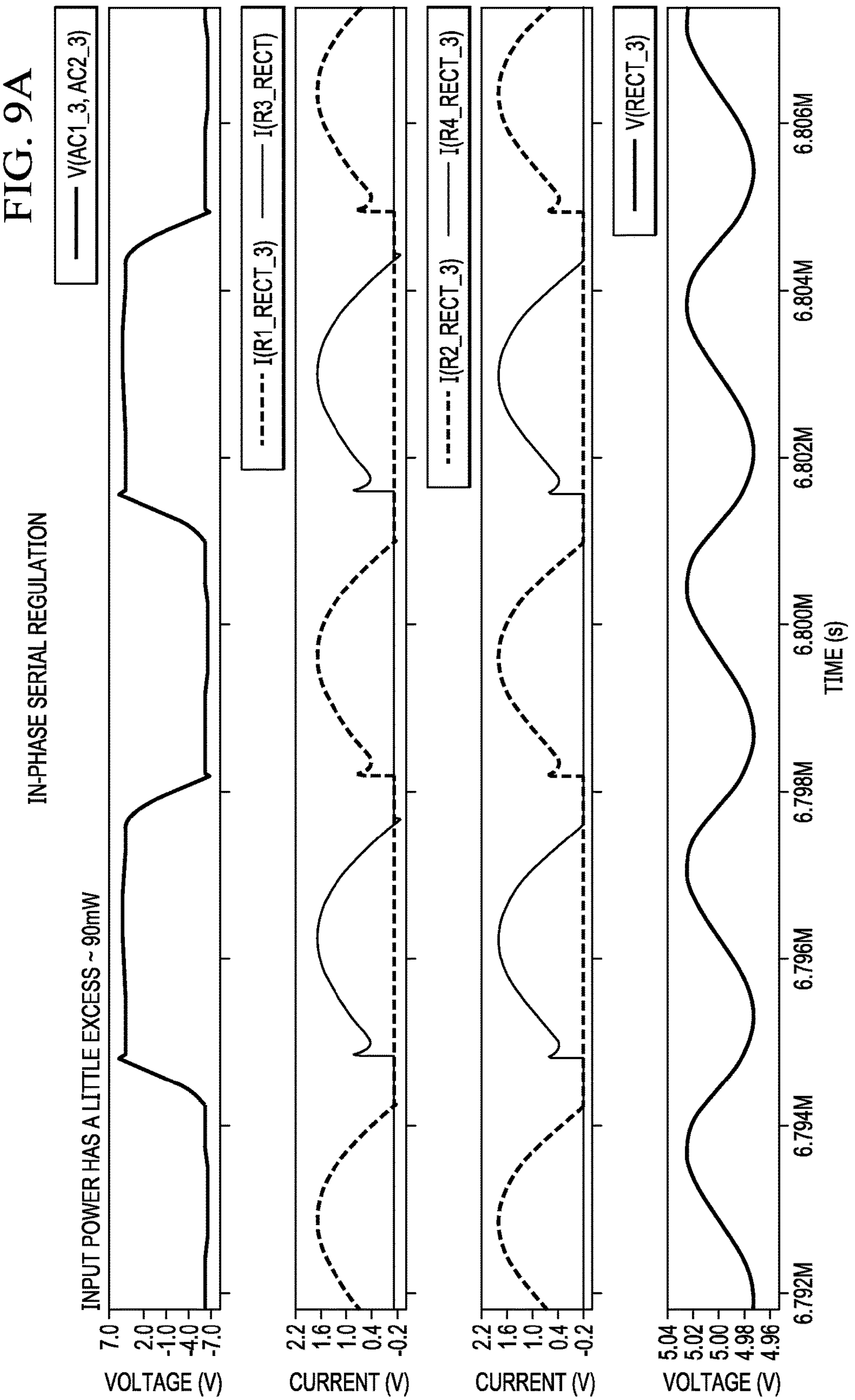
FIG. 9, which includes
FIGS. 9A and 9B, is a timing diagram showing voltages of the wireless power transmission system of FIG. 2 in operation, when the feedback loop is controlling the bridge rectifier to perform low-side in-phase serial voltage regulation. The regulation is applied on the low-side only in this example for allowing a better appreciation of the substantial difference between the drive signal applied to the low-side as per the wireless power transmission system disclosed herein and the conventional drive signal applied to the high-side as per the prior art.
Figure 9B:
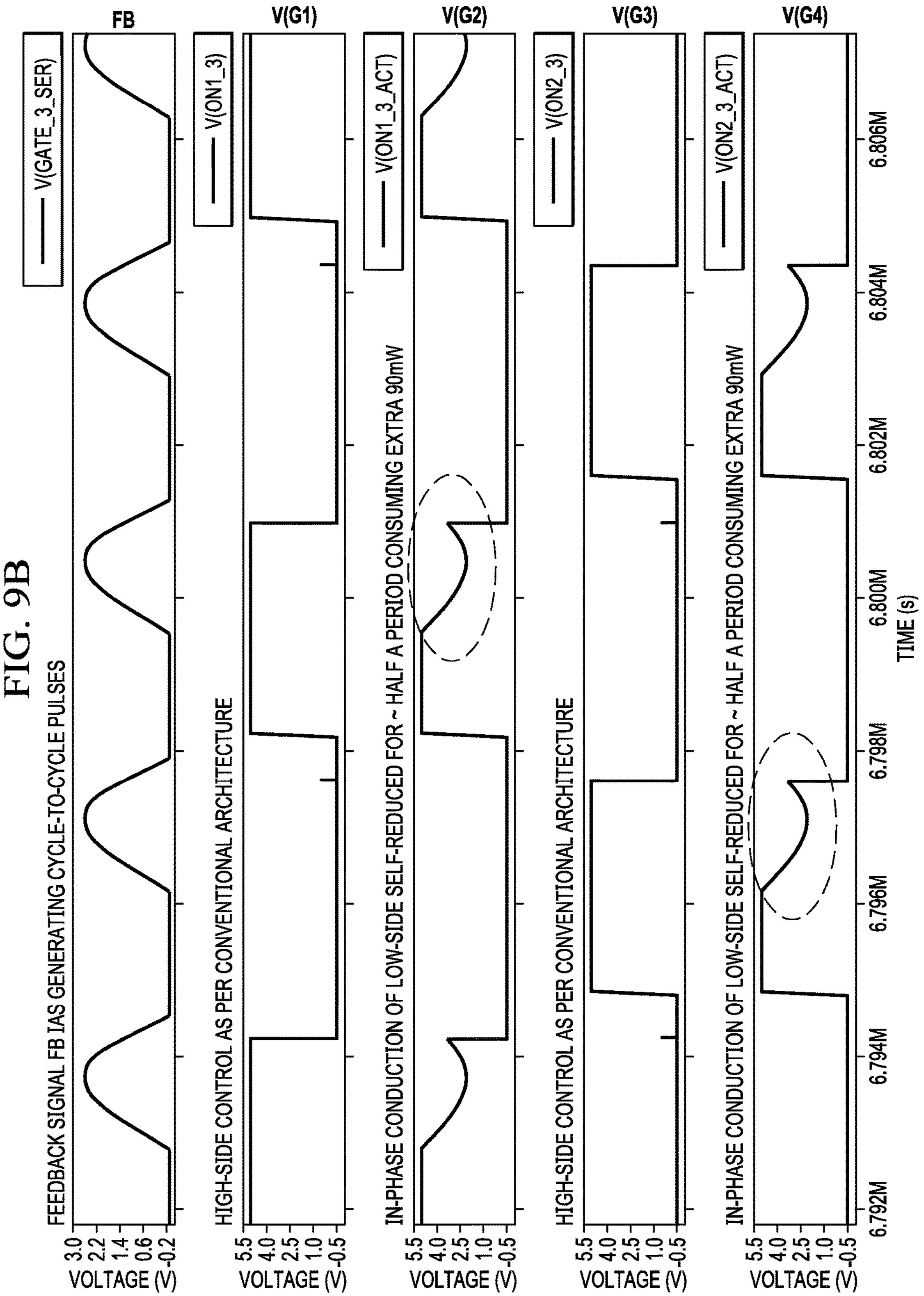

As an example of this form of operation where one transistor M1-M4 at a time is modulated, and the modulation is not flat across each pulse of the gate voltages, FIGS. 9, 9A, 9B show additional waveforms of the wireless power transmission system 20 operating using in-phase serial regulation. Here, it can be seen that during phase A, the gate voltage G2 of the transistor M2 (which turns on the transistor M2) is pulled from a steady high voltage of 5.0V to less than 4V while the gate voltage G1 of the transistor M1 (which turns on the transistor M1) remains high and the gate voltages G3 and G4 of the transistors M3 and M4 remain low. Here, it can also be seen that during phase B, the gate voltage G4 of the transistor M4 (which turns on the transistor M4) is pulled from a steady high voltage of 5.0V to less than 4V while the gate voltages G3 of the transistor M3 (which turns on the transistor G3) remains high and the gate voltages G1 and G2 of the transistors M1 and M2 remain low.

Notice that when the gate voltages G2 and G4 are pulled downward from being fully high so as to modulate the on-resistance of transistors M2 and M4, this is performed for approximately half the pulse of those gate voltages. However, if there is the need to consume additional power over this arrangement, the gate voltages G2 and G4 will be pulled downward lower from being fully high or longer than half the pulse of those gate voltages so as to modulate the on-resistance of transistors M2 and M4 for a longer period of time. The shape of the gate voltage mainly results from the gain of the feedback loop. These techniques are clearly applicable to the case where two transistors are simultaneously modulated.

The in-phase serial voltage regulation scheme described above is particularly suited to use where the voltage output Vrect by the regtifier 25 is relatively low and where the expected excess power to be dissipated is relatively low.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle-to-cycle basis when performing in-phase serial voltage regulation (meaning the gate voltages G1-G4 will naturally, by virtue of the feedback loop gain, self-adjust on the fly to have a different shape and magnitude during each cycle based on the incoming power within the alternance of the cycle, such that the gate voltages G1-G4 may begin a cycle having one magnitude but that magnitude may be changed during a portion of the cycle). This feedback technique can be observed in the graph of FIGS. 9, 9A, 9B, where the feedback signal FB is generated during each phase, enabling the control signals G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically. Waveforms showing this mode of operation, when operating using anti-phase parallel regulation can be seen in FIGS. 22, 22A, 22B and 23, and when operating using in-phase serial regulation can be seen in FIGS. 24, 24A, 24B and 25.

2. PWM Control of Transistor Gates

In the description given above, the gate voltages G1-G4 of the transistors M1-M4 are modulated in an analog fashion by the control circuitry 24 to perform in-phase serial voltage regulation. Now, techniques for modulating the gate voltages G1-G4 of the transistors M1-M4 using pulse width modulation (PWM) to perform in-phase serial voltage regulation are described.

A first way in which to operate the gates of the transistors from among M1-M4 to be regulated involves simple on-off PWM. Here the amplifier 23 is configured as a comparator to provide the feedback signal FB as a digital output, resulting in a pulse FB during which the output voltage Vrect exceeds the reference voltage Vref. During this pulse, the transistors from among M1-M4 that are fully on during the current phase are turned fully off in response to the rising of FB by their respective gate voltages being pulled to ground, in turn increasing power dissipation. Thus, through feedback, the duration of the gate voltages G1-G4 driving the transistors M1-M4 are adjusted so that the output pulse duration of the regtifier 25 is just long enough to provide the requisite power but just short enough to dissipate excess power.

Figure 12:
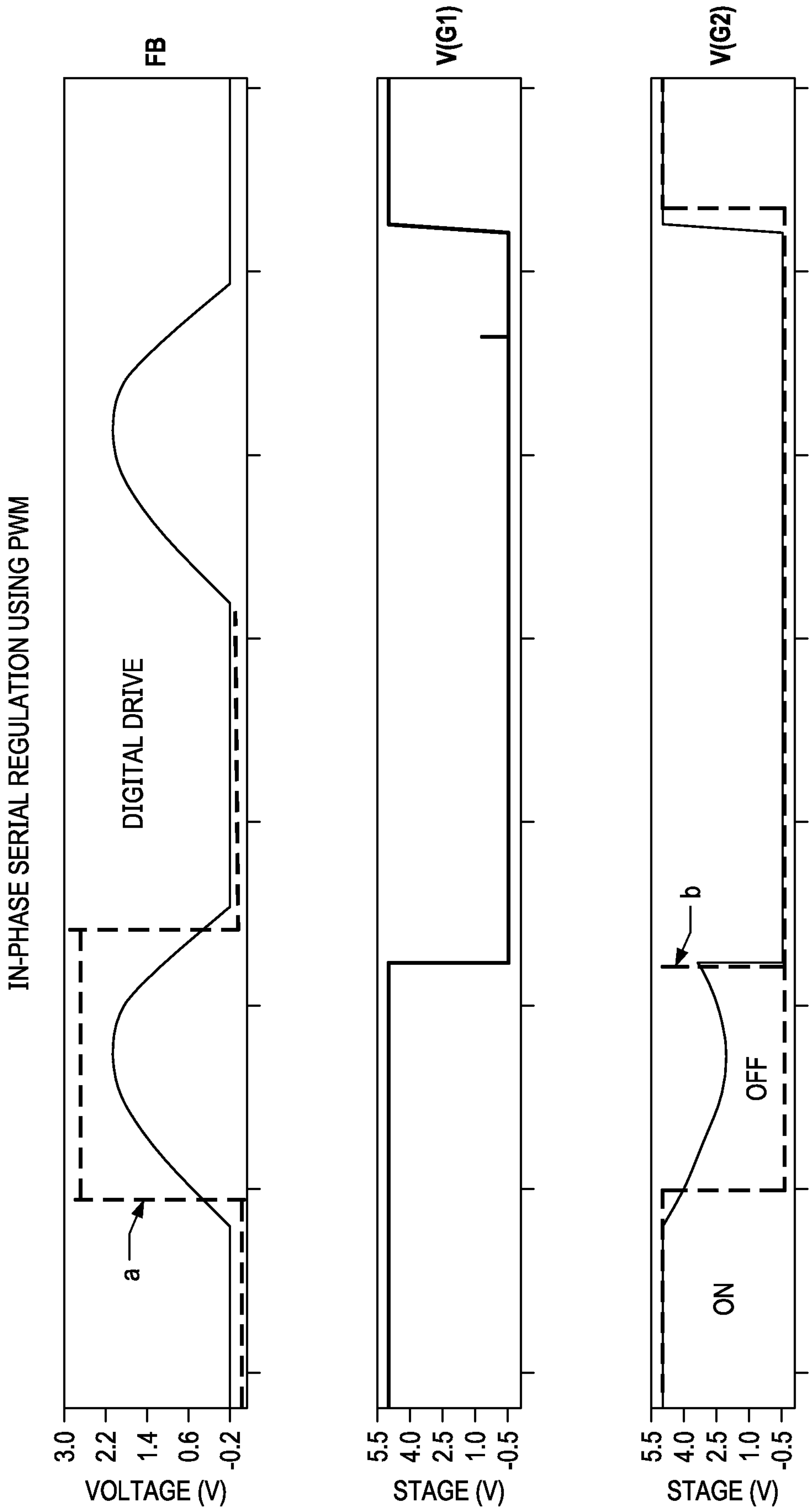
FIG. 12 is a timing diagram showing the digitization of the feedback signal FB and the PWM control of the modulated transistors, when operating using PWM based in-phase serial voltage regulation.
Figures 13, 13A:
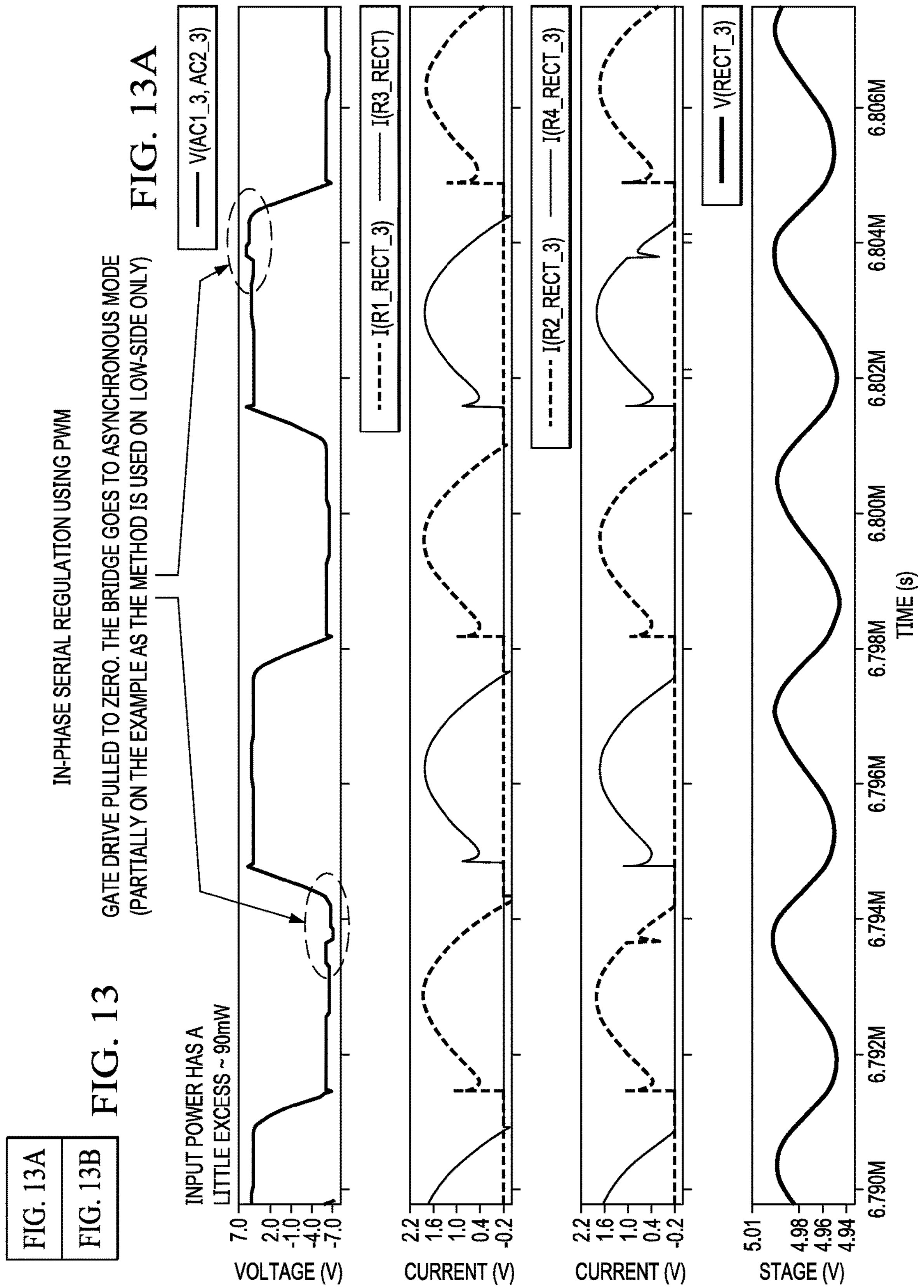
FIG. 13, which includes
FIGS. 13A and 13B, is a timing diagram showing voltages of the wireless power transmission system of FIG. 2 in operation, when the feedback loop is controlling the bridge rectifier to perform low-side PWM based in-phase serial voltage regulation.

A simple example of this technique as compared to the non-PWM in-phase serial voltage rectification technique can be seen in the traces of FIGS. 12-13, where it can be seen that here the feedback signal FB is digitized, that the gate voltage G1 is maintained as fully high during Phase A, and that the gate voltage G2 is pulled low approximately halfway through Phase A to increase the drain to source resistance of the transistor M2 to increase power dissipation. Note that as shown, spikes may occur in the gate voltage G2 being modulated, and these spikes may be filtered by the control circuitry 24, such as by using a debouncing function.

Figure 13B:
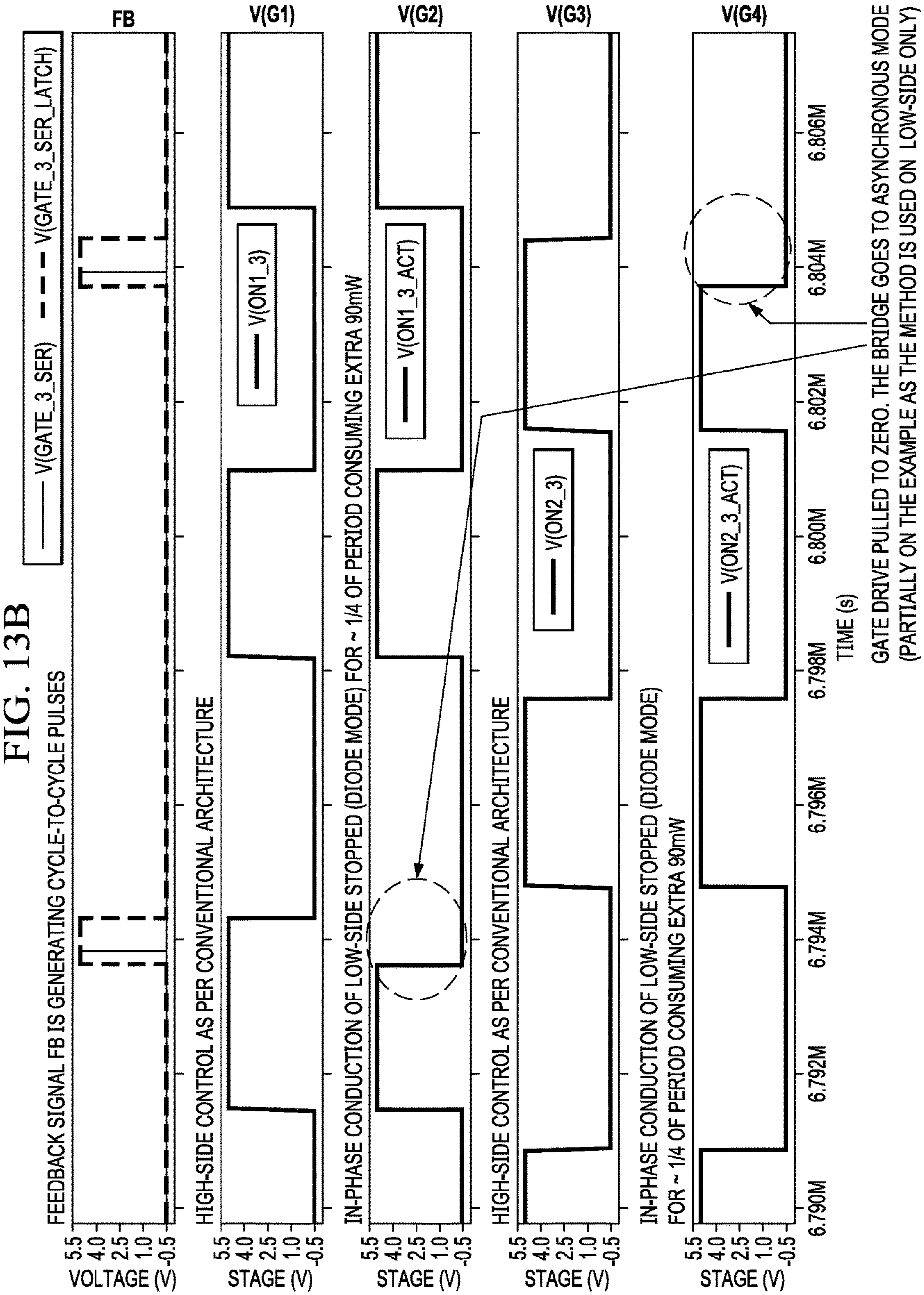
Figure 14:
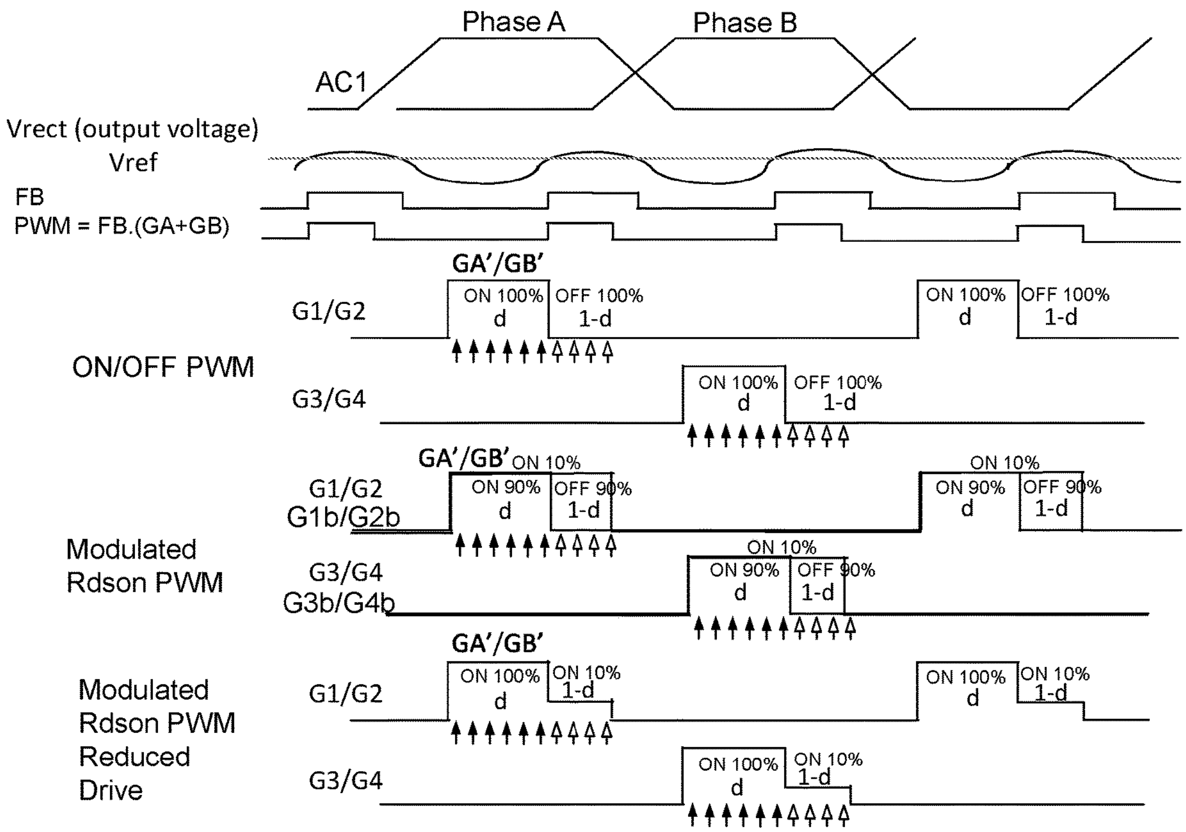
FIG. 14 are timing diagrams showing the three different PWM control techniques available when the feedback loop is controlling the bridge rectifier to perform low-side PWM based in-phase serial voltage regulation.

In the example of FIGS. 13, 13A, 13B, the gate voltages G2 and G4 of the low side transistors (M2 and M4) are modulated while the gate voltages G1 and G3 of the high side transistors (M1 and M3) are not. However, both low side and high side transistors may be modulated. As shown in FIG. 14, during phase A, so as to provide for voltage regulation, the gate voltages G1 and G2 are fully turned off (in response to the feedback signal FB rising, which as can be seen, occurs when Vrect exceeds Vref) earlier than they would otherwise be using a conventional wireless power transmission system, maintaining the output voltage Vrect at a desired level and dissipating excess power. Similarly, during phase B, so as to provide for voltage regulation, the gate voltages G3 and G4 are fully turned off (in response to the feedback signal FB rising) earlier than they would otherwise be using a conventional wireless power transmission system, maintaining the output voltage Vrect at a desired level and dissipating excess power.

Figure 15:
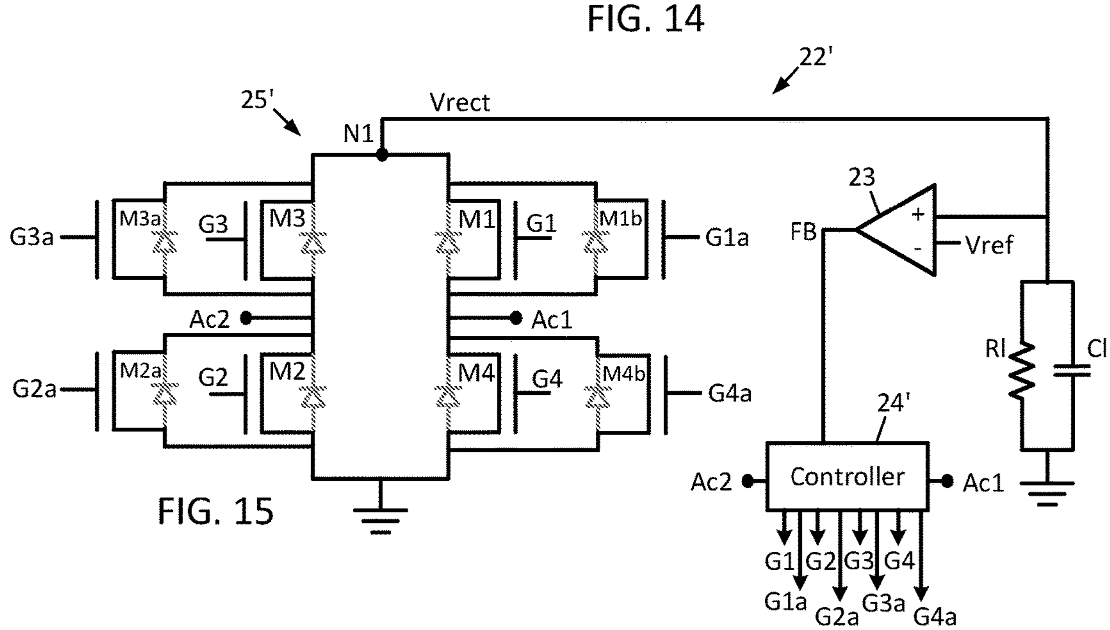
FIG. 15 is a schematic diagram of an alternate configuration for the regtifier of FIG. 2.
Figures 16, 16A:
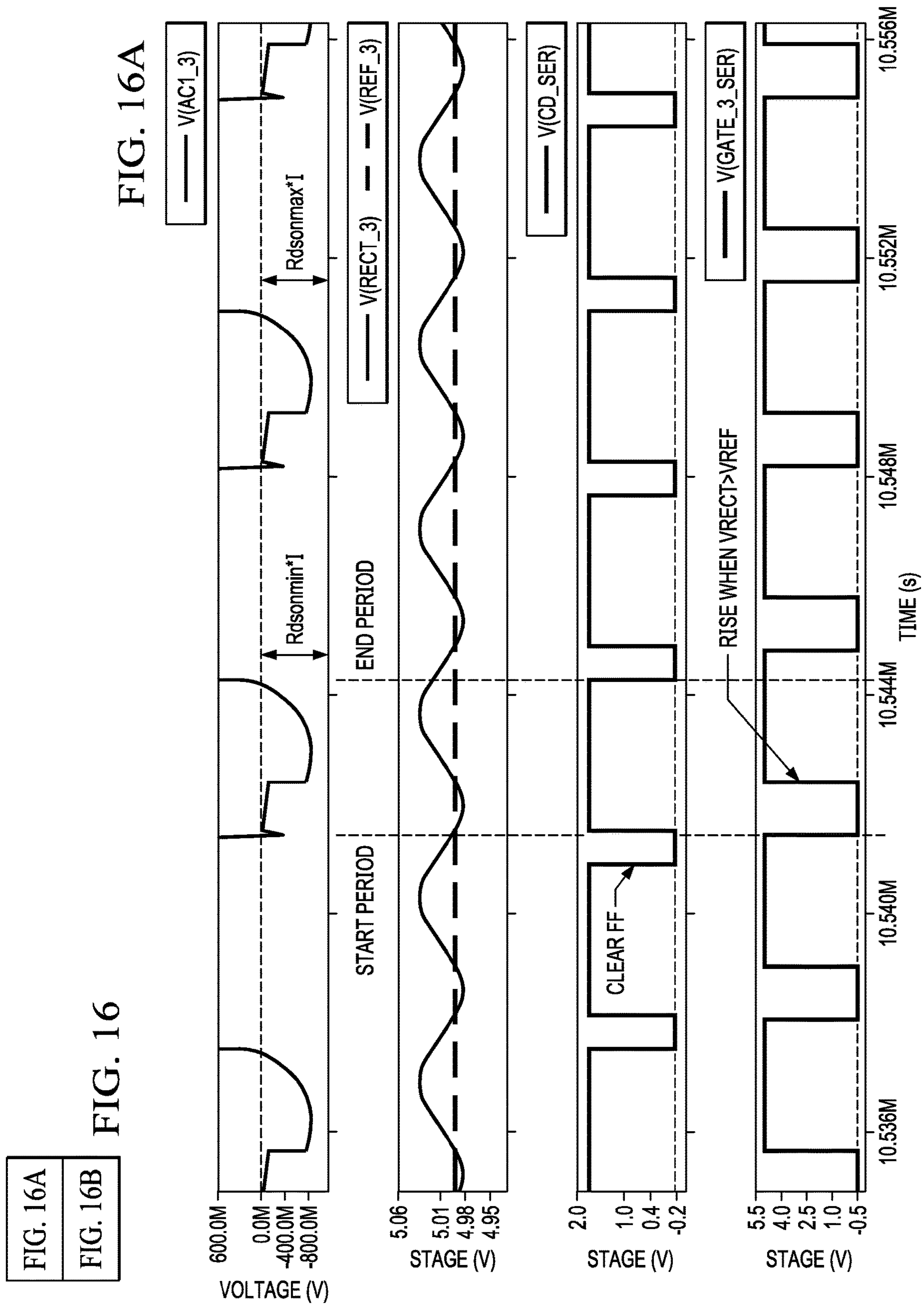
FIG. 16, which includes
FIGS. 16A and 16B, is a timing diagram showing one of the PWM control techniques available when the feedback loop is controlling the bridge rectifier to perform low-side PWM based in-phase serial voltage regulation using the regtifier.
Figure 16B:
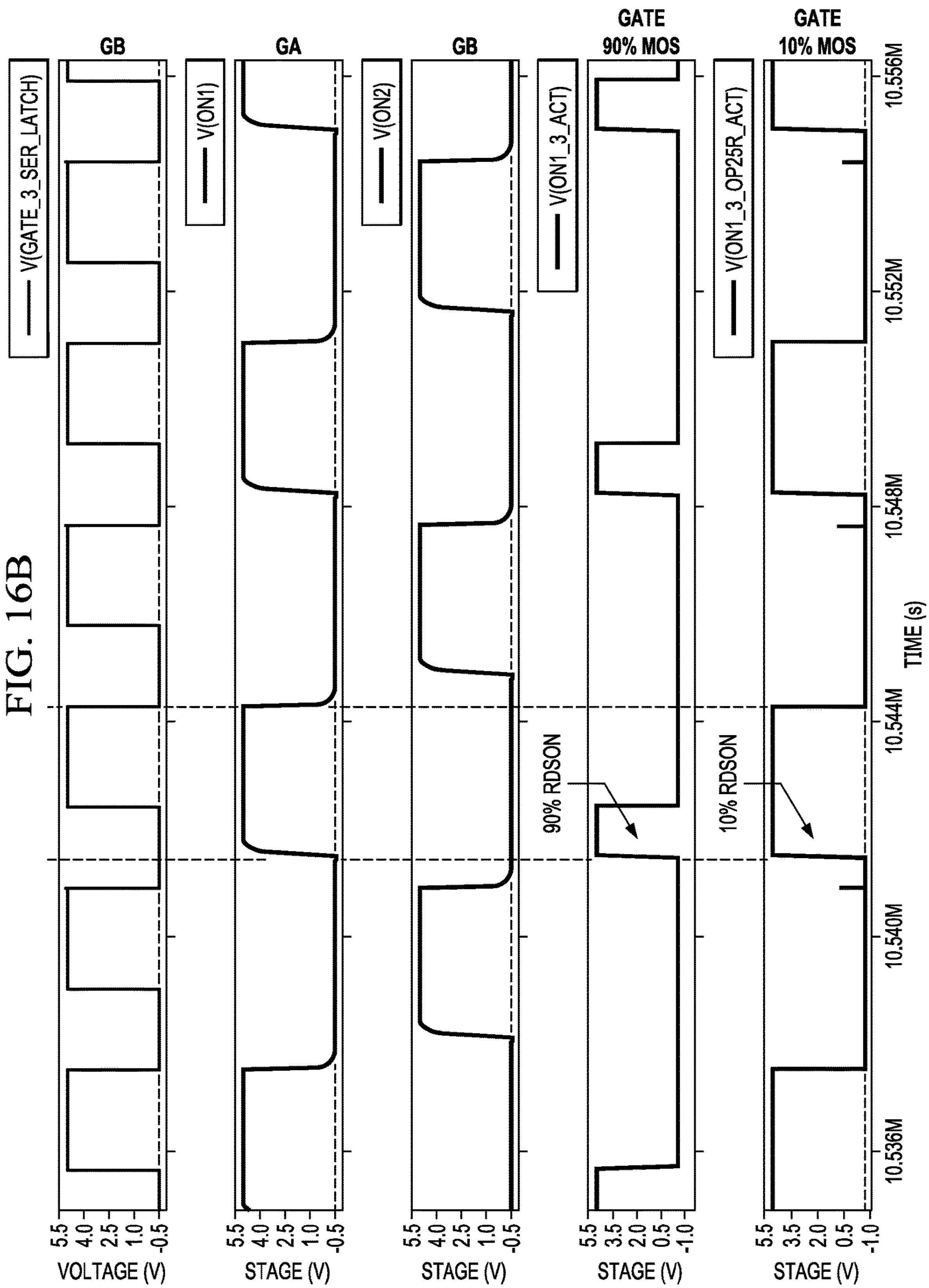

A second way in which to operate the gates of the transistors from among M1-M4 to be regulated involves modifying the regtifier itself to produce a modified regtifier 25'. As can be seen in FIG. 15, each transistor of the regtifier 25' has been divided into two parallel coupled transistors having different W/L ratio as one another so as to provide different resistivities when controlled individually, with the sum of the widths and lengths of the transistors of each parallel coupled pair being equal to the width and length of the corresponding transistor of the regtifier 25, so as to provide a total the same as the regtifier 25 resistivity when fully ON. Therefore, the regtifier 25 is comprised of: n-channel transistors M1 and M1*b* coupled in parallel, with their drains coupled to node N1, their sources coupled to node Ac1, and their gates respectively coupled to receive the gate voltages G1 and G1*a*; n-channel transistors M4 and M4*b* coupled in parallel, with their drains coupled to node Ac1, their sources coupled to ground, and their gates respectively coupled to receive the control signals M4 and M4*a*; n-channel transistors M3 and M3*a* coupled in parallel, with their drains coupled to node N1, their sources coupled to node Ac2, and their gates respectively coupled to receive the gate voltages G3 and G3*a*; and n-channel transistors M2 and M2*a* coupled in parallel, with their drains coupled to node Ac2, their sources coupled to ground, and their gates respectively coupled to receive the gate voltages G2 and G2*a*.

The area of the transistor M1 in the regtifier 25' is 90% of the area of the transistor M1 in the regtifier 25 and the area of the transistor M1*a* in the regtifier 25' is 10% of the area of the transistor M1 in the regtifier 25; the area of the transistor M2 in the regtifier 25' is 90% of the area of the transistor M2 in the regtifier 25 and the area of the transistor M2*a* in the regtifier 25' is 10% of the area of the transistor M2 in the regtifier 25; the area of the transistor M3 in the regtifier 25' is 90% of the area of the transistor M3 in the regtifier 25 and the area of the transistor M3*a* in the regtifier 25' is 10% of the area of the transistor M3 in the regtifier 25; and the area of the transistor M4 in the regtifier 25' is 90% of the area of the transistor M4 in the regtifier 25 and the area of the transistor M4*a* in the regtifier 25' is 10% of the area of the transistor M4 in the regtifier 25. Note that the relative sizes of the transistors M1-M4 described above may change, and that, for example, the transistors M1-M4 of the regtifier 25' may be 80% of the area of the transistors M1-M4 of the regtifier 25, while the transistors M1*a*-M4*a* of the regtifier 25' may be 20% of the area of the transistors M1-M4 of the regtifier 25.

Together with this, the control circuitry 24' is also modified, as shown in FIG. 15, to output the gate voltages G1*a*-G4*a* in addition to the gate voltages G1-G4.

With this modified regtifier 25', as can be seen in FIGS. 14 and 16, 16A, 16B during phase A, the gate voltages G1*a* and G2*a* are fully high for the entire phase, while the gate voltages G1 and G2 are fully high for a first portion of the phase and then fall low for the remainder of the phase. Similarly, during phase B, the gate voltages G3*a* and G4*a* are fully high for the entire phase, while the gate voltages G3 and G4 are fully high for a first portion of the phase and then fall low for the remainder of the phase. Using this technique helps avoid the inducing of noise that can result when a transistor that is fully on is turned off, since the transistors G1*a* and G2*a* remain on for the remainder of Phase A when the transistors G1 and G2 are turned off, and since the transistors G3*a* and G4*a* remain on for the remainder of Phase B when the transistors G3 and G4 are turned off.

A third way in which to operate the gates of the transistors from among M1-M4 to be regulated involves switching the gate voltages G1-G4 between first and second pre-determined constant drive voltages. As shown in FIG. 14 during phase A, the gate voltages G1 and G2 are fully high (the first constant drive voltage) for a first portion of the phase and then fall to the second constant drive voltage for the remainder of the phase. Similarly, during phase B, the gate voltages G3 and G4 are fully high (the first constant drive voltage) for a first portion of the phase and then fall to the second constant drive voltage for the remainder of the phase. The first portion of Phases A and B may be about 90% of the total elapsed time of those phases, while the second portion of Phases A and B may be the remainder of the total elapsed time of those phases.

It is to be noted that while the first way of operating the gates in FIG. 14 may induce noise that can result when a transistor is turned off, while the second way may lead to high current density in the small device (10%) during repeated lapses of time, the third way has the benefit of simplicity of the digital approach as it uses only two drive levels, but also allows minimization of the current density in the devices as would the analog method.

Note that the feedback loop formed by the amplifier 23 and the control circuitry 24 may be operated at a sufficient speed so that its duty cycle reacts on a cycle-to-cycle basis, enabling the control circuitry 24 to alter the generation of the gate voltages G1-G4 on a cycle to cycle basis when performing in-phase serial voltage regulation. This feedback technique can be observed in the graph of FIGS. 9, 9A, 9B, where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, leading to a slow-moving duty cycle, allowing the gates of the transistors M1-M4 to be driven pseudo-statically.

C. Operation Using Anti-Phase Parallel Voltage Regulation

Operation of the wireless power transmission system 20 under an anti-phase parallel voltage regulation scheme controlled by the control circuitry 24 is now described.

Figure 6:
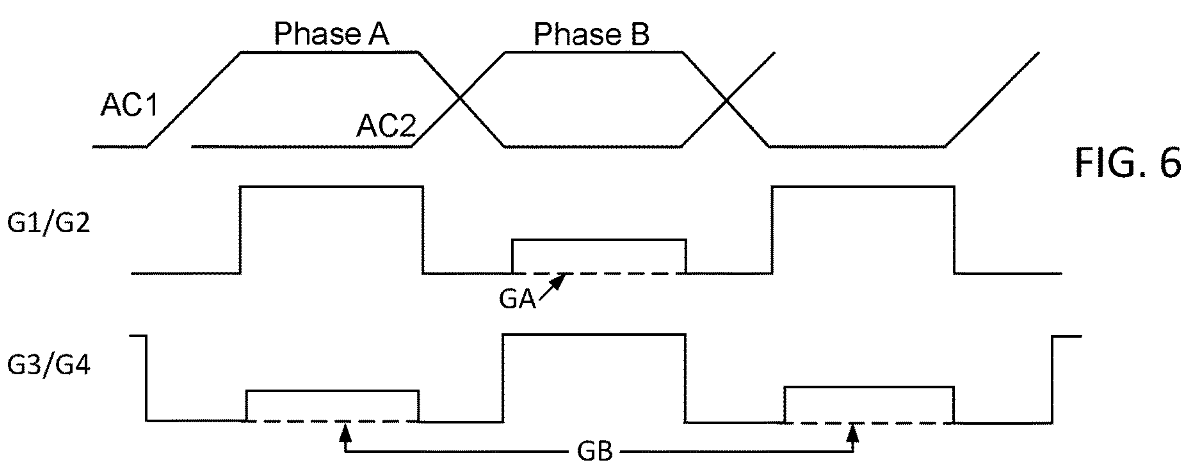
FIG. 6 is a timing diagram showing voltages of the wireless power transmission system of FIG. 2 in operation, when the feedback loop is controlling the bridge rectifier to perform anti-phase parallel voltage regulation.

Shown in the graph of FIG. 6 are waveform traces of the signals at the nodes Ac1 and Ac2. Notice that when the signal at Ac1 is high, it is labeled as Phase A, that when the signal at Ac2 is high, it is labeled as Phase B, and that the signals at Ac1 and Ac2 are 180° out of phase with one another.

During Phase A, the gate voltages G1 and G2 are driven, fully turning on transistors M1 and M2, while during Phase B, the gate voltages G3 and G4 are driven, instead fully turning on transistors M3 and M4. Conventionally, the transistors from among M1-M4 not turned on during a given phase are fully turned off.

However, with the anti-phase parallel voltage regulation scheme, when the incoming power delivered by the regtifier 25 to the load is greater than the amount of load consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 to turn on one or more of the two transistors M1 and M2, or M3 and M4 that would conventionally be off during the current phase and place those transistors in the saturation region of operation. The result is that these transistors M1 and M2, or M3 and M4 that are additionally turned on draw a moderate current but have a large drain to source voltage hence inducing sufficient power losses to consume the excess incoming power.

In greater detail, as shown in FIG. 6, in phase A, the gate voltages G1 and G2 are high to turn transistors M1 and M2 fully on and maintain those transistors fully on during phase A. However, here, the gate voltages G3 and G4 are also driven, albeit at a lesser voltage magnitude than the gate voltages G1 and G2, to thereby sufficiently turn on transistors M3 and M4 with a drain to source voltage and associated impedance sufficient to dissipate additional power over conventional operation. Similarly, in phase B, the gate voltages G3 and G4 are high to turn transistors M3 and M4 fully on and maintain those transistors fully on during Phase B. However, here, the gate voltages G1 and G2 are also driven, albeit at a lesser voltage magnitude than the gate voltages G3 and G4, to thereby sufficiently turn on transistors M1 and M2 with a drain to source voltage and associated impedance and drain to source current sufficient to dissipate additional power over conventional operation.

Figure 7:
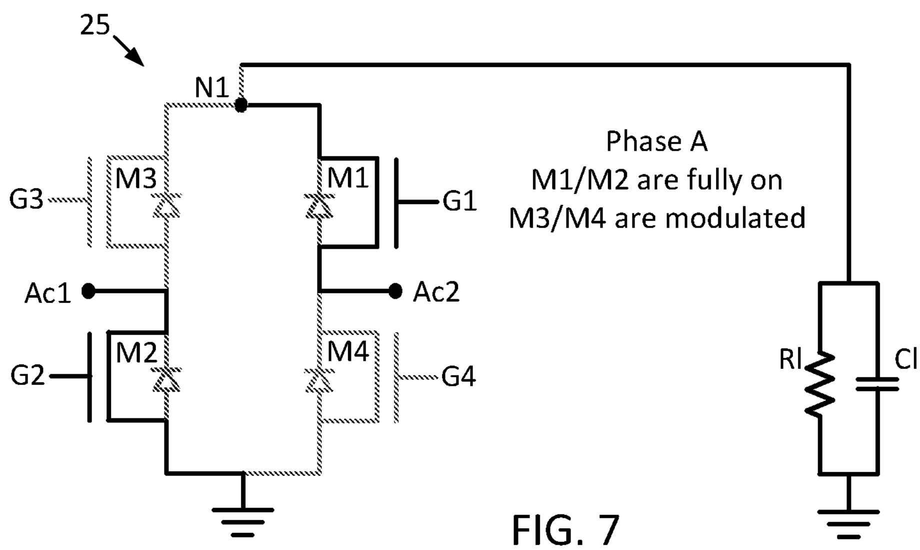
FIG. 7 is a schematic block diagram of the wireless power transmission system of FIG. 2 showing its operation during phase A of the anti-phase parallel voltage regulation of FIG. 6.
Figure 8:
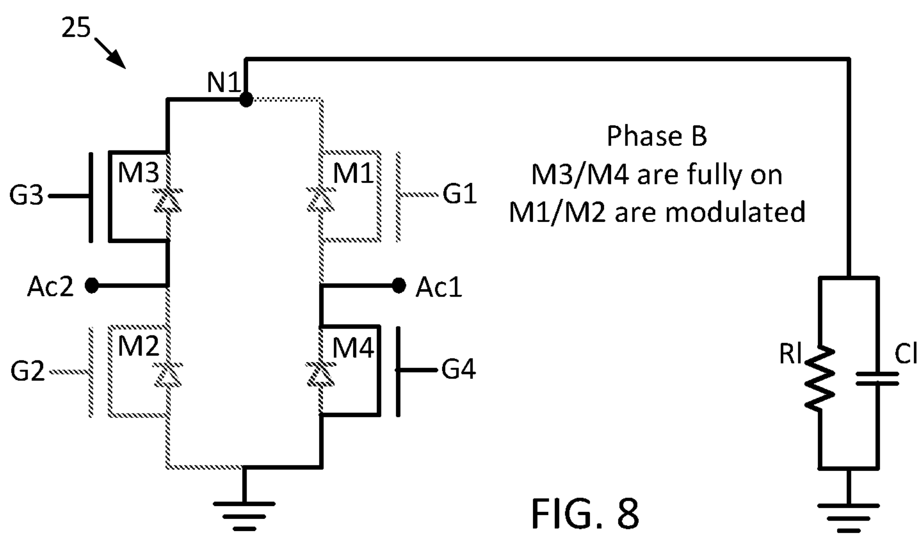
FIG. 8 is a schematic block diagram of the wireless power transmission system of FIG. 2 showing its operation during phase B of the anti-phase serial voltage regulation of FIG. 6.

This operating scheme is referred to as anti-phase parallel regulation because the transistors M1-M4 that are conventionally fully on during a given phase remain fully on while the transistors from among M1-M4 that are conventionally off during the given phase are turned on enough to dissipate the excess power not consumed by the load, and because, as shown in FIGS. 7-8, the power dissipation is achieved by increasing the conductivity of the elements and creating an additional current path in devices which are OFF in conventional operation and which are actually in parallel with the main current path while turned ON when operating using the described method.

Note that during Phase B, the gate voltages G1 and G2 need not both be modulated to turn on their respective transistors M1 and M2 in the linear mode of operation while the gate voltages G3 and G4 remain high to maintain their respective transistors M3 and M4 fully turned on, and instead only one of the gate voltages G1 or G2 can be modulated while the other gate voltage can remain off to keep its respective transistor M1 or M2 fully off.

Similarly, during Phase A the gate voltages G3 and G4 need not both be modulated while the gate voltages G1 and G2 remain high to maintain their respective transistors M1 and M2 fully turned on, and instead only one of the gate voltages G3 or G4 can be modulated while the other gate voltage can remain off to keep its respective transistor M3 or M4 fully off.

Figures 10, 10A:
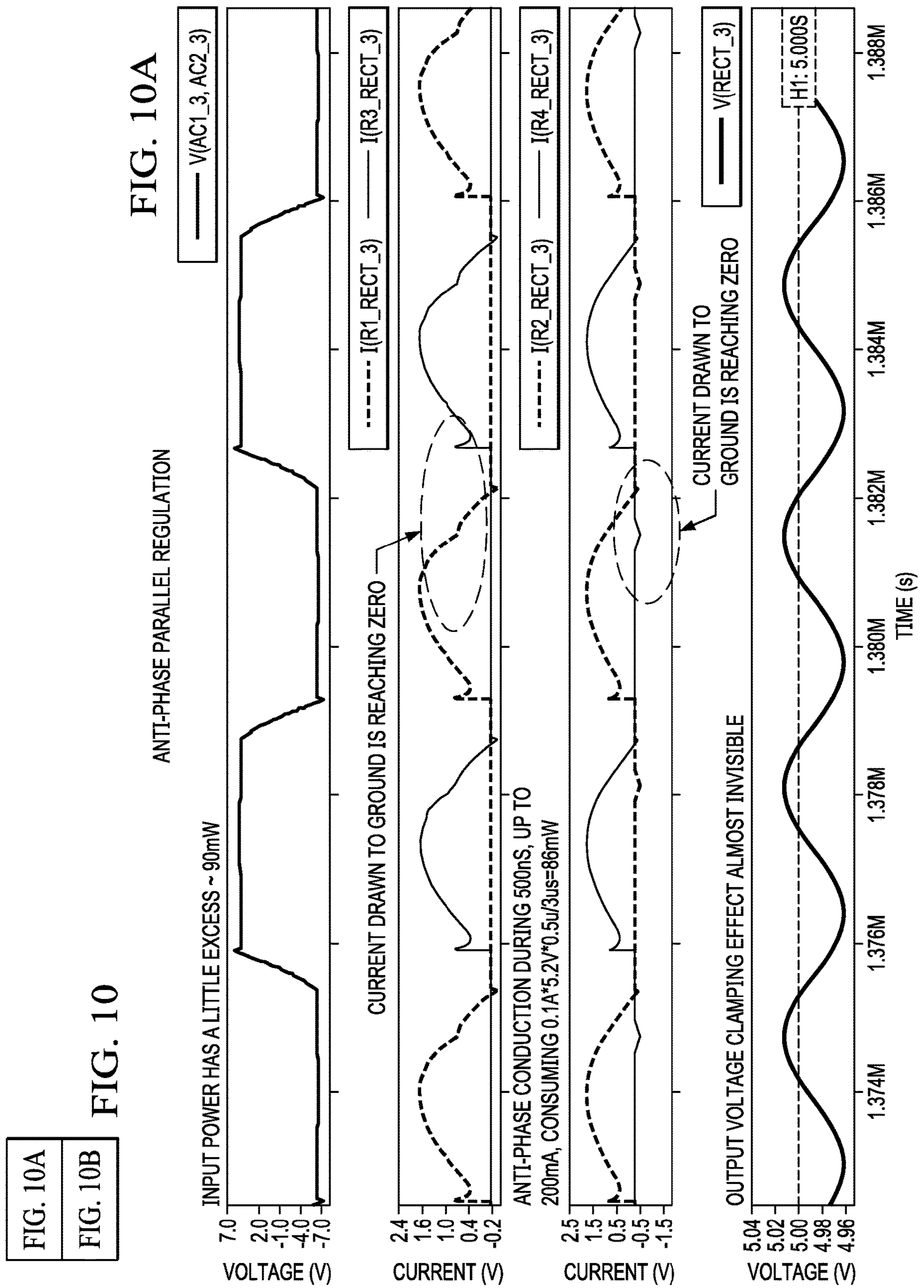
FIG. 10, which includes
FIGS. 10A and 10B, is a timing diagram showing voltages of the wireless power transmission system of FIG. 2 in operation, when the feedback loop is controlling the bridge rectifier to perform low-side anti-phase parallel voltage regulation.
Figure 10B:
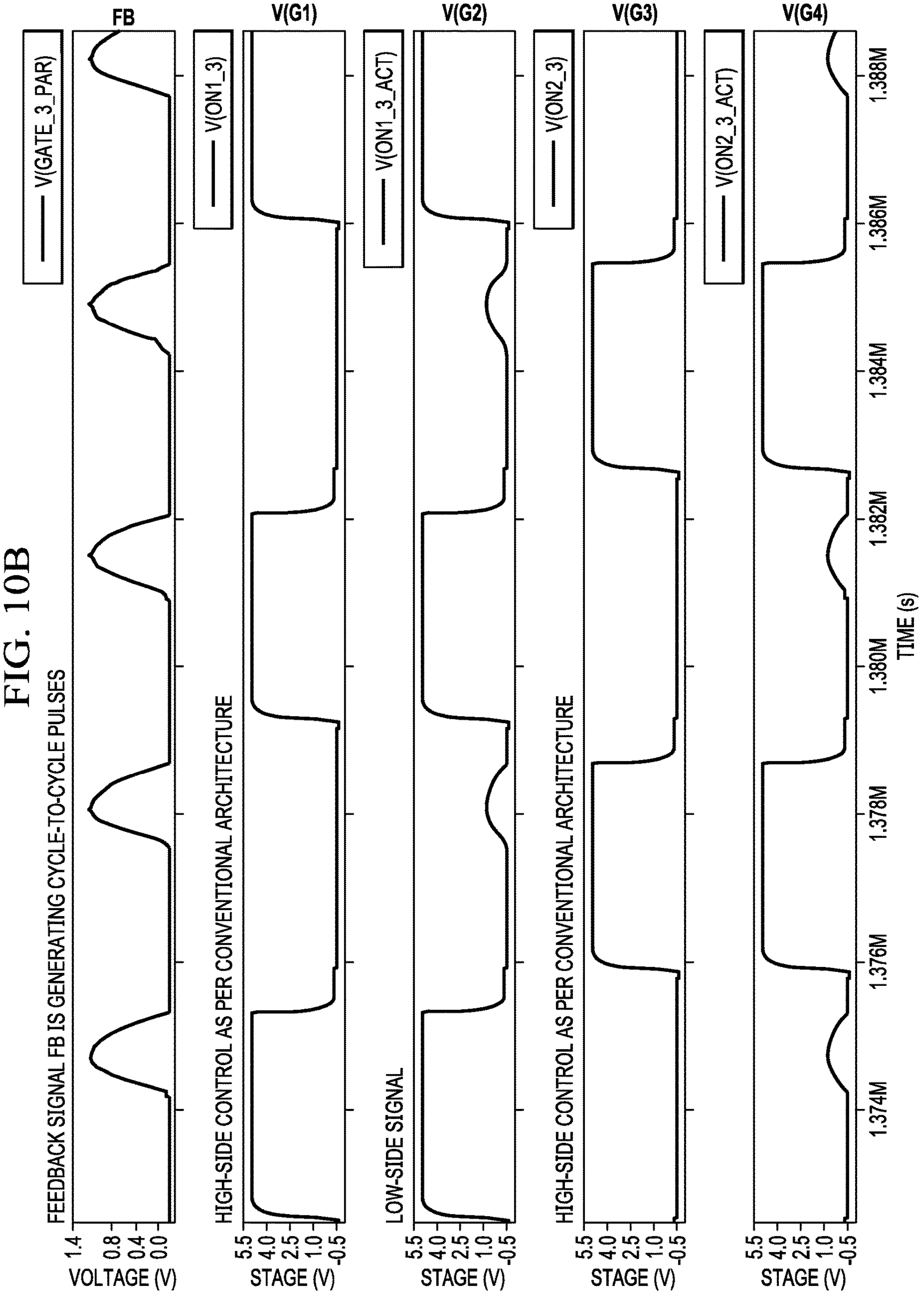

As an example of this form of operation where one transistor M1-M4 is modulated during the phase when it would conventionally be fully off, shown in FIGS. 10, 10A, 10B are additional waveforms of the wireless power transmission system 20 operating using anti-phase parallel regulation. Here, it can be seen that the feedback signal FB is generated during each phase, and that during Phase A, the gate voltages G1 and G2 are fully high to turn on the transistors M1 and M2, while the gate voltage G4 rises to about 1V to turn on the transistor M4 with a drain to source resistance sufficient to dissipate additional power over conventional operation. It can also be seen that during Phase B, the gate voltages G3 and G4 are fully high to turn on the transistors M3 and M4, while the gate voltage G2 rises to about 1V to turn on the transistor M2 with a drain to source resistance sufficient to dissipate additional power over conventional operation.

The anti-phase parallel voltage regulation scheme described above is particularly suited to use where the voltage output Vrect by the regtifier 25 is not relatively low and where the expected excess power to be dissipated is also not relatively low. Therefore, when operated using the anti-phase parallel voltage regulation scheme, the regtifier 25 is able to dissipate substantial excess power while maintaining the transistors of the regtifier 25 within their safe operating limits.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle to basis when performing anti-phase parallel voltage regulation. This feedback technique can be observed in the graph of FIGS. 10, 10A, 10B where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically.

D. Combination of In-Phase Serial and Anti-Phase Parallel Voltage Regulation

Since the in-phase serial voltage regulation described above involves modulating the gate voltage of one or both of the transistors conventionally on during a given phase, and since the anti-phase parallel voltage regulation described above involves modulating the gate voltage of one or both of the transistors conventionally off during that given phase, it should be appreciated that these two techniques may be utilized simultaneously. Therefore, the gate voltage of one or two transistors of the regtifier 25 may be modulated according to the in-phase serial regulation scheme, while the gate voltage of one or two other transistors of the regtifier 25 may be modulated according to the anti-phase parallel regulation scheme, and while non-modulated transistors of the regtifier 25 are operated conventionally.

In addition, in some cases, the in-phase serial voltage regulation scheme and the anti-phase parallel voltage regulation scheme may be used separately. For example, the in-phase serial voltage regulation scheme may be used during one phase and the anti-phase parallel voltage regulation scheme may be used during the following phase.

As another example of the combination of the in-phase serial voltage regulation and the anti-phase parallel voltage regulation, the in-phase serial voltage regulation scheme may be used for a given number of phases (e.g., for one phase A and the successive phase B) and then the anti-phase parallel voltage regulation scheme may be used for a given number of phases (e.g., for the next phase A and the successive phase B).

As another example of the combination of the in-phase serial voltage regulation and the anti-phase parallel voltage regulation, the in-phase serial voltage regulation scheme may be used on one or both of the high side transistors (transistors M1 and M3) while the anti-phase parallel voltage regulation scheme may be used on one or both of the low side transistors (transistors M2 and M4), or vice versa.

As yet another example, which of the in-phase serial voltage regulation and the anti-phase parallel voltage regulation schemes is used may be switched depending upon the extra power to be dissipated. The gate voltages G1-G4 may be generated so as to operate the regtifier 25 using the in-phase serial voltage regulation scheme when the extra power to be dissipated is below a certain threshold, and the gate voltages G1-G4 may then switch to being generated so as to operate the regtifier 25 using the anti-phase serial voltage regulation scheme, when the extra power to be dissipated is above the threshold.

E. Control Signal Generation and Feedback Loop

Figure 19:
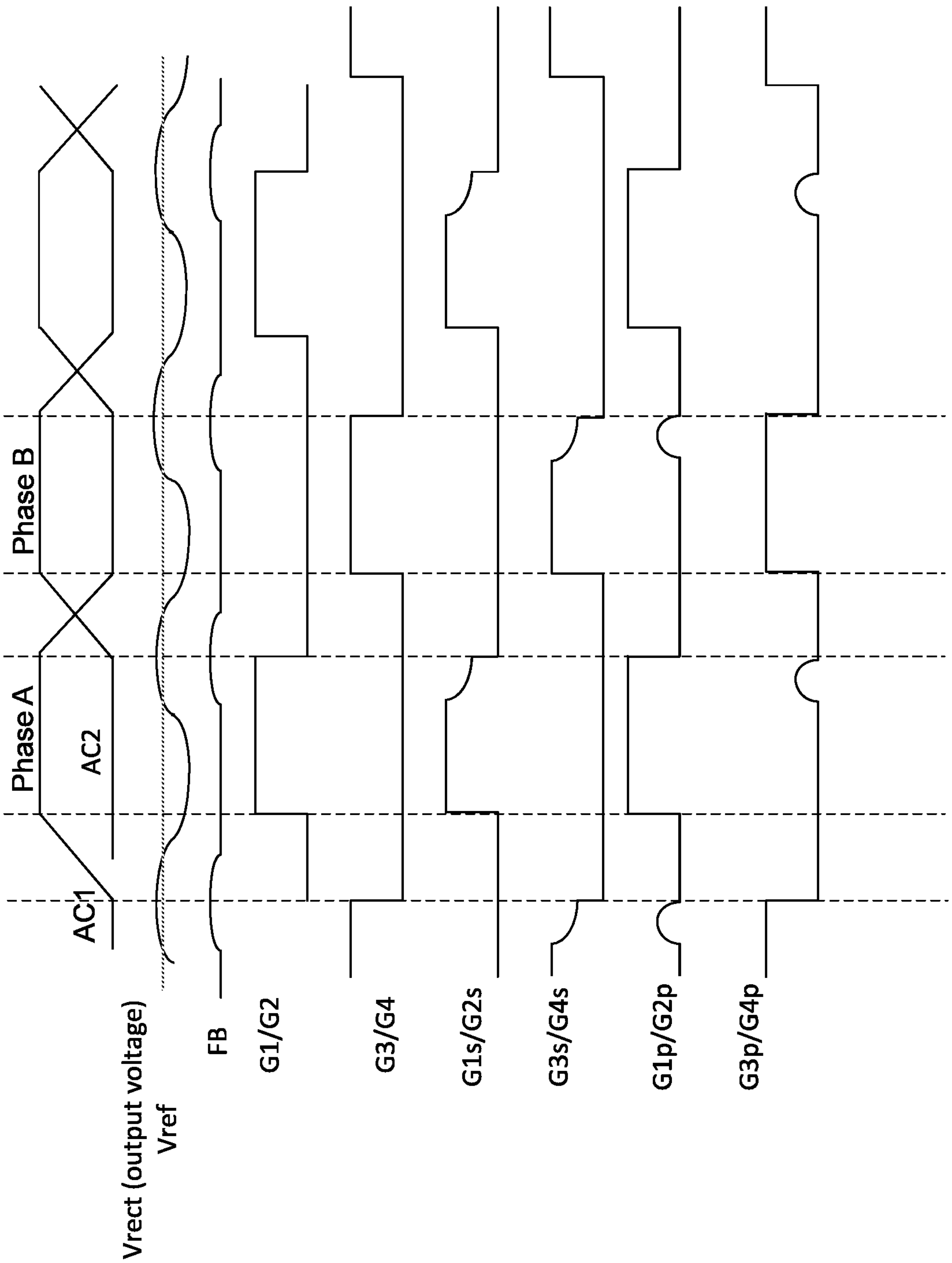
FIG. 19 is a timing diagram showing voltages of the wireless power transmission system of FIG. 2 in operation, when the feedback loop is controlling the bridge rectifier to perform in-phase serial voltage regulation as well as anti-phase parallel voltage regulation.

Now described with reference to FIGS. 17 and 19 is the control circuitry 24. First, the generation of the control signals GA and GB will be described, and thereafter, the generation of the gate voltages for the transistors M1-M4 from the gate voltages GA and GB will be described.

The control circuitry 24 includes a hysteretic comparator 51 having a non-inverting terminal coupled to node Ac1, an inverting terminal coupled to ground, and an output which produces GA.

The control circuitry 24 includes a hysteretic comparator 54 having a non-inverting terminal coupled to node Ac2, an inverting terminal coupled to ground, and an output which produces GB.

Figure 17A:
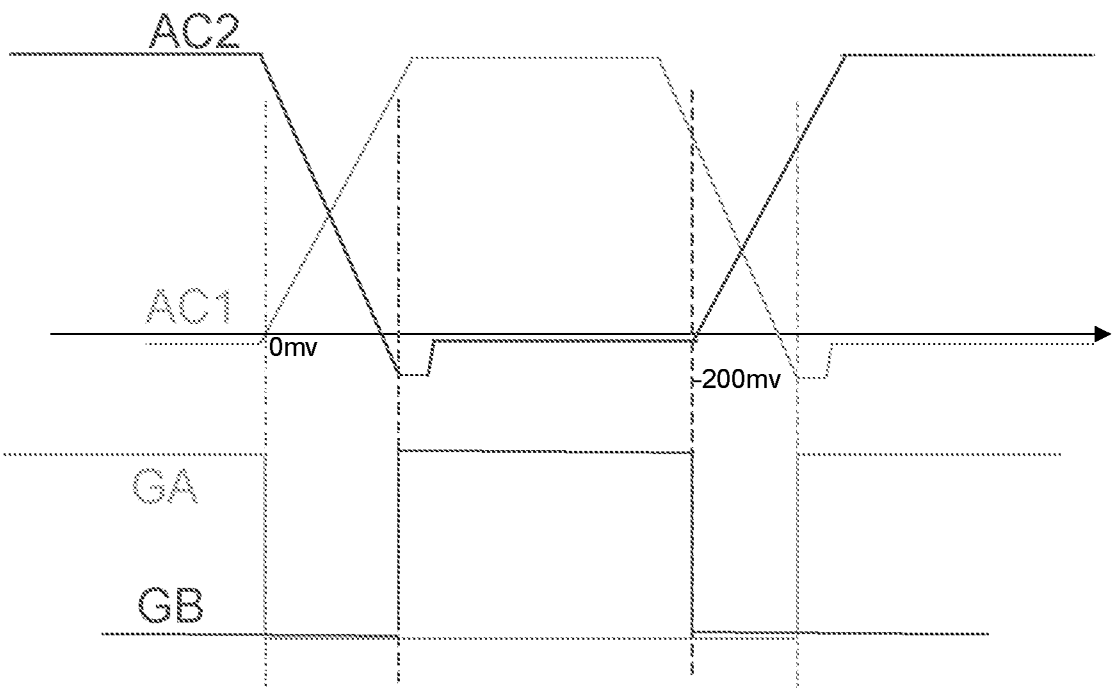
FIG. 17*a* is a timing diagram of the AC1 and AC2 signals and associated produced GA and GB signals within the controller of FIG. 2.
Figure 17B:
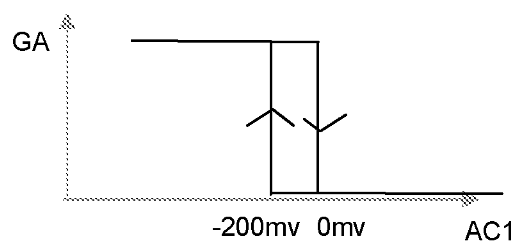
FIG. 17*b* is an output/input transfer function of a hysteretic comparator used within the controller of FIG. 2 for producing the GA and GB signals.
Figure 17C:
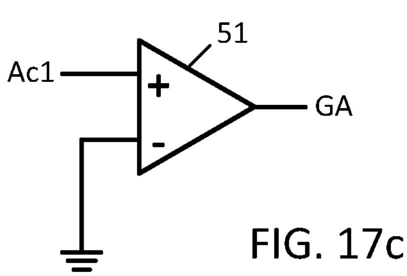
FIG. 17*c* is a schematic of a hysteretic comparator used for producing the GA signal.
Figure 17D:
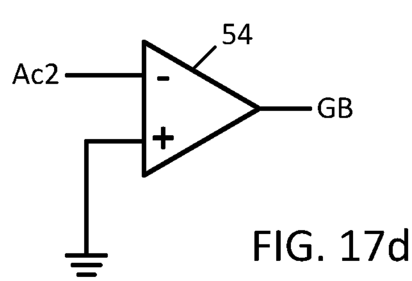
FIG. 17*d* is a schematic of a hysteretic comparator used for producing the GB signal.

Referring to FIG. 17*a*, the operation of the control circuitry 24 when generating the control voltages GA and GB is therefore that when the AC signal at node Ac1 rises to become greater than the first threshold (0 mV in this example) of the hysteretic comparator 51 (referring to FIG. 17*c*), the output GA of the comparator 51 is pulled low. Similarly, when the AC signal at node Ac2 falls (which occurs when the AC signal at node Act rises) and is less than the second threshold (−200 mV in this example) of the hysteretic comparator 54 (referring to FIG. 17*d*), the output GB of the comparator 54 is pulled high.

Conversely, when the AC signal at node Ac1 falls and as a result is less than the second threshold of the hysteretic comparator 51, the output GA of the comparator 51 is pulled high. Similarly, when the AC signal at node Ac2 rises to become greater than first threshold of the hysteretic comparator 54, the output of the comparator 54 is pulled low.

Figure 18A:
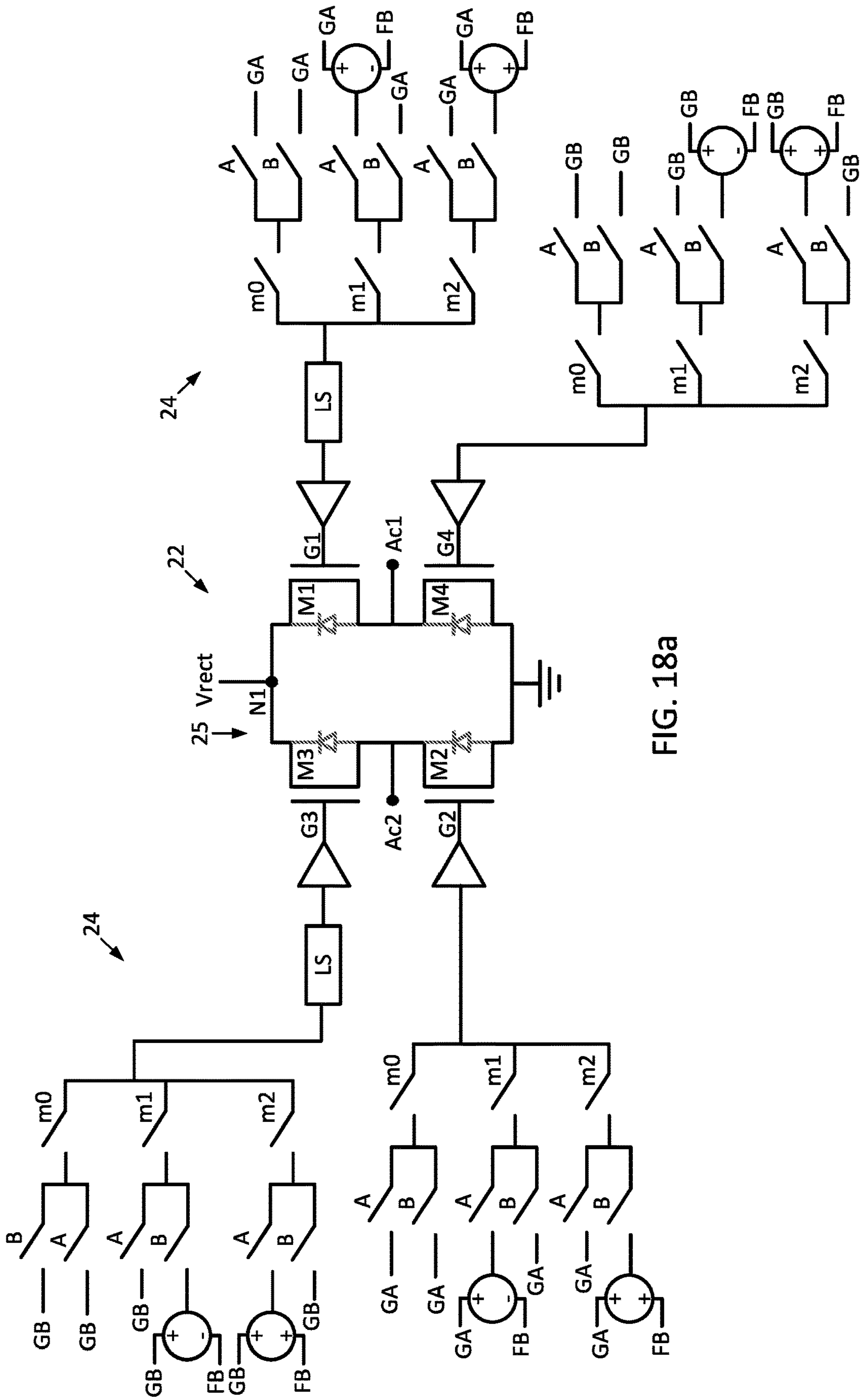
FIG. 18*a* is a schematic diagram illustrating mode selection circuitry within the controller of FIG. 2 for switching the regtifier of FIG. 2 between in-phase serial voltage regulation and anti-phase parallel voltage regulation.

Now referring to FIGS. 18*a*-19, the remainder of the control circuitry 24 is described for the cases where PWM control of the transistor gates are not used.

It is to be noted that as a general practice for low-side drive techniques, the signals for driving the gates of M2 and M4 are buffered. Also, it is to be noted that as a general practice for high-side drive techniques, the signals for driving the gates M1 and M3 are level shifted and buffered. For sake of simplification the following description will assume that GA, GB and any composite signal derived from GA, GB, FB are directly coupled to the gates, while in actual implementation buffer and level shifting technique are to be used consistently with the above mentioned techniques for low-side and high-side driving techniques.

When switches m0 are closed, indicating that the regtifier 25 is to operate as a standard rectifier, the control signal GA is coupled to the gates of transistors M1 and M2 as gate voltages G1 and G2 regardless of phase, and the control signal GB is coupled to the gates of transistors M3 and M4 as gate voltages G3 and G4 regardless of phase. Therefore, during phase A, the transistors M1 and M2 are fully turned on while the transistors M3 and M4 are fully turned off, and during phase B, the transistors M3 and M4 are fully turned on while the transistors M1 and M2 are fully turned off.

When switches m1 are closed, indicating that the regtifier 25 is to operate so as to perform in-phase serial voltage regulation, in phase A: the feedback voltage FB is subtracted from the control signal GA, and the result is coupled to the gate of the transistor M1 as gate voltage G1; the feedback voltage FB is subtracted from the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. In phase B: the feedback voltage FB is subtracted from the control signal GB, and the result is then coupled to the gate of the transistor M3 as gate voltage G3; the feedback voltage FB is subtracted from the control signal GB, and the result is then coupled to the gate of the transistor M4 as the gate voltage G4; the control signal GA is coupled to the gate of the transistor M1 as gate voltage G1; and the control signal GA is coupled to the gate of the transistor M2 as gate voltage G2. Therefore, during phase A, the transistors M3 and M4 are fully off, while the gate voltages of the transistors M1 and M2 are reduced by the feedback voltage FB to thereby increase the drain to source resistances of the transistors M1 and M2 sufficiently to dissipate excess power. Similarly, during phase B, the transistors M1 and M2 are fully off, while the gate voltages of the transistors M3 and M4 are reduced by the feedback voltage FB to thereby increase the drain to source resistances of the transistors M3 and M4 sufficiently to dissipate excess power.

When the switches m2 are closed, indicating that the regtifier 25 is to operate so as to perform anti-phase parallel voltage regulation, in phase A: the voltage FB is added to the control signal GB, and the result is then coupled to the gate of the transistor M3 as gate voltage G3; the voltage FB is added to the control signal GB, and the result is then coupled to the gate of the transistor M4 as gate voltage G4; the control signal GA is coupled to the gate of the transistor M1 as gate voltage G1; and the control signal GA is coupled to the gate of the transistor T2 as gate voltage G2. In phase B: the voltage FB is added to the control signal GA, and the result is coupled to the gate of the transistor M1 as gate voltage G1; the voltage FB is added to the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. Therefore, during phase A, the transistors M1 and M2 are fully on, while the gates of the transistors M3 and M4 are driven sufficiently cause dissipation of excess power by transistors M3 and M4 but not sufficiently to impede rectification. Similarly, during phase B, the transistors M3 and M4 are fully on, while the gates of the transistors M1 and M2 are driven sufficiently cause dissipation of excess power by transistors M1 and M2 but not sufficiently to impede rectification.

Figure 18B:
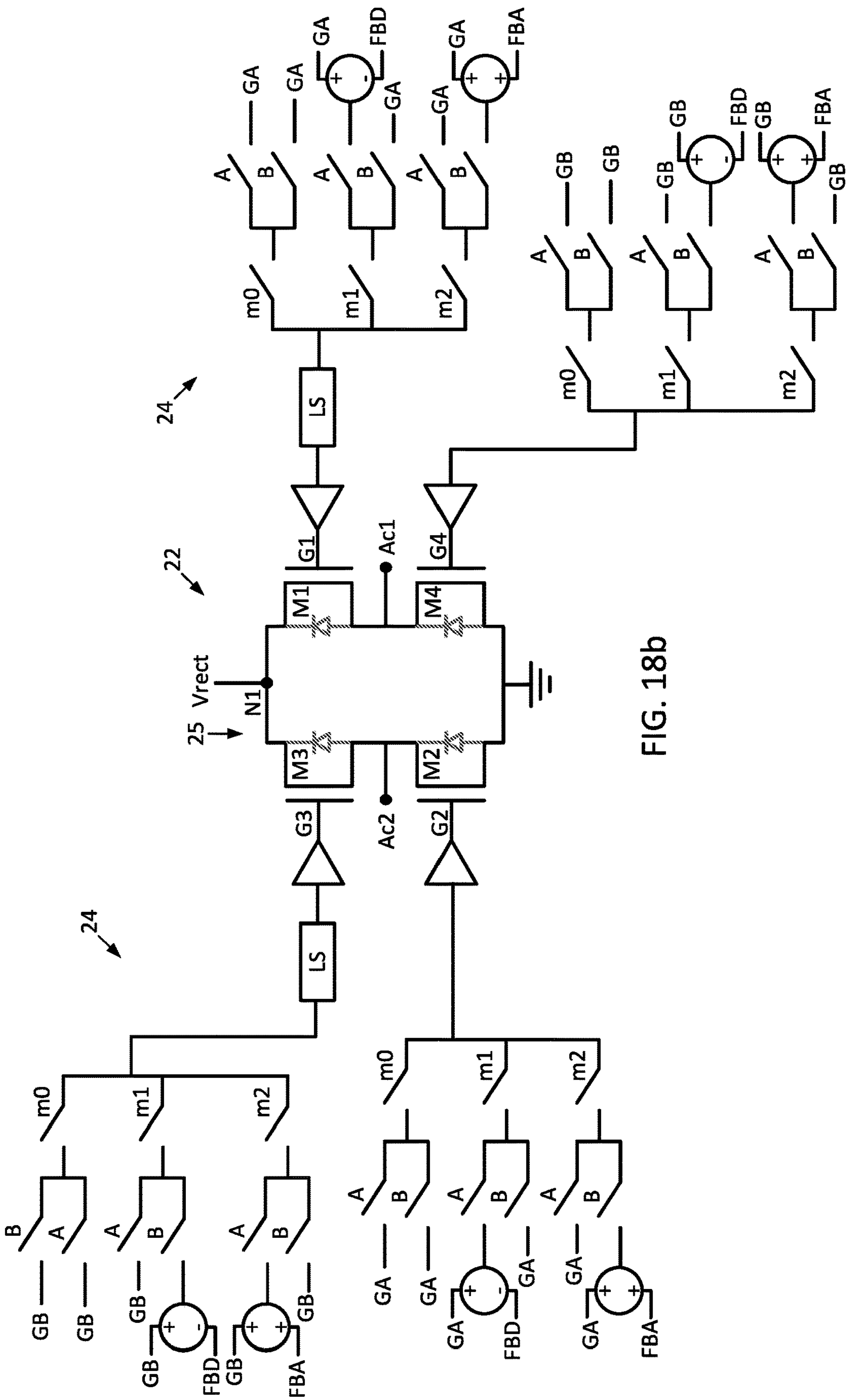
FIG. 18*b* is a schematic diagram illustrating mode selection circuitry within the controller of FIG. 2 for switching the regtifier of FIG. 2 between in-phase serial voltage regulation and anti-phase parallel voltage regulation and supporting PWM based in-phase serial voltage regulation.
Figure 18C:
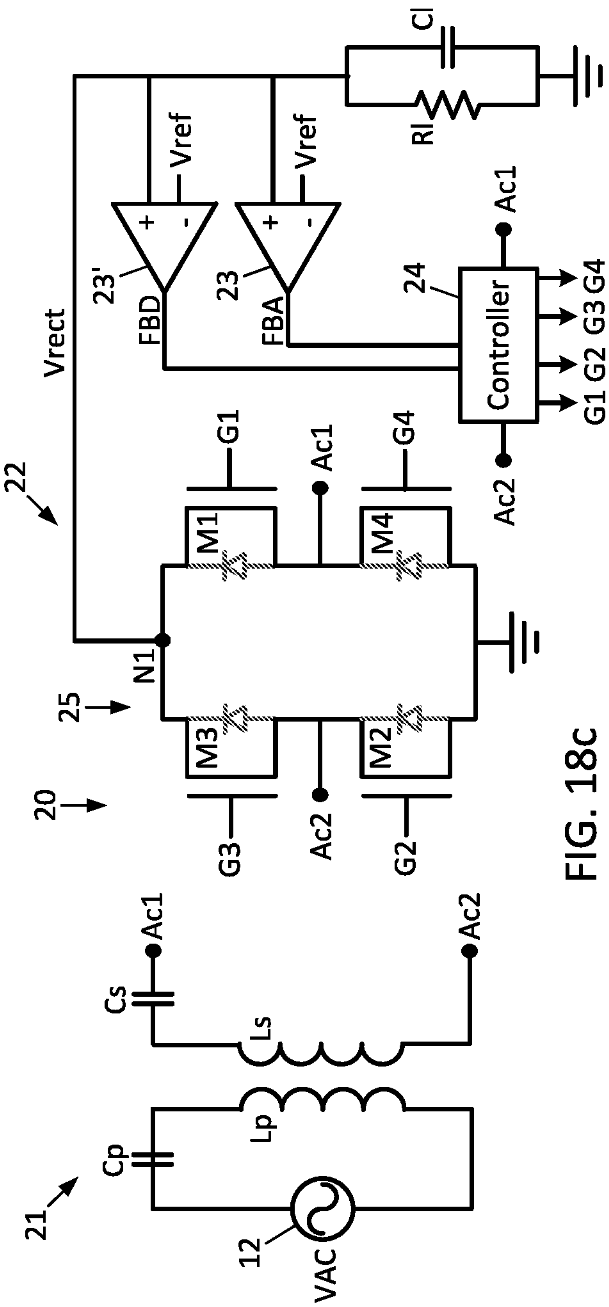
FIG. 18*c* is a schematic diagram illustrating the presence of an amplifier and a comparator as feedback loops.

Now referring to FIG. 18*b* and FIG. 18*c*, the remainder of the control circuitry 24 is described for the cases where PWM control of the transistor gates are used as per first and second ways of operating the gates in FIG. 14. The feedback signal FB as per FIG. 18*a* has been split in two, with FBA being the output of the feedback amplifier 23 named FB on FIG. 24 and FBD being the output of the digitized feedback provided by a comparator 23' and generating signal accordingly to timing diagrams as per FIG. 12. During operation FBD may take two levels, noted FBD_H and FBD_L. Assume now that the drive strength of GA, GB is VDD, the signal GA−FBD (resp. GB−FBD) will provide two levels VDD-VGH and VDD-VGL. Therefore, in the case where VGH=VDD and VGL=0 are used, the signal GA−FBD (resp. GB−FBD) will provide two levels of drive strength, 0 and VDD, so as to drive according to the first way of operating the gates on FIG. 14.

Now, in the case where VGH=VDD−V1 and VGH=0 are used, the signal GA−FBD (resp. GB−FBD) will provide two levels of drive strength, V1 and VDD so as to drive according to the third way of operating the gates on FIG. 14.

It is to be noted that when the regtifier 25' is in serial mode controlled by m1, or in parallel mode controlled by m2, and if the FB signals (resp. FBA and FBD) are gated to zero, the regtifier 25' behaves exactly similarly to the regtifier 25' in conventional mode controlled by m0, because GA+FBD, GB+FBD, GA−FBA, GB−FBA are equal to GA, GB when FBA and FBD are gated to zero, which may occur for example when Vrect is far below the target.

Those skilled in the art will appreciate from FIG. 15 how to generalize FIG. 18*b* for supporting the third way of operating the gates.

Hardware and techniques for automatically switching the regtifier 25' between in-phase serial voltage regulation using PWM and anti-phase parallel voltage regulation is now described.

Figure 20:
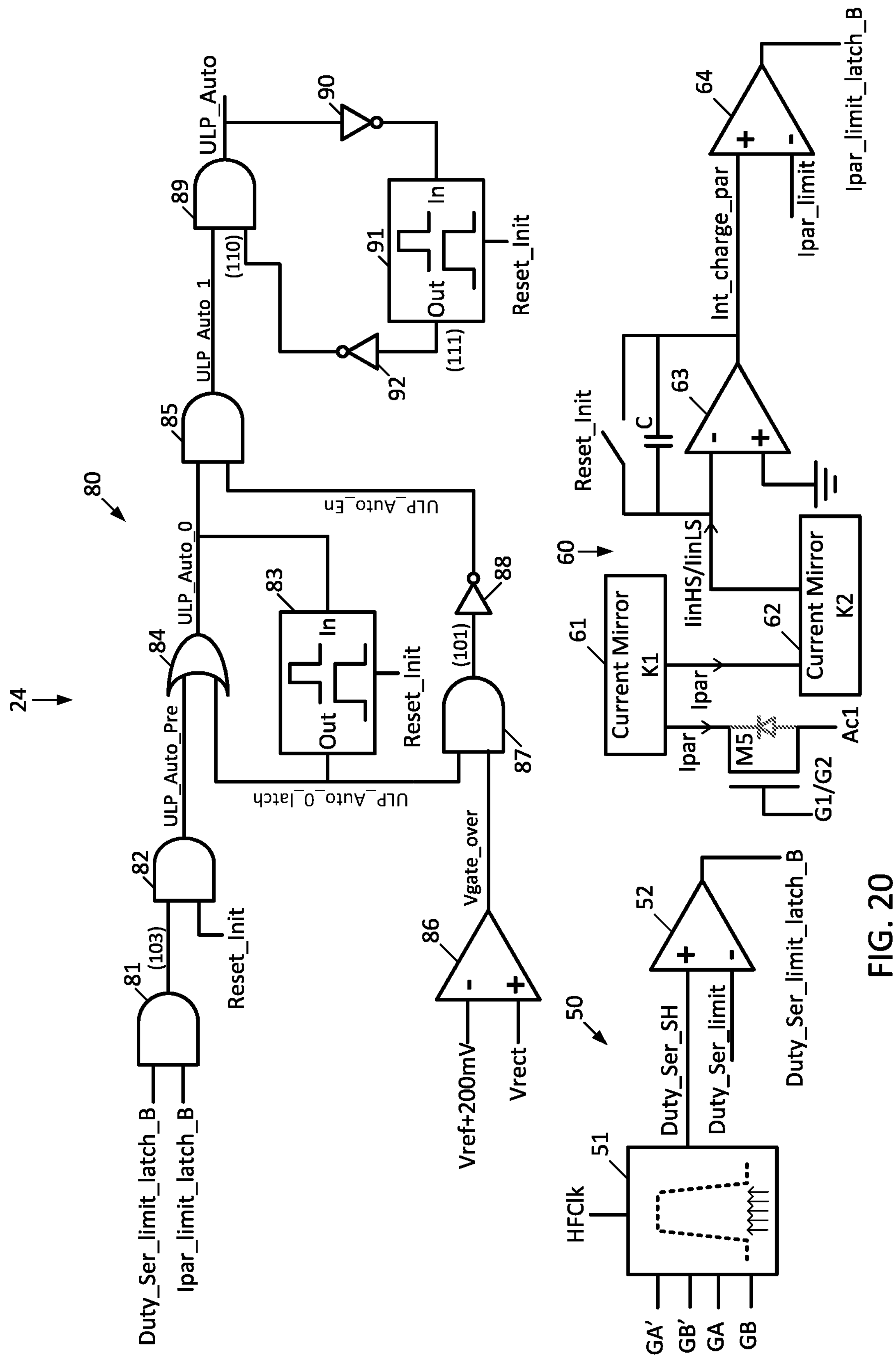
FIG. 20 is a block diagram showing components of the controller for performing on the fly mode switching between in-phase serial voltage regulation and anti-phase parallel voltage regulation.

Refer now to FIG. 20, illustrating the hardware included within the controller 24 for automatically switching the regtifier 25' between in-phase serial voltage regulation using PWM and anti-phase parallel voltage regulation. Serial monitoring circuit 50 includes a duty cycle determination circuit that utilizes counters to determine the duty cycle of control signals GA and GB (from which the gate voltages G1-G4 are determined) during performance of PWM in-phase serial voltage regulation, and therefore the duty cycle of the output of the regtifier 25', by counting a number of pulses of a high frequency counter clock HFClk within each pulse of the control signals GA and GB, by counting a number of pulses of the high frequency counter clock within each pulse of the control signals GA' and GB' (from which the gate voltages G1*a*-G4*a* are determined), and dividing the number of pulses of the high frequency clock HFClk within each pulse of control signals GA and GB by the number of pulses of the high frequency clock within each pulse of control signals GA' and GB'. The duty cycle will be referred to hereinafter as Duty_Ser_SH; for example, if the duty cycle of the regtifier 25' is found to be 90%, then Duty_Ser_SH will be 90%. The serial monitoring circuit 50 also includes a digital comparator 52 that compares each occurrence of Duty_Ser_SH to an established duty cycle limit, Duty_Ser_limit, and latches then asserts the Duty_Ser_limit_latch_B signal when the current occurrence of Duty_Ser_SH is greater than Duty_Ser_limit. When the current occurrence of Duty_Ser_SH is less than the duty cycle limit Duty_Ser_limit, the digital comparator 52 deasserts the Duty_Ser_limit_latch_B signal. It is to be noted that Duty_Ser_limit_latch_B signal is always asserted high during anti-phase parallel mode.

The controller 24 also includes a parallel monitoring circuit 60 including an n-channel transistor M5 that is a replica of one of the transistors in the regtifier 25' (illustratively a replica of either G1 or G2) that receives the corresponding gate voltage G1 or G2 at its gate, has its source coupled to the node Act, and has its drain coupled to a first current mirror 61. The first current mirror 61 mirrors the current Ipar flowing through the replica transistor M5 during anti-phase parallel voltage regulation to a second current mirror 62, which in turn mirrors the current to the inverting terminal of amplifier 63 configured as an integrator as either IinHS (in the case where the transistor M5 is a replica of transistor M1 or M3) or IinLS (in the case where the transistor M5 is a replica of transistor M2 or M4). It is to be noted that the current mirror 61 can be advantageously supplied from the Vrect node, and that the power consumption by the current mirror is not critical as in any case it is contributing as part of the overall objective of consuming an excess of incoming power. As such it will be appreciated that the ratio K1 does not need to be very high and good matching performances of the mirror is doable. The inverting terminal of the integrator 63 is coupled to ground, and a capacitor C and reset switch are coupled in parallel between the inverting terminal and output of the integrator 63. The integrator 63 output is the Int_charge_par signal, which is compared to the limit current Ipar_limit by a latchable comparator 64, and the result latched by the comparator 64 and thereafter inverted by the inverter 65 to produce the Ipar_limit_latch_B signal. It is to be noted that the Ipar_limit_latch_B signal is by design always asserted high during in-phase serial mode as there is no current flowing in the anti-phase parallel regulation HW.

Mode switch control circuitry 80 includes an AND gate 81 that receives the Duty_Ser_limit_latch_B and Ipar_limit_latch_B signals, performs a logical AND operation, and produces the signal 103 as output. Given that Duty_Ser_limit_latch_B signal is always asserted high during anti-phase parallel mode and signal Ipar_limit_latch_B is by design also always asserted high during in-phase serial mode, the AND gate 81 does always have one of its two inputs which is at a logical one. The AND gate 81 is therefore the entry point of the automatic switching between the two modes.

An AND gate 82 receives the signal 104 and an initialization signal Reset_Init as input, performs a logical AND operation, and produces the ULP_Auto_Pre signal as output. An OR gate 84 receives the ULP_Auto_Pre signal from the AND gate 82 as input, and receives the ULP_Auto_0_latch signal from a non-retriggerable monostable 83 as input, performs a logical OR operation, and produces the ULP_Auto_0_signal as output. The monostable 83 receives the ULP_Auto_0_signal as input and produces the ULP_Auto_0_latch signal as output.

A comparator 86 receives the output voltage Vrect at its non-inverting terminal and the reference voltage Vref+200 mv at its inverting terminal, and produces the Vgate_over signal as output. An AND gate 87 receives the Vgate_over signal and the ULP_Auto_0_signal as input, performs a logical AND operation, and generates the signal 101 as output, which is in turn inverted by the inverter 88 to produce the ULP_Auto_En signal as output. An AND gate 85 receives the ULP_Auto_0 and ULP_Auto_En signals as input, performs a logical AND operation, and generates the ULP_Auto_1 signal as output. An AND gate 89 receives the ULP_Auto_1 signal from the AND gate 85 as input, as well as the signal 110, which is the output of an inverter gate 92 which receives its input from the output 111 of a non-retriggerable monostable 91. The AND gate 89 performs a logical AND operation to produce the ULP_Auto signal as output, which is inverted by the inverter 90 and passed to the input of the monostable 91.

The non-retriggerable monostables 83 and 91 receive the initialization signal Reset_Init, which is asserted when it is desired to reset the monostables 83 and 91 to be triggerable again one time.

As will be explained, when the ULP_Auto signal is a logical one, the controller 24 generates the gate voltages G1-G4 and G1*a*-G4*a* of the transistors M1-M4 and M1*a*-M4*a* to cause the regtifier 25' to perform in-phase serial voltage regulation, and when the ULP_Auto signal is a logical zero, the controller 24 generates the gate voltages G1-G4 and G1*a*-G4*a* of the transistors M1-M4 and M1*a*-M4*a* to cause the regtifier 25' to perform anti-phase parallel voltage regulation.

Figure 21:
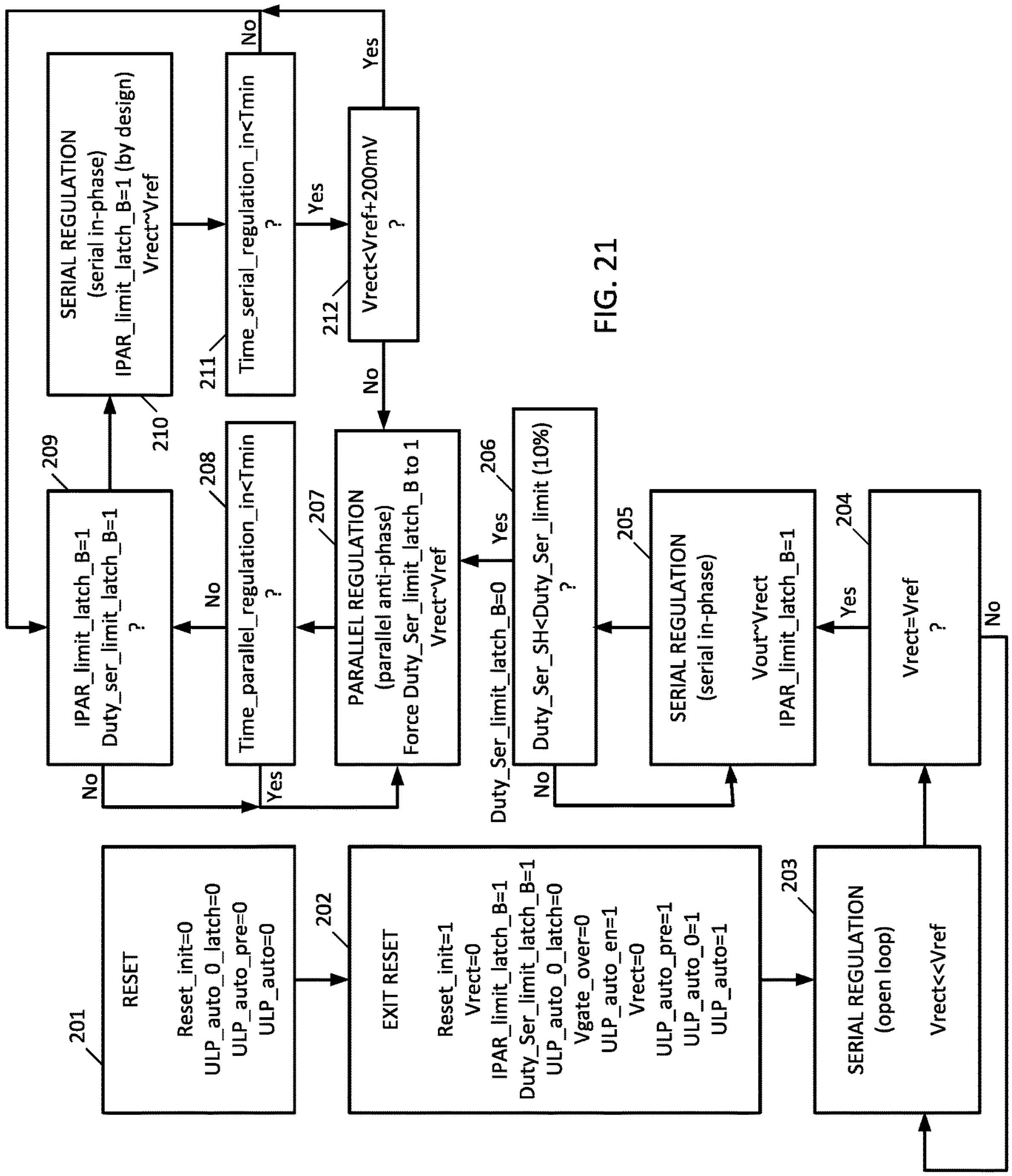
FIG. 21 is a flowchart of a method of operating the mode switching circuitry of FIG. 20 to switch the regtifier between performing in-phase serial voltage regulation and anti-phase parallel voltage regulation.
Figures 22, 22A:
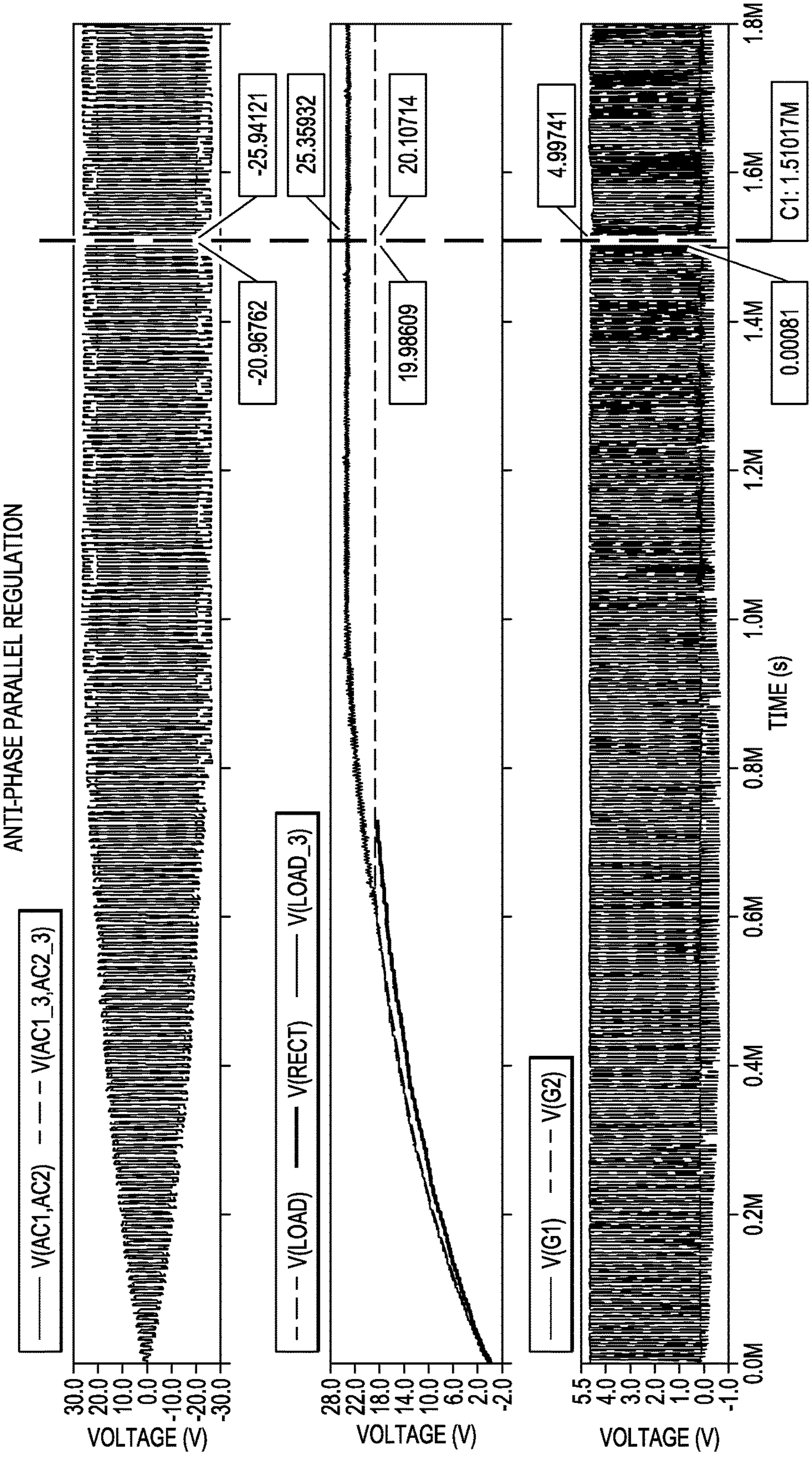
FIG. 22, which includes
FIGS. 22A and 22B, is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 22B:
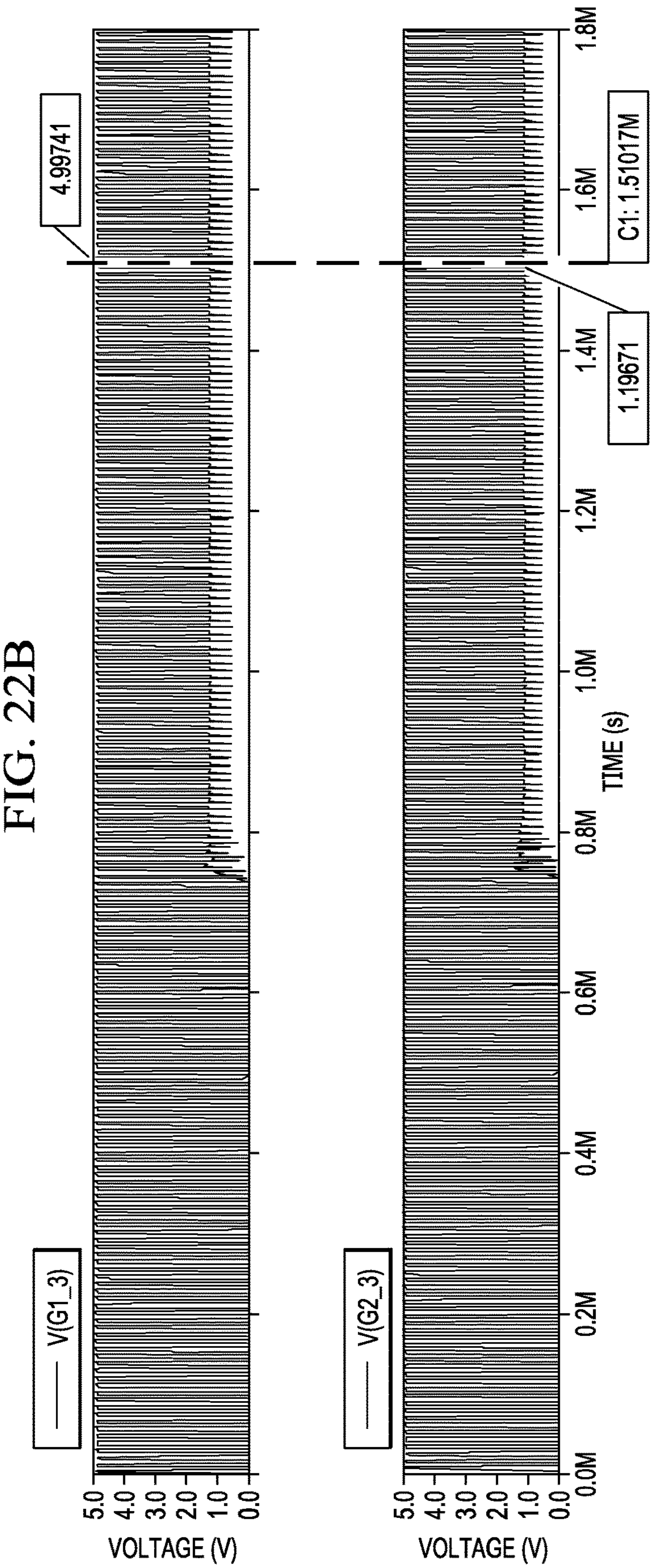
Figure 23:
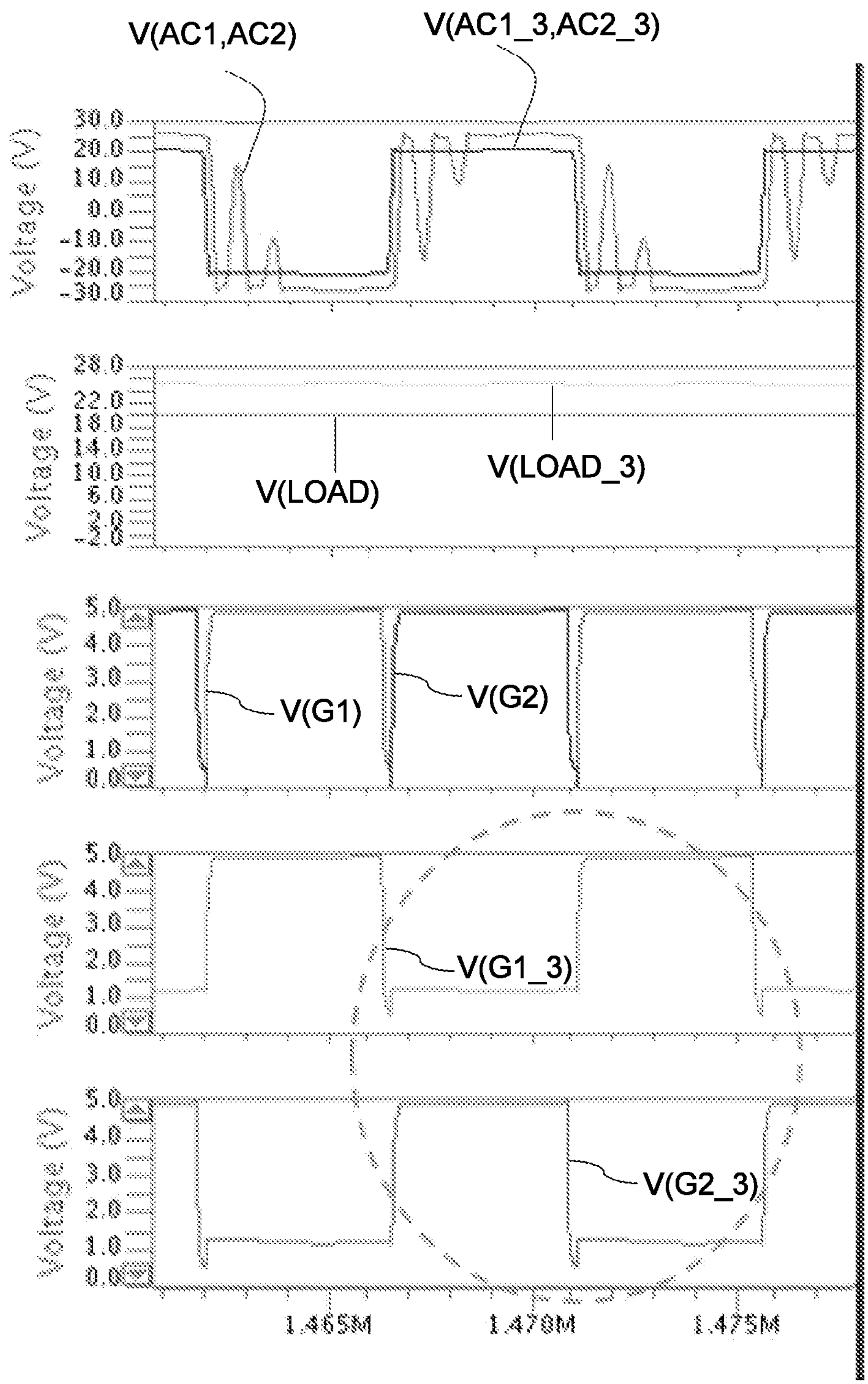
FIG. 23 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figures 24, 24A:
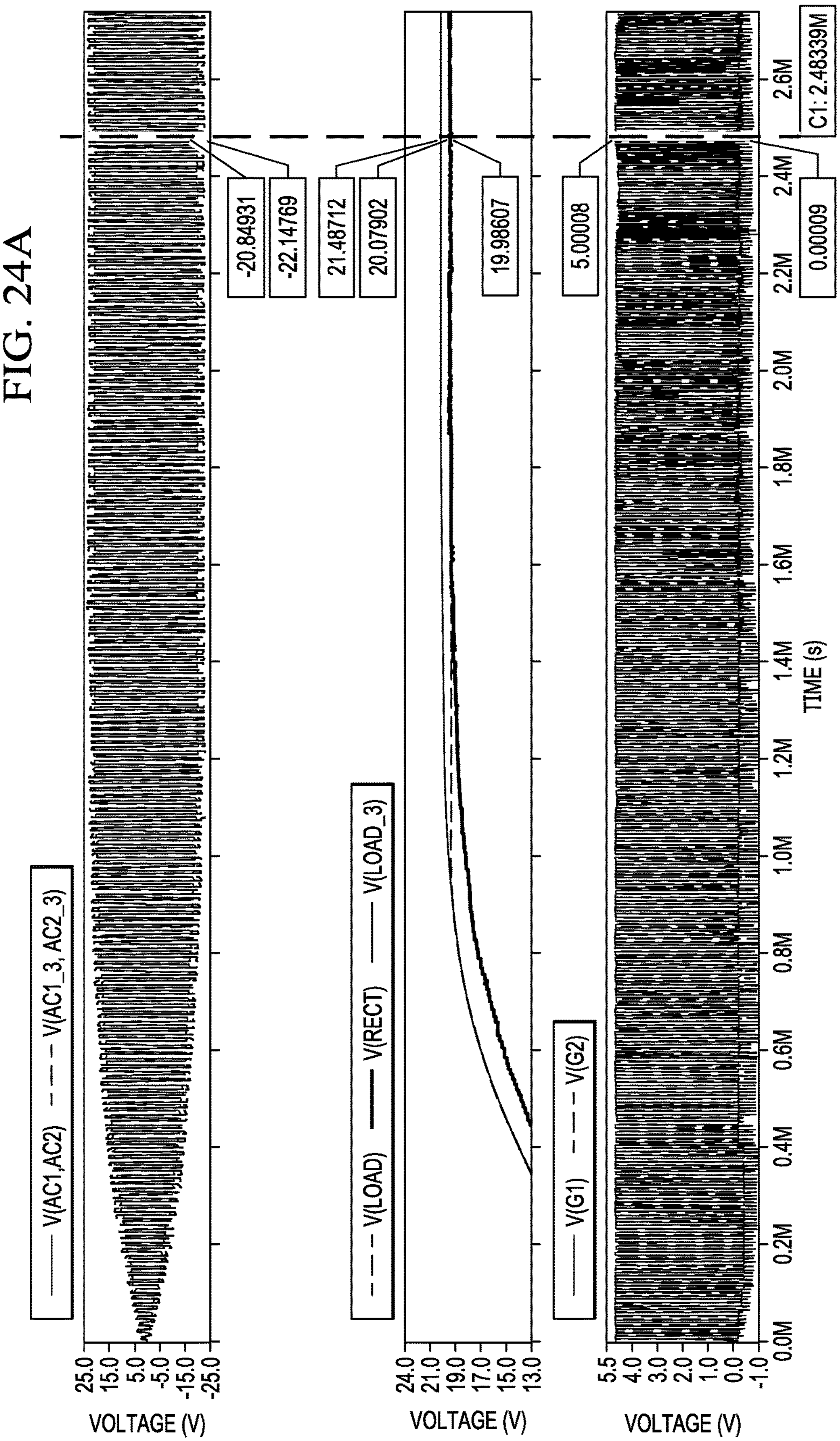
FIG. 24, which includes
FIGS. 24A and 24B, is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.
Figure 24B:
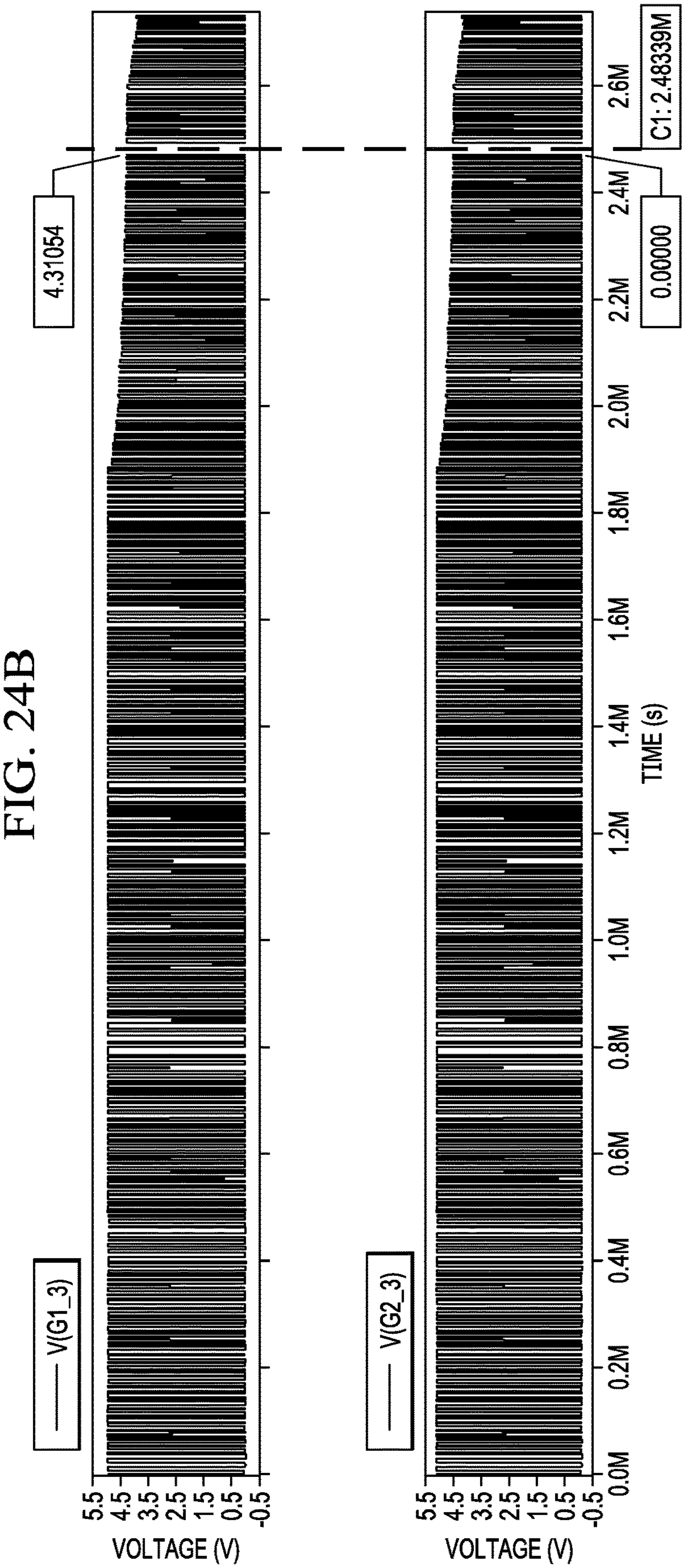
Figure 25:
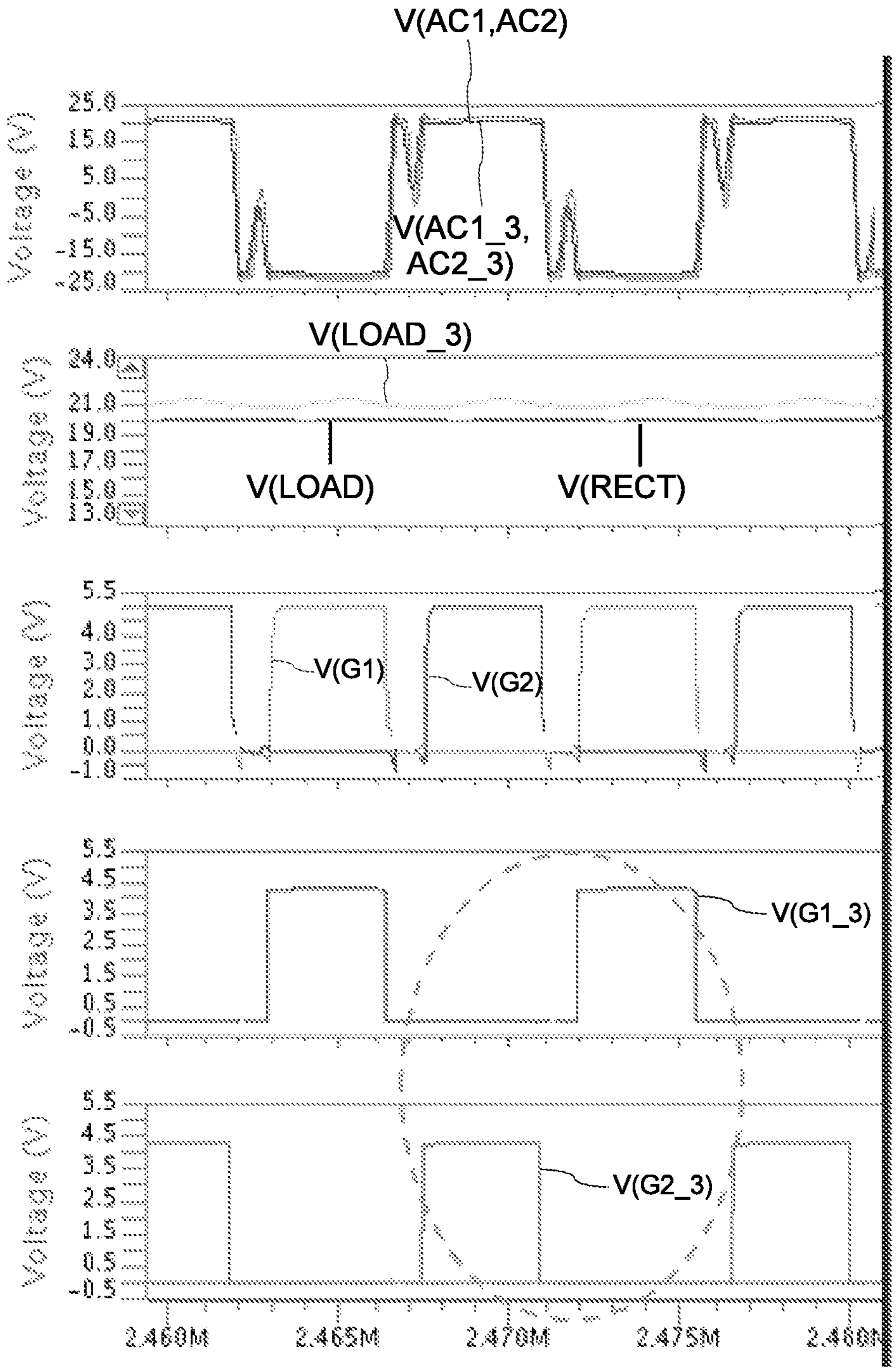
FIG. 25 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.

The operation of the mode switch control circuitry 80 will now be described with additional reference to FIG. 21.

At power-up and/or reset, the Reset_Init signal is set to a logical zero, resetting the monostables 83 and 91, as well as the integrator 63 (Block 201) by closing its switch. As a result, the AND gate 82 outputs the ULP_Auto_Pre signal as a logical zero and the monostable 83 outputs ULP_Auto_0_latch as a logical zero, resulting in the OR gate 84 outputting the ULP_Auto_0 signal as a logical zero. Since the ULP_Auto_0 signal is a logical zero, the AND gate 85 will output the ULP_Auto_1 signal as a logical zero, and in turn the AND gate 89 will output the ULP_Auto signal as a logical zero. It is to be noted that input 110 has no effect at this point, as ULP_Auto_1 is a logical 0. Input 110 would however hold ULP_Auto to logical 0 for a while, should ULP_Auto_1 have just transitioned from logical one to logical zero.

Next, to exit the reset, the Reset_Init signal is set to a logical one (Block 202). At this point in time, power transfer has not begun, and therefore the control signals GA, GB, GA', and GB' are zero. The result of the control signals GA, GB, GA', and GB' being zero is that the gate voltages G1-G4 and G1*a*-G4*a* are generated as being zero.

The result of G1-G4, G1*a*-G4*b* being zero is that the regtifier 25' is operating as a conventional 4 diodes rectifier in asynchronous mode, and the Vrect is free to rise under the effect of the incoming power, which in turn supplies the controller 24', which in turn generates the signals G1-G4, G1*a*-G4*b*.

At this point, and because the Vrect voltage is still low and below the target, the regtifier 25' is operating as conventional rectifier as highlighted previously, and as a first result the Duty_Ser_SH signal is high and the comparator 52 outputs Duty_Ser_limit_latch_B signal as a logical one.

As a second effect of the regtifier 25' operating as per conventional rectifier, the currents Ipar and IinHS/IinLS are zero, as no anti-phase conduction is occurring, with the result being that the amplifier 63 outputs the Int_charge_par signal as being zero. As a result of the Int_charge_par signal being zero, Ipar_limit is greater than Int_charge_par, and the comparator 64 will latch and output a logical zero, which is inverted by the inverter 65 to produce the Ipar_limit_latch_B signal at a logical one.

Since Duty_Ser_limit_latch_B and Ipar_limit_latch_B are both at a logical one, the signal 103 output by the AND gate 81 is a logical one, and since the Reset_Init signal is at a logical one, the ULP_Auto_Pre signal output by the AND gate 82 is a logical one. As a result of the ULP_Auto_Pre signal being a logical one, the ULP_auto_0 signal output by the OR gate 84 as a logical one, which in turn causes the ULP_Auto_0_latch signal to rise to a logical one, which in turn triggers the monostable 83, which in turn applies a logical one to the ULP_Auto_0_latch which remains at logical one during the duration of the monostable 83 pulse, which guarantees a logical one on ULP_Auto_0 during the duration of the pulse generated by the monostable 83. The system therefore has the capability to self-lock the ULP_Auto_0 logic to logical one during a minimum duration set by the monostable pulse duration, each time ULP_Auto_0 transitions from logical zero to logical one.

Since the output voltage Vrect will be lower than Vref, the reference voltage Vref+200 mV is larger than Vrect, resulting in the Vgate_over signal output by the comparator 86 being a logical zero, and in turn, the signal 101 output by the AND gate 87 being a logical zero and inverted by the inverter 88 to produce the ULP_Auto_En signal as being a logical one. In other words, the Vgate_over signal does not have any incidence during this phase. The relevance of the function will be explained further.

Note that since ULP_Auto was produced as a logical zero during reset, the inverter 90 outputs a logical one, causing the monostable 91 to produce a logical one at its output as signal 110. Since the ULP_Auto_0 is a logical one and since the ULP_Auto_En signal is a logical one, the ULP_Auto_1 signal output by the AND gate 85 is produced as being a logical one. Since the ULP_Auto_1 signal is a logical one and since the signal 110 is a logical one, the ULP_Auto signal at this point will be output by the AND gate 89 as a logical one.

The ULP_Auto signal being at a logical one causes the controller 23 to generate GA, GB, GA', and GB' so that on top of conventional operation of rectification of the currents induced in the secondary coil Ls, it performs in-phase serial regulation (Block 203). Initially, the output voltage Vrect will be substantially less than Vref and therefore the comparator 23 will not assert the feedback signal FB.

Operation continues in this open-loop fashion while the output voltage Vrect remains less than the reference voltage Vref (Block 204). As operation continues, the output voltage Vrect will rise. Once the output voltage Vrect becomes superior or equal to the reference voltage Vref (Block 204), the feedback signal FB is asserted by the comparator 23, and closed loop serial in-phase regulation begins (Block 205). At this point, the closed loop serial in-phase regulation using PWM continues, as described above in detail, and continues until the Duty_ser_limit_latch_B signal is pulled to a logic low (Block 206). This occurs when the duty cycle Duty_Ser_SH of the regtifier 25' falls below 10% (meaning that the Duty_Ser_SH signal falls below 10% to become lesser than Duty_Ser_limit, which is set at 10%, resulting in the comparator 52 outputting Duty_Ser_limit_latch_B as a logical zero.

Duty_ser_limit_latch_B being output as a logical zero in turn causes the signal 103 output by the AND gate 81 to become a logical zero, causing the ULP_Auto_Pre signal output by the AND gate 82 to become a logical zero, resulting in the OR gate 84 outputting the ULP_Auto_0_signal as a logical zero (because ULP_Auto_0 is a logical zero), in turn resulting in the ULP_Auto_1 signal being output by the AND gate 85 as a logical zero, and therefore the ULP_Auto signal being output by the AND gate 89 as a logical zero.

The ULP_Auto signal being output as a logical zero causes the controller 23 to generate GA, GB, GA', and GB' so as to rectify currents induced in the secondary coil Ls while performing anti-phase parallel regulation (Block 207).

It is to be noted that the transition of ULP_Auto from logical one to logical zero, after inversion by the inverter gate 90, does trigger the monostable 91, the output of which, once inverted by the inverter gate 92, secures a logical zero on input 110 and ensures that logical zero on AND gate 89 is maintained during the duration of the non-retriggerable monostable 91.

Therefore, until an elapsed time starting from the beginning of anti-phase parallel regulation becomes greater than a minimum time (Block 208), the anti-phase parallel regulation continues. If the elapsed time becomes greater than the minimum time (Block 208), but the IPAR_limit_latch_B and Duty_ser_limit_latch_B signals are not both a logical one, then ULP_Auto continues to be output as a logical zero, and anti-phase parallel regulation continues. However, if both the IPAR_limit_latch_B and Duty_ser_limit_latch_B signals become equal to a logical one (Block 209), then the controller 23 again generates GA, GB, GA', and GB' so as to rectify currents induced in the secondary coil Ls while performing in-phase serial regulation (Block 210).

The system remains in serial in-phase regulation until the elapsed time becomes greater than the minimum time (Block 211). Once this has occurred, the system continues checking if the IPAR_limit_latch_B and Duty_ser_limit_latch_B signals are both at a logical one, and if the two conditions are still true then it continues with in-phase serial regulation.

However, if the output exceeds the reference voltage plus a tolerance margin (set at 200 mV in the example Block 212) while the time has not yet elapsed, the signal 101 rises to logical one and ULP_Auto_En falls to zero and then the controller 23 returns to generating the control signals G1-G4 and G1*a*-G4*a* so as to cause the transistors M1-M4 and M1*a*-M4*a* of the regtifier 25' to perform anti-phase parallel regulation. The system therefore also has the capability of self-exiting the in-phase serial loop with the highest priority in the event that Vrect is too high, which helps guarantee that if the system entered the in-phase serial regulation for less than the elapsed time, but the incoming power is getting too high by coincidence, the system is yet able to exit the in-phase serial mode and enter the anti-phase parallel anti-phase mode.

This way, the regtifier 24' is switched between in-phase serial voltage regulation and anti-phase parallel voltage regulation on the fly, with the in-phase serial voltage regulation being used from powerup/reset and until the closed loop in-phase serial regulation has the regtifier 24' operating at less than a 10% duty cycle (indicated by the Duty_Ser_SH signal falling below the Duty_Ser_Limit signal), at which point anti-phase parallel voltage regulation is used. The continues until anti-phase parallel voltage regulation has been used for a given period of time as well as until the anti-phase parallel current falls below a current threshold (the duty cycle limit detection Duty_Ser_Limit_Lacth_B being asserted by default during parallel regulation), at which point serial regulation is returned to. Then, if serial regulation has not yet been used for a given period of time but the output voltage Vrect becomes greater than the reference voltage Vref+200 mv, parallel voltage regulation is returned to. Otherwise the serial regulation remains and loop until the duty cycle falls too low.

Therefore, in summary, in-phase serial voltage regulation is used until the duty cycle of the regtifier 25' fall below 10%, meaning that 90% of the power dissipation capability of the regtifier 25' is being utilized. At that point, anti-phase parallel voltage regulation is used for its additional power dissipation capabilities. Parallel voltage regulation has the capability to cease serial regulation in case the regulated voltage becomes too high during a given time window, and anti-phase voltage regulation is used until the current it draws fall below a defined limit. This advantageously allows for the proper voltage regulation scheme to be used given the current operation conditions.

F. Advantages

The in-phase serial voltage regulation and anti-phase parallel voltage regulation schemes offer a variety of advantages, including the significant area savings provided by eliminating a separate discrete voltage regulator (including a power transistor and a tank capacitor) such as a low dropout amplifier, as well as power savings when the wireless power transmission system 20 is operating at equilibrium. In addition, these schemes spread excess power consumption over four devices (transistors M1-M4), instead of all excess power consumption being absorbed by a single power transistor within an additional voltage regulator. Still further, these schemes permit easy utilization of the receiver 22 as a transmitter, since direct access to node N1 (at which the voltage Vrect is developed) is available.

Efficiency differences between a prior art wireless power transmission system and the wireless power transmission system 20 are illustrated in the table below:

| Value | Rectifier + Regulator | Regtifier |
|---|---|---|
| Vrect | 5.2 V | 4.99 V with 50 mV ripple |
| Power Delivered by TX | 5.84 W | 5.63 W |
| Power Received by RX | 5.43 W | 5.23 W |
| Power Deliverd to Load | 4.97 W | 4.97 W |
| Efficiency of Rectifier + Regulator | 91.57% | NA |
| Efficiency of Regtifier | NA | 95.11% |
| Power lost | 457 mW | 255 mW |
| System efficiency | 85.11% | 87.88% |

Among other advantages, note that the system efficiency increases by nearly 3%

Figures 11, 11A, 11B:
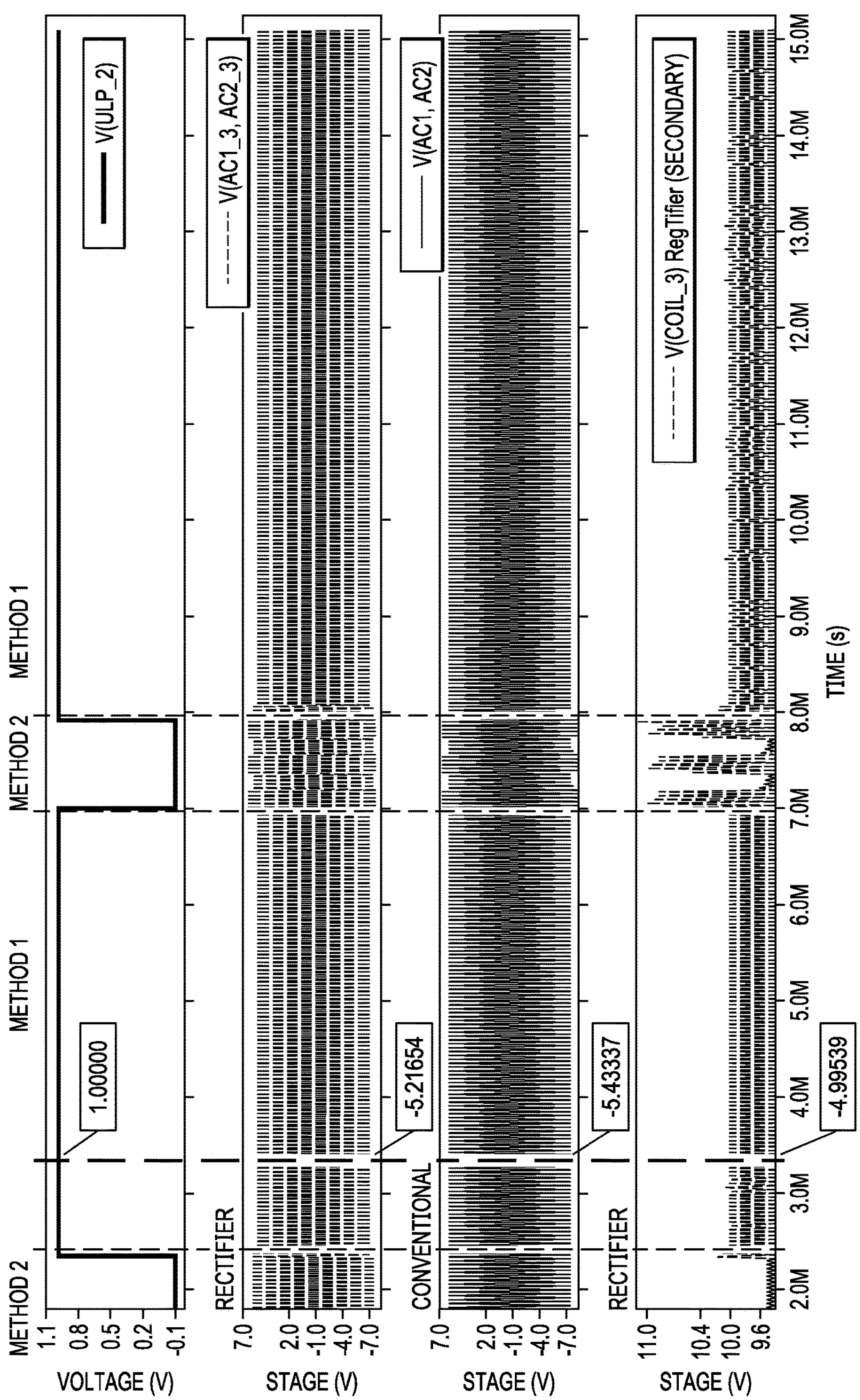
FIG. 11, which includes
FIGS. 11A and 11B, is a timing diagram showing voltages of the wireless power transmission system of FIG. 2 in operation, wherein the feedback loop switches between controlling the bridge rectifier to perform in-phase serial voltage regulation and controlling the bridge rectifier to perform anti-phase parallel voltage regulation illustrating ASK symbols transmitted during power transmission.
Figure 11B:
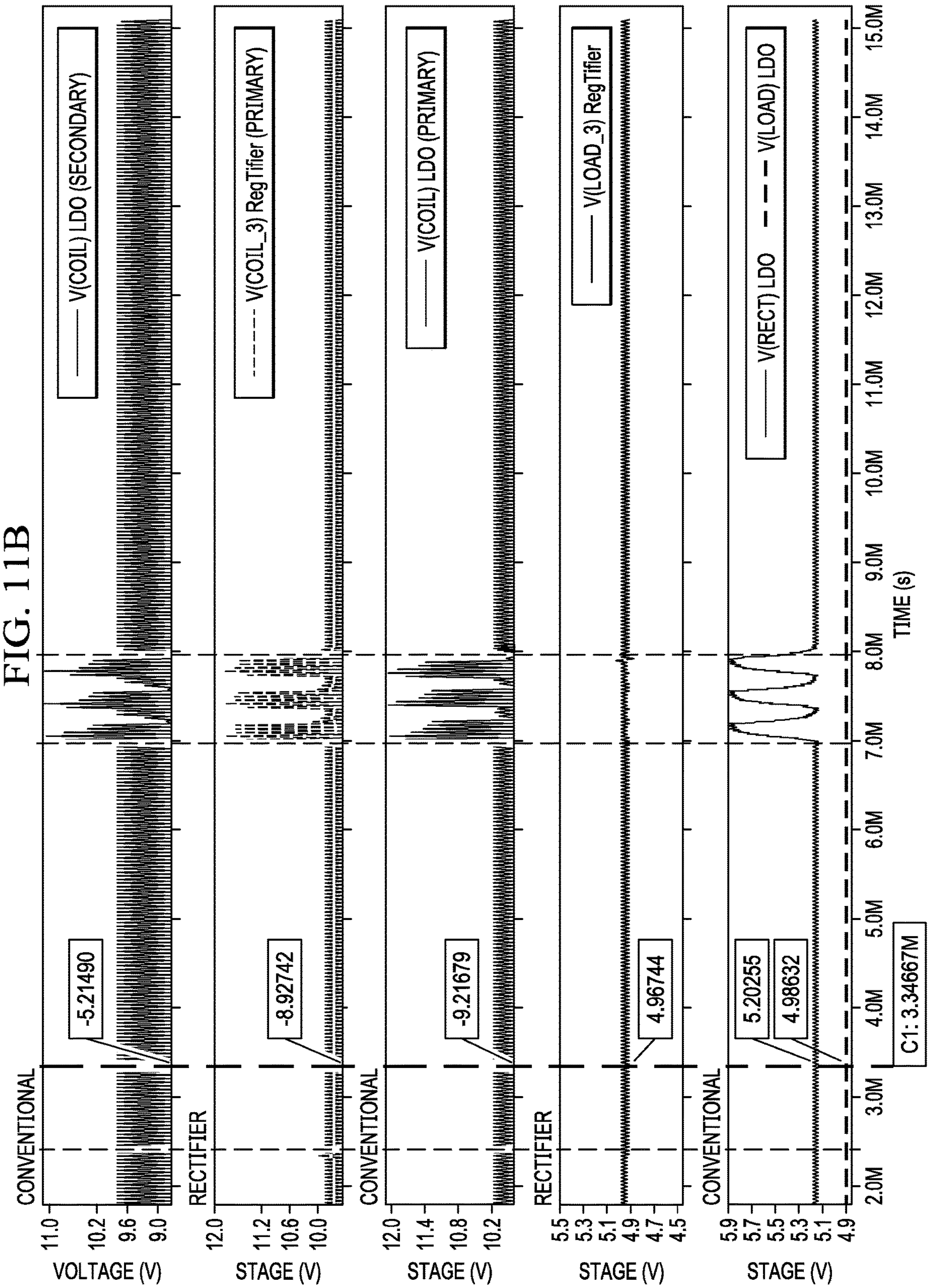

Another advantage provided is that when the operation of the wireless power transmission system 20 includes data communication together with power transfer, such as by using amplitude shift keying (ASK) when data transmission is from the receiver 22 to the transmitter 21, the data symbols (ASK symbols) received by the transmitter 21 are cleaner. This can be seen in FIGS. 11, 11A, 11B, where the signal received by the transmitter 21 (labeled as Vcoil LDO primary) using a prior art wireless power transmission system 20 contains decreasing amplitude peaks in its pulses, but where the signal received by the transmitter 21 (labeled as Vcoil_3 Regtifier) contains flat amplitude peaks in its pulses using the wireless data transmission system 20, which is easing the symbols extraction at primary side.

Also, when ASK data transmission is performed using a prior art power transmission system, the modulation depth changes depending upon the incoming power and the magnitude of the output voltage Vrect, since the drain to source resistance of the power transistor of a discrete voltage regulator will vary greatly depending upon the incoming power and the magnitude of the output voltage Vrect. However, when using the wireless data transmission system 20 described herein, the drain to source resistance of the four transistors M1-M4 of the regtifier varies far less than that of the single power transistor of a discrete voltage regulator, maintaining the modulation depth at a generally constant level.

G. Description of Further Embodiment Utilizing a Regtifier with Dual Outputs

Figure 26:
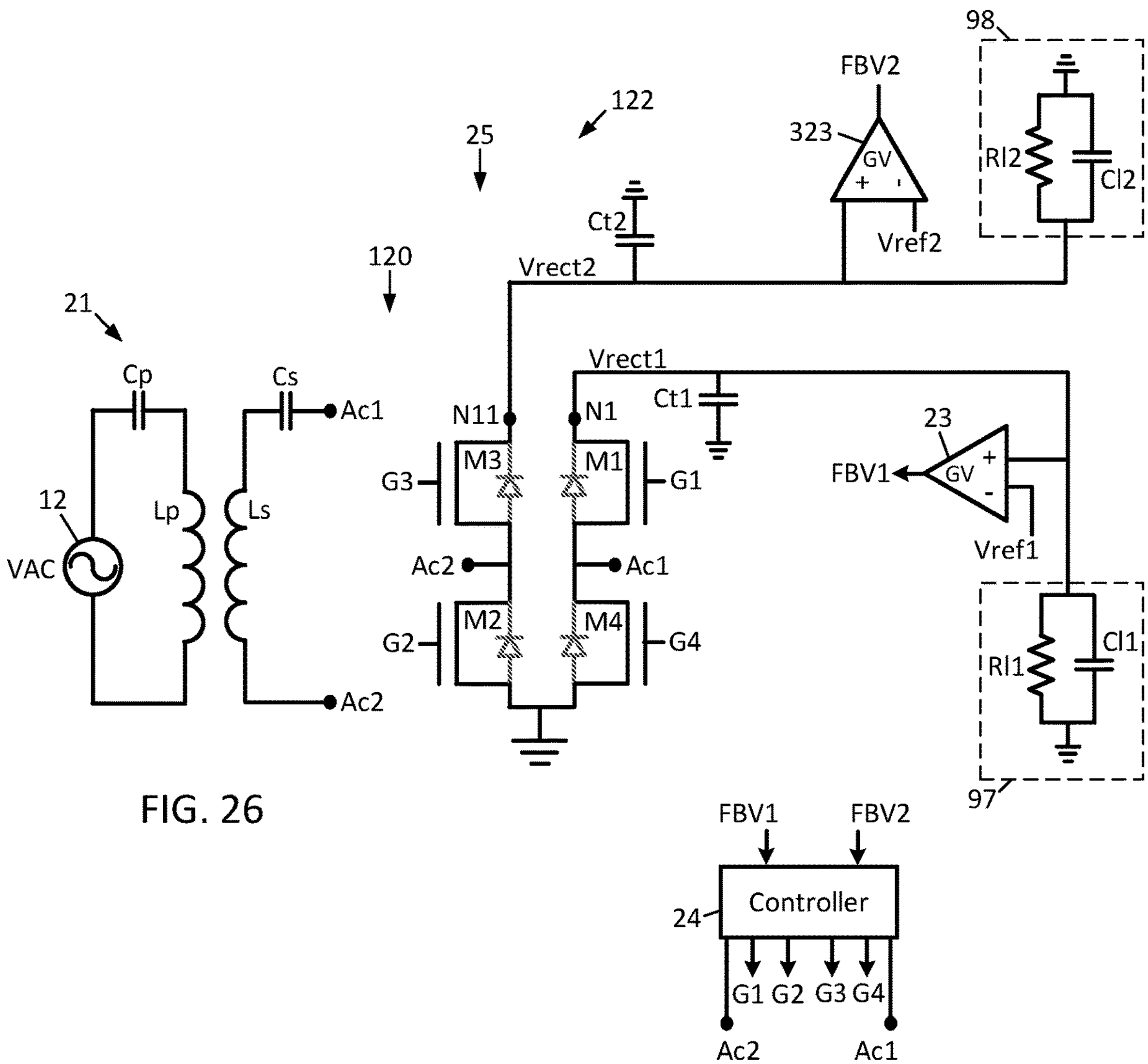
FIG. 26 is a schematic block diagram of a wireless power transmission system disclosed herein in which the regtifier operates as two half-bridge rectifiers, regulating based on voltage.

Now described with reference to FIG. 26 is a wireless power transmission system 120 like that of FIG. 2, but where the regtifier 25 is connected and controlled to operate as two half-bridges, with the first half-bridge being formed by transistors M1 and M4 and the second half-bridge being formed by transistors M3 and M2. For the operation of both half-bridges, feedback for each is provided based upon its respective rectified output voltage Vrect1 or Vrect2.

The wireless power transmission system 120 includes a transmitter 21 and a receiver 122. The transmitter 21 is comprised of an AC voltage source 12 coupled to a serial resonant transmitter coil Lp and capacitance Cp. The receiver 122 includes a serial resonant receiver coil Ls and capacitance Cs coupled between nodes Ac1 and Ac2, and a "regtifier" 25 (a full bridge rectifier, here configured as two-half bridge rectifiers, also capable of voltage regulation when controlled using techniques described herein) formed by transistors M1-M4.

The regtifier 25 is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N11, a source connected to node Ac2, and a gate coupled to receive a control signal G3; and an n-channel transistor M2 having a drain connected to node Ac2, a source connected to ground, and a gate coupled to receive a control signal G2.

An optional tank capacitor Ct1 is coupled between node N1 and ground, and a rectified output voltage Vrect1 is formed across the tank capacitor Ct1. An optional tank capacitor Ct2 is coupled between node N11 and ground, and a rectified output voltage Vrect2 is formed across the tank capacitor Ct2.

An amplifier 23 with a gain of GV has an inverting input terminal coupled to receive a reference voltage Vref1 (which is set to be equal to a voltage value for Vrect1), a non-inverting input terminal coupled to node N1, and an output coupled to control circuitry 24 and generating a voltage feedback signal FBV1. Mathematically, FBV1 can be represented as:

$$FBV1=GV\times(Vrect1-Vref1)$$

An amplifier 323 with a gain of GV has an inverting input terminal coupled to receive a reference voltage Vref2 (which is set to be equal to a voltage value for Vrect2), a non-inverting input terminal coupled to node N11, and an output coupled to control circuitry 24 and generating a voltage feedback signal FBV2. Mathematically, FBV2 can be represented as:

$$FBV2=GV\times(Vrect2-Vref2)$$

A first load represented by the parallel load resistance Rl1 and load capacitance Cl1 is coupled between node N1 and ground, and a second load represented by the parallel load resistance Rl2 and load capacitance Cl2 is coupled between node N11 and ground.

The control circuitry 24 receives input from the voltage feedback signals FBV1 and FBV2, and based thereupon, generates the control signals G1-G4 for the transistors M1-M4.

As will be explained in detail below, the control circuitry 24 generates the control signals G1-G4 to cause the regtifier 25 to both rectify the AC current induced in the receiver coil Ls to produce a rectified output voltages Vrect1 and Vrect2, while at the same time suitably modulating two or more of the control signals G1-G4 so as to dissipate excess power to thereby regulate the output voltages Vrect1 and Vrect2. By dissipating excess power, the power delivered to the loads by the regtifier 25 can be controlled and kept within a desired level, without the use of a separate discrete voltage regulation circuit. To that end, the amplifier 23 and the control circuitry 24 form a first voltage feedback loop, and the amplifiers 323 and control circuitry 24 form a second voltage feedback loop, with each loop being used to control one of the respect half bridges of the regtifier 25.

As explained above in detail in Section B of this disclosure, such feedback may be used by the control circuitry 24 to cause the regtifier 25 to both rectify the AC current and dissipate excess power to produce a regulated output voltage Vrect by reducing the driving of turned-on in-phase transistors. Here, since M1/M4 are operating as a first half-bridge and M3/M2 are operating as a second half-bridge, a first phase for M1/M4 is when transistor M1 is turned on and a second phase for M1/M4 is when transistor M4 is turned on, and likewise a first phase for M3/M2 is when transistor M2 is turned on and a second phase for M3/M2 is when transistor M3 is turned on, such that pair M1/M2 is turned ON during a first phase and pair M3/M4 is turned ON 4 during a second phase. In-phase regulation here for each half-bridge is performed during each respective phase. Thus, in-phase regulation is performed by modulating the drive voltage G1 of transistor M1 when the first half-bridge is in its first phase and in-phase regulation is performed by modulating the drive voltage G2 of transistor M2 when the second half-bridge is in its first phase. Similarly, in-phase regulation is performed by modulating the drive voltage G3 of transistor M3 when the second half-bridge is in its second phase and in-phase regulation is performed by modulating the drive voltage G4 of transistor M4 when the first half-bridge is in its second phase.

Figure 27:
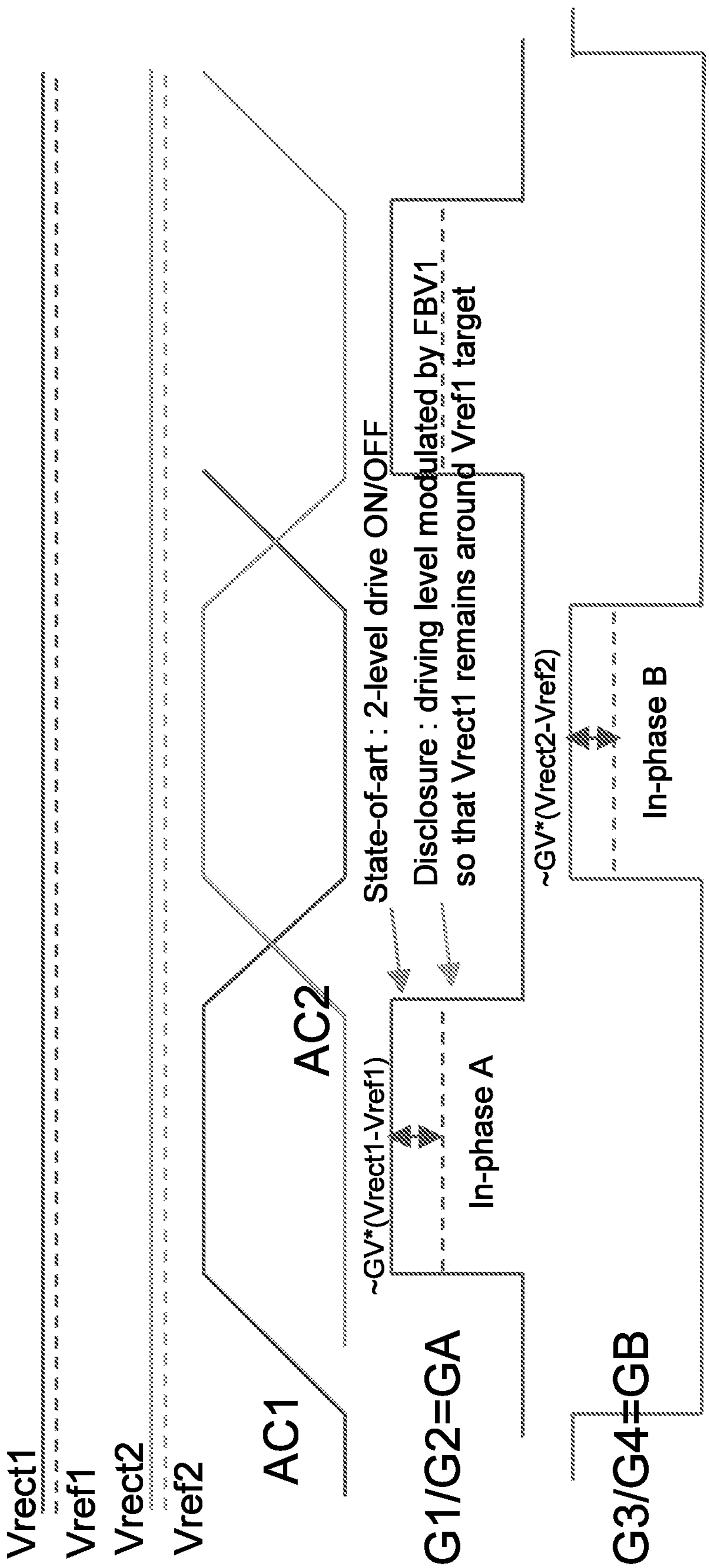
FIG. 27 is a timing diagram showing voltages of the wireless power transmission system of FIG. 26 in operation, when the current feedback loop is controlling the half-bridge rectifiers to perform in-phase regulation based upon current feedback.

Waveforms showing operation of the regtifier 25 when performing in-phase regulation are contained in FIG. 27. Here, when the first phase signal GA (representing the drive signals G1/G2) is asserted, its drive strength is reduced by FBV1 so the rectified output voltage Vrect1 is maintained as being equal to the reference voltage Vref1. Likewise, when the second phase signal GB (representing the drive signals G3/G4) is asserted, its drive strength is reduced by FBV2 so that the rectified output voltage Vrect2 is maintained as being equal to the reference voltage Vref2.

As also explained above in detail in Section C of this disclosure, such feedback may be used by the control circuitry 24 to cause the regtifier 25 to both rectify the AC current and dissipate excess power to produce a regulated output voltage Vrect by lightly driving anti-phase transistors M1/M4 or M3/M2 (M4 being lightly turned on when transistor M1 is fully turned on and performing rectification, or M2 being lightly turned on when transistor M3 is fully turned on and performing rectification, or M3 being lightly turned on when transistor M2 is fully turned on and performing rectification, or M1 being lightly turned on when transistor M4 is fully turned on and performing rectification) .

Figure 28:
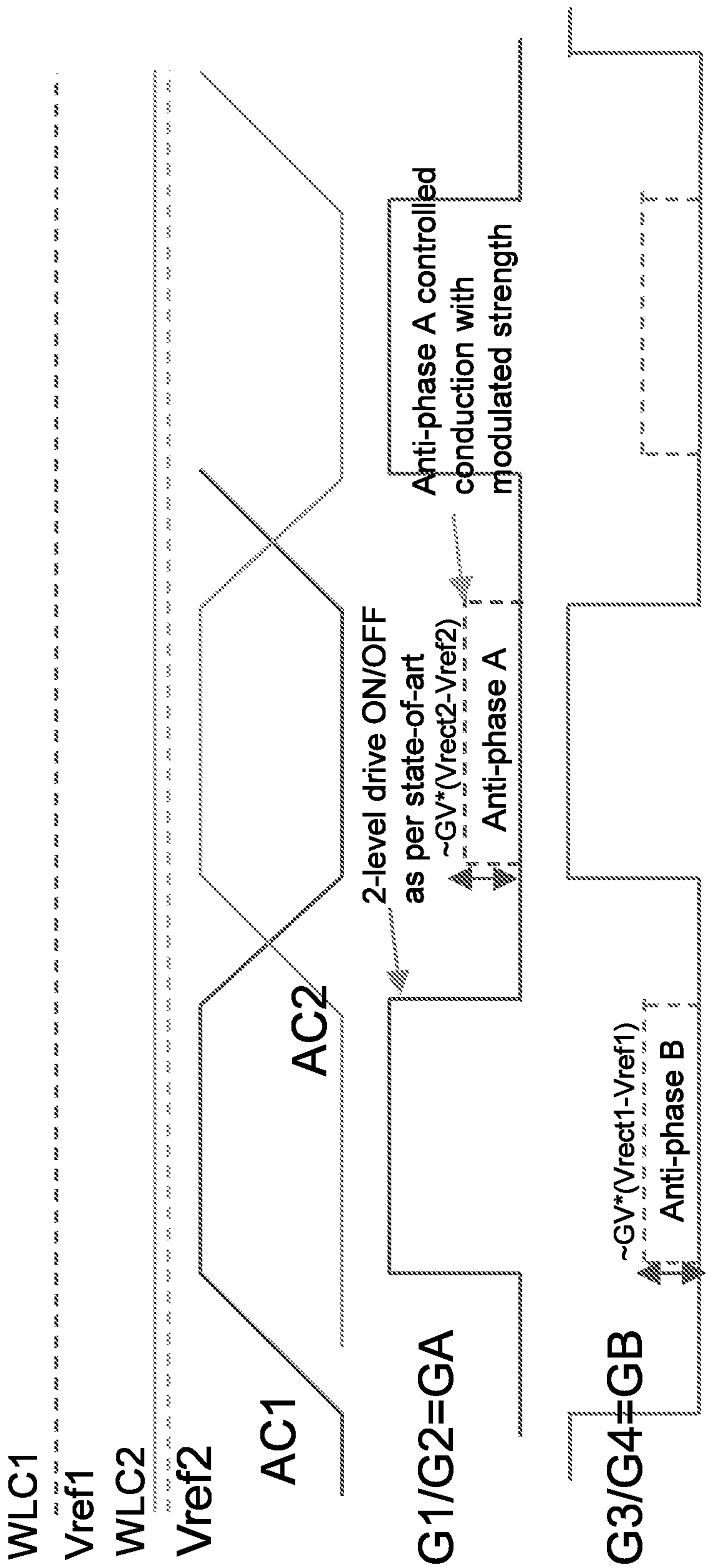
FIG. 28 is a timing diagram showing voltages of the wireless power transmission system of FIG. 26 in operation, when the current feedback loop is controlling the bridge rectifier to perform anti-phase regulation based upon current feedback.

Waveforms showing operation of the regtifier 25 when performing anti-phase regulation are contained in FIG. 28. Here, when the first phase signal GA (representing the drive signals G1/G2) is asserted, the first phase signal GB (representing the drive signals G3/G4) is asserted at a voltage equal to FBV1 so that the rectified output voltage Vrect1 is maintained at Vref1. Similarly, when the second phase signal GB (representing the drive signals G3/G4) is asserted, the second phase signal GA (representing the drive signals G1/G2) is asserted at a voltage equal to FBV2 so that the rectified output voltage Vrect2 is maintained at Vref2.

And, as explained above in detail in section D of this disclosure, such feedback may be used by the control circuitry 24 to cause the regtifier 25 to utilize both in-phase anti-phase regulation simultaneously for each half-bridge, or to cause the regtifier 25 to switch between in-phase and anti-phase regulation for each half-bridge.

In the examples above, the described regulation has been based upon voltage feedback. However, it may be desired for regulation to be based upon a current feedback, or both current feedback and voltage feedback. An embodiment making this possible is shown in FIG. 29.

Figure 29:
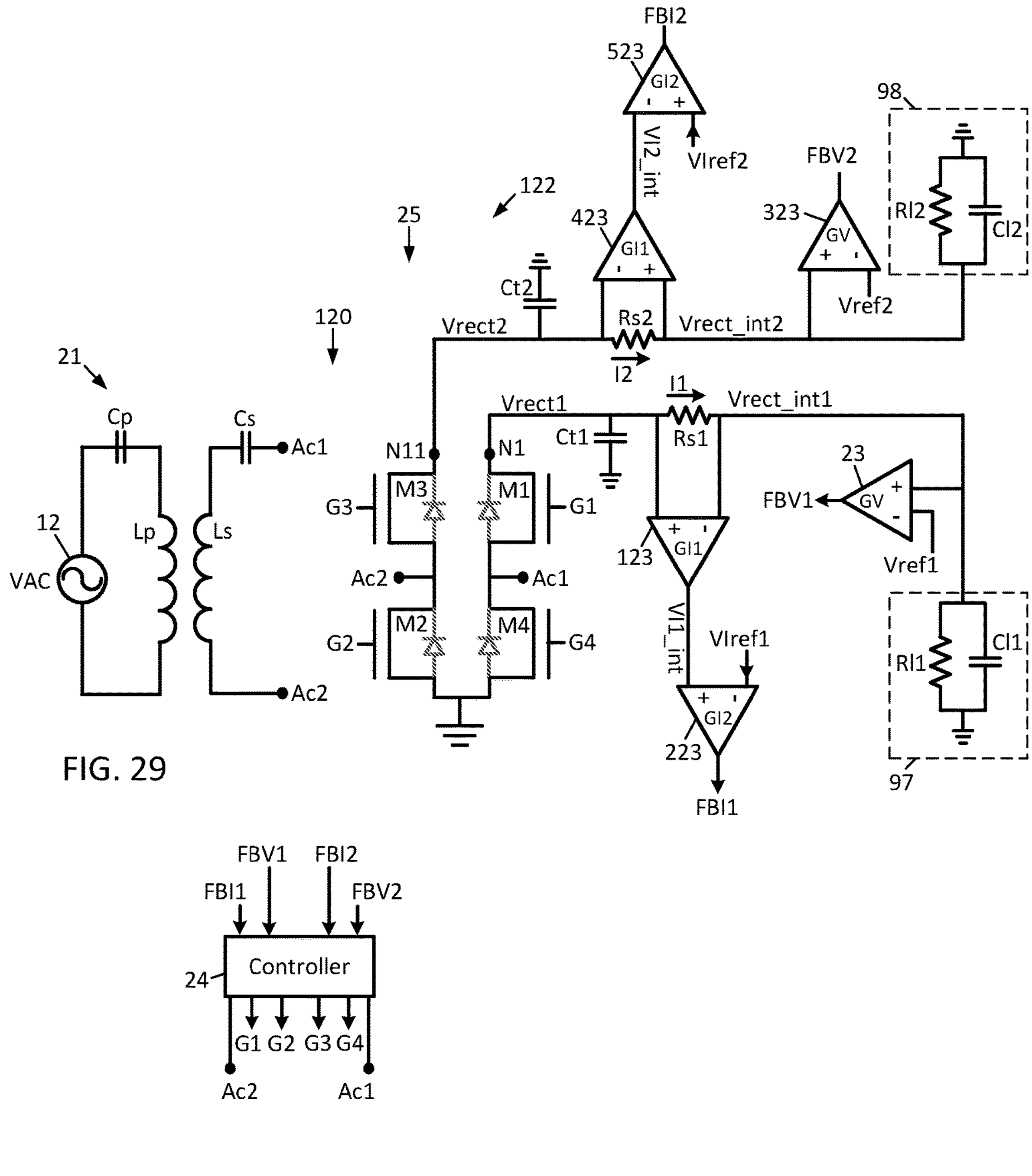
FIG. 29 is a schematic block diagram of a wireless power transmission system disclosed herein in which the regtifier operates as two half-bridge rectifiers, regulating based on voltage and current.

The embodiment of FIG. 29 is generally the same as that of FIG. 26, except a sense resistor Rs1 is coupled between node N1 and the first load (represented by R11/C11), a sense resistor Rs2 is coupled between node N11 and the second load (represented by R12/C12), and current feedback circuitry generates current feedback signals FBI1 and FBI2 for use by the controller 24 in controlling the regtifier 25.

The current feedback circuitry includes, for the first half-bridge, amplifiers 123 and 223. Amplifier 123 has a gain of GI1, and has a non-inverting input terminal coupled to a first terminal of the sense resistor Rs1 (said first terminal being connected to node N1), an inverting input terminal coupled to a second terminal of the sense resistor Rs1 (said second terminal being connected to the first load R11/C11), and an output generating a voltage VI1_int representative of the current I1 flowing through sense resistor Rs1. Amplifier 223 has a gain of GI2, and has a non-inverting input terminal coupled to receive VI1_int and an inverting input coupled to receive a voltage VIref1 representative of a reference current Iref1, the amplifier 223 generating a current feedback signal FBI1 representative of the difference between the current I1 and the reference current Iref1.

The current feedback circuitry includes, for the second half-bridge, amplifiers 423 and 523. Amplifier 423 has a gain of GI1, and has a non-inverting input terminal coupled to a first terminal of the sense resistor Rs2 (said first terminal being connected to node N11), an inverting input terminal coupled to a second terminal of the sense resistor Rs2 (said second terminal being connected to the second load R12/C12), and an output generating a voltage VI2_int representative of the current I2 flowing through sense resistor Rs2. Amplifier 423 has a gain of GI2, and has a non-inverting input terminal coupled to receive VI2_int and an inverting input coupled to receive a voltage VIref2 representative of a reference current Iref2, the amplifier 423 generating a current feedback signal FBI2 representative of the difference between the current I2 and the reference current Iref2.

In operation, as the outgoing current I1 from the regtifier 25 for the first half-bridge increases, the voltage across the sense resistor Rs1 increases, with the result being that the output voltage of the amplifier 123 rises to become greater than the voltage VIref1, and therefore the current feedback signal FBI1 produced by the amplifier 223 increases, which is in turn read by the controller 24 and used to modify generation of the control signals G1 and G2 according to the desired control scheme (in-phase regulation, anti-phase regulation, or both in-phase regulation and anti-phase regulation) so as to reduce the regulated output voltage Vrect1 to the desired level (e.g., to be equal to Vref1). The voltage FBI1 can be calculated as:

$$FBI1 = GI2 \times (VI1 - VIref1)$$

Similarly, as the outgoing current I2 from the regtifier 25 for the second half-bridge increases, the voltage across the sense resistor Rs2 increases, with the result being that the output voltage of the amplifier 423 rises to become greater than the voltage VIref2, and therefore the current feedback signal FBI2 produced by the amplifier 523 increases, which is in turn read by the controller 24 and used to modify generation of the control signals G3 and G4 according to the desired control scheme (in-phase regulation, anti-phase regulation, or both in-phase regulation and anti-phase regulation) so as to reduce the regulated output voltage Vrect2 to the desired level (e.g., to be equal to Vref2). The voltage FBI2 can be calculated as:

$$FBI2 = GI2 \times (VI2 - VIref2)$$

Figure 30:
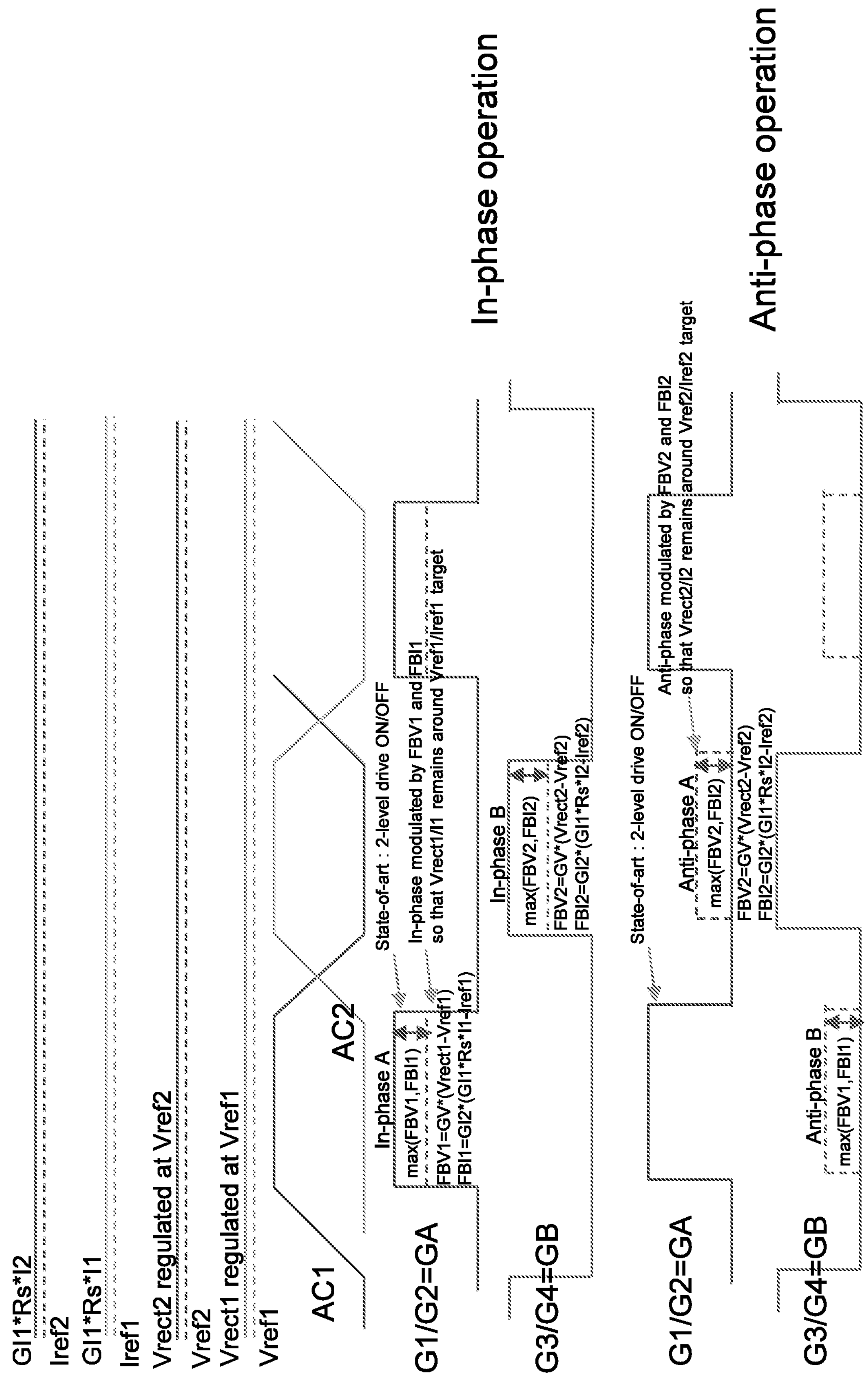
FIG. 30 is a timing diagram showing voltages of the wireless power transmission system of FIG. 29 in operation, when the current feedback loop is controlling the bridge rectifier to perform both in-phase regulation and anti-phase regulation based upon current feedback.

The interplay between the voltage feedback (feedback loop for the first half-bridge formed by amplifier 23 and control circuitry 24, and for the second half-bridge formed by the amplifier 323 and control circuitry 24) and the current feedback (feedback loop for the first half-bridge formed by amplifiers 123/223 and control circuitry 24, and for the second half-bridge formed by the amplifiers 423/523 and control circuitry 24) will be described in detail with additional reference to FIG. 30.

In the waveforms illustrated for performing in-phase regulation, instead of the first phase drive signal GA (drive signals G1/G2) being equal to what GA would be in the absence of regulation, the first phase drive signal GA is reduced by whichever of the feedback signals FBI1 or FBV1 is greater, and instead of the second phase drive signal GB (drive signals for G3/G4) being equal to what GB would be in the absence of regulation, the second phase drive signal GB is reduced by whichever of the feedback signals FBI2 or FBV2 is greater.

In the waveforms illustrated for performing anti-phase regulation, the first anti-phase drive signal GA (drive signal G1/G2 when transistor M4/M3 is on and performing rectification) is equal to whichever of the feedback signals FBI2 or FBV2 is greater, and the second anti-phase drive signal GB (drive signal G3/G4 when transistor M2/M1 is on and performing rectification) is equal to whichever of the feedback signals FBI1 or FBV1 is greater. The voltage VIref1 representing the reference current Iref1 is set to be a threshold amount higher than a voltage representing an expected nominal current I1 (for example, 10% greater than the expected nominal current I1) through the sense resistor Rs1, and the voltage VIref2 representing the reference current Iref2 is likewise set to be a threshold amount higher than a voltage representing an expected nominal current I2 (for example, 10% greater than the expected nominal current I2) through the sense resistor Rs2. Therefore, regulation performed based upon the feedback signals FBV1 and FBV2 is used for steady state operation, with regulation performed based upon the feedback signals FBI1 and FBI2 being used to control transients.

It is useful for the wireless power transmission system 120 to be capable of regulation based upon both voltage and current, not only to control transients, but also at startup. For example, during startup when transistor M3 has been turned on during a positive alternance of Ac2 signal, the inrush current can rise to a high level even though the regulated output voltage Vrect1 is still below the reference voltage Vref1.

Therefore, to prevent damage or issues arising from this high inrush current I_inrush, regulation based upon the feedback signal FBI2 is used. The in-phase regulation mode would be unable to limit the inrush current I_inrush, as the body diode of the transistor M3 would conduct the inrush current I_inrush even if the regulation were to turn off the transistor M3. However, the excess inrush current can be limited using the anti-phase regulation. Excess inrush current can be shunted to ground through the anti-phase transistor M2 (here, by control signal G2 being set to the maximum of FBI2 or FBV2, which in this case is the feedback signal FBI2, when the transistor M3 is the in-phase transistor). Once steady state operation is reached, regulation based upon the voltage feedback signal FBV2 may then be used in either in-phase or anti-phase mode, with regulation based upon FBI2 being used to control transients.

Similarly, during startup where transistor M1 is on during a positive alternance of Ac1 signal and a high inrush current I_inrush flows, the anti-phase transistor M4 (here, by control signal G4 being set to the maximum of FBI1 or FBV1, which in this case is the feedback signal FBI1, when the transistor M1 is the in-phase transistor). Once steady state operation is reached, regulation based upon the voltage feedback signal FBV1 may then be used in either in-phase or anti-phase mode, with regulation based upon FBI1 being used to control transients.

H. Further Embodiment of Dual Output Regtifier Having Synchronized Loads

As explained above with reference to FIGS. 26 and 29, when the regtifier 25 is operates as two half-bridge rectifiers each powering a separate load, the outputs of the half-bridges are independently regulated and operate in phase opposition.

Consider that when transistor M1 is turned on—during a positive alternance of signal Ac1—to couple Ac1 to node N1 and power is provided to the first load 97, transistor M3 is off and therefore Ac2 is virtually disconnected from node N11 (and the second load 98 is therefore virtually disconnected from Ac2). Conversely, when transistor M3 is on—during a positive alternance of signal Ac2—to couple Ac2 to node N11 and power is provided to the second load 98, transistor M1 is off and therefore Ac1 is virtually disconnected from node N1 (and the first load 97 is therefore virtually disconnected from Ac1).

Figure 31:
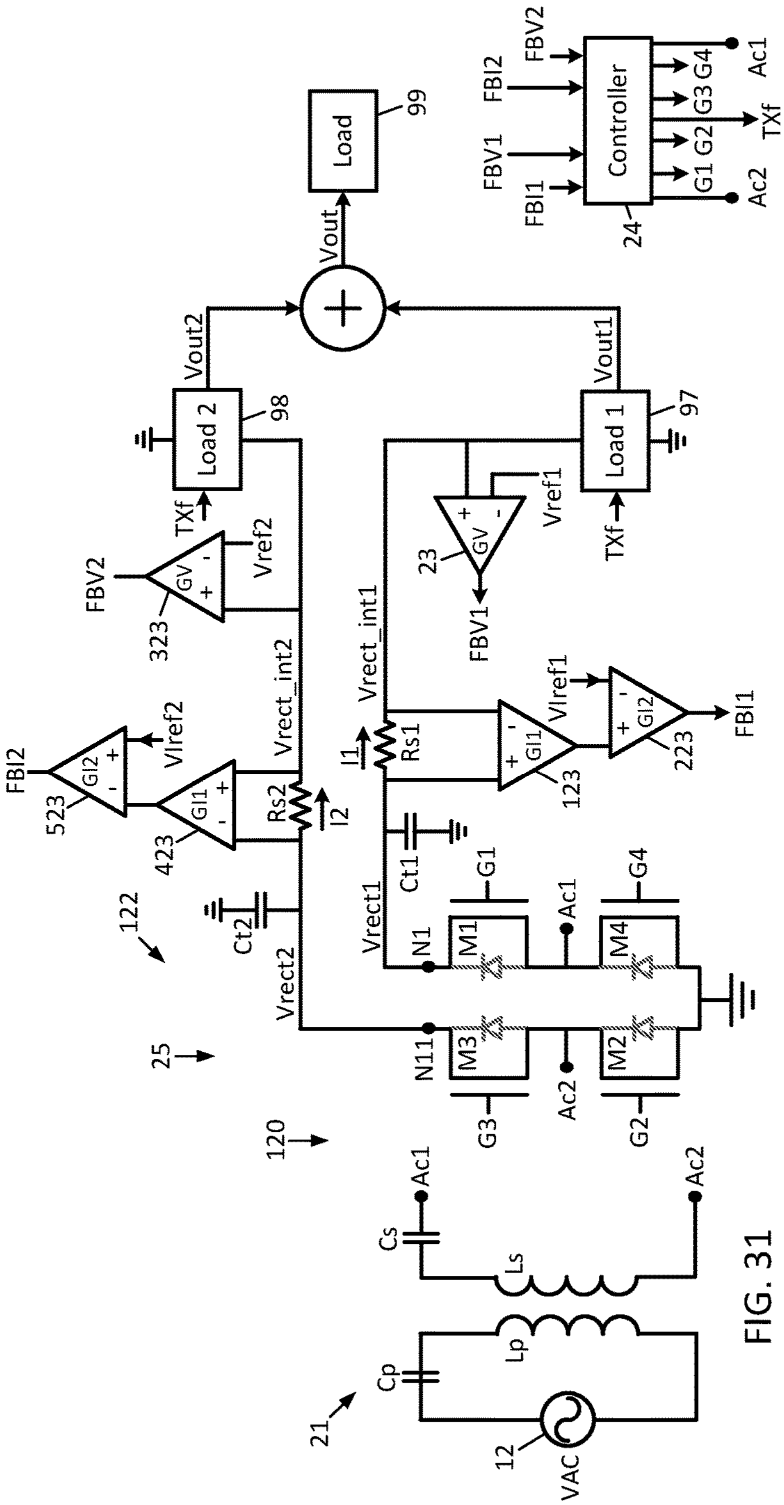
FIG. 31 is a schematic block diagram of a wireless power transmission system disclosed herein in which the regtifier operates as two half-bridge rectifiers that power two power converters that synchronize to power a single load, regulating based on voltage and current measured at each half-bridge output.

Taking advantage of the fact that power is provided to one load at a time in this configuration, a further embodiment shown in FIG. 31 has been developed in which both loads 97 and 98 (which may be power converters in this case) are connected to provide power to another load 99 (which may be a battery this case). When one load 97 or 98 is receiving power, it in turn provides power to the load 99 while the load 98 or 97 not receiving power redistributes the energy it has accumulated during the previous phase.

Figure 32A:
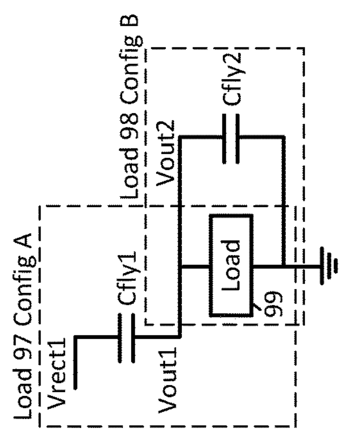
FIGS. 32A and 32B show the two first and second phase configurations possible for the power converters of FIG. 31.
Figure 32B:
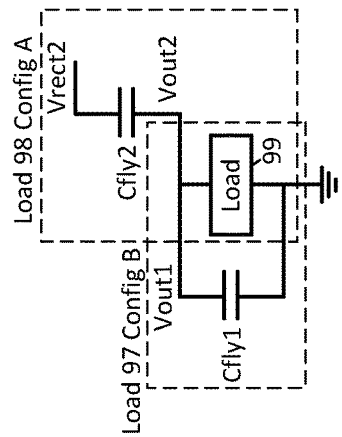

The loads 97 and 98 themselves are switched between different configurations depending upon the current phase, based upon a signal TXf. These configurations, together with the synchronization, will now be described with additional reference to FIGS. 32A, 32B, and 34.

Figure 33:
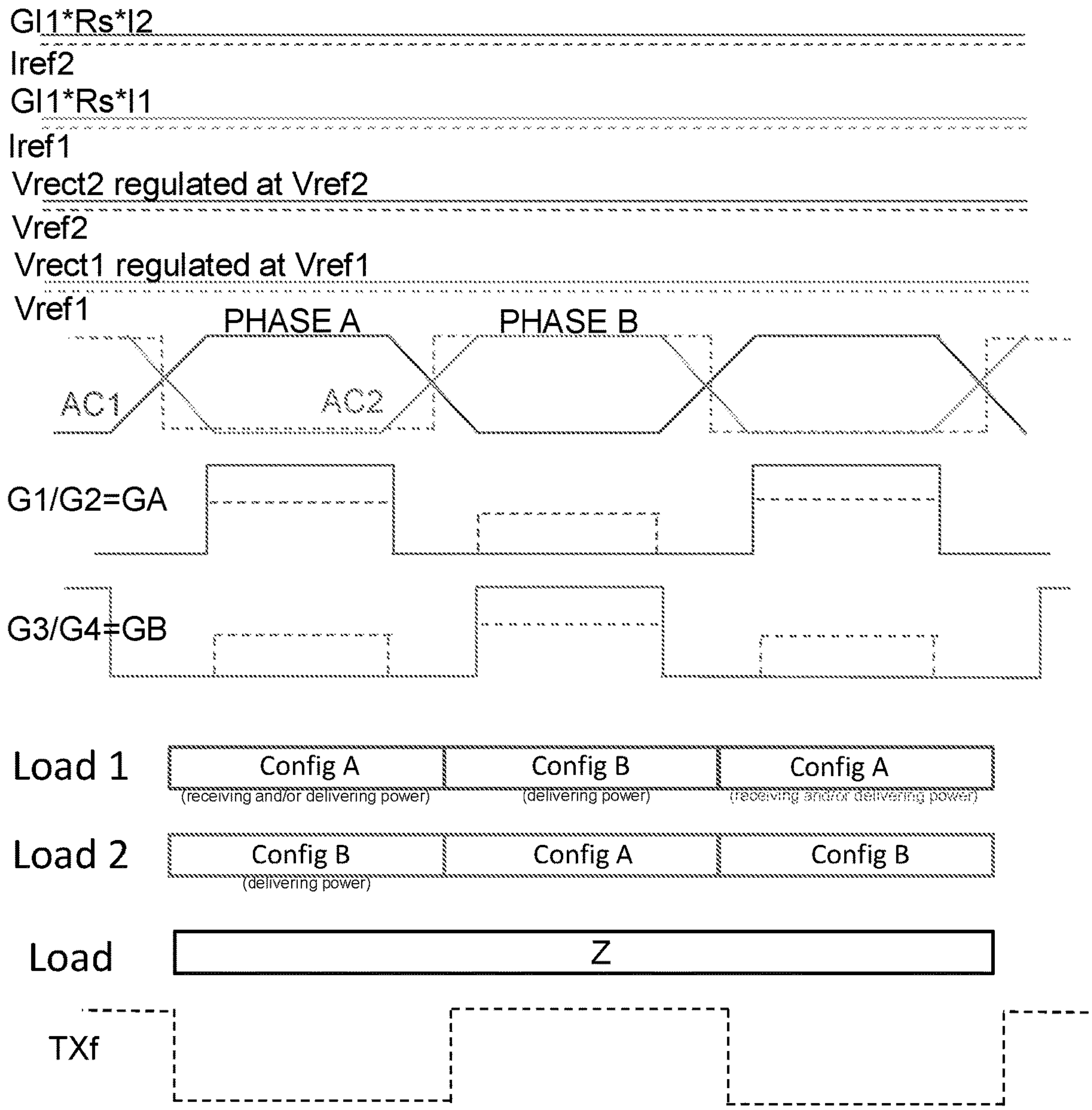
FIG. 33 is a timing diagram showing voltages of the wireless power transmission system of FIG. 31 in operation.

During phase A, Ac1 will be high, Ac2 will be low, and signal TXf will be low. GA (gate drive signals G1 and G2) will be high and GB (gate drive signals G3/G4) will be low, with the result being that transistors M1 and M2 are on while transistors M3 and M4 are off. Due to transistor M1 being on and transistor M3 being off, and in response to TXf being low, assuming the loads 97 and 98 are switched capacitor converters with a 2:1 conversion ratio, the first load 97 will be configured in a first configuration ("LOAD 1 Config A" in FIG. 33A) such that its flyback capacitor Cfly1 is charged by the current I1 and is connected in series with the load 99, while the second load 98 will be configured in a second configuration ("LOAD 2 Config B" in FIG. 32A) such that its flyback capacitor Cfly2 is connected in parallel with the load 99. As a result of this, the load 97 in this phase is receiving power from the regtifier 25 and is delivering power to the load 99, while the load 98 in this phase is delivering power to the load 99 through charge sharing.

The converse of this occurs in Phase B. During phase B, Ac2 will be high, Ac1 will be low, and signal TXf will be high. GA (gate drive signals G1 and G2) will be low and GB (gate drive signals G3/G4) will be high, with the result being that transistors M1 and M2 are off while transistors M3 and M4 are on. Due to transistor M3 being on and transistor M1 being off, and in response to TXf being high, assuming the loads 97 and 98 are switched capacitors converters, the second load 98 will be configured in the second configuration ("LOAD 2 Config A" in FIG. 32B) such that its flyback capacitor Cfly2 is charged by the current I2 and is connected in series with the load 99, while the first load 97 will be configured in the first configuration ("LOAD 1 Config B" in FIG. 32B) such that its flyback capacitor Cfly1 is connected in parallel with the load 99. As a result of this, the load 98 in this phase is receiving power from the regtifier 25 and is delivering power to the load 99, while the load 97 in this phase is delivering power to the load 99 through charge sharing.

Through this technique and circuit arrangement, due to the synchronization between the switching of the regtifier 25 and the operation of the power converters 97 and 98, continuous power is delivered to the load 99.

As described above, the load 97 and 98 are described as being switched capacitor converters with a 2:1 conversion ratio. They may have other ratios, such as 4:1. They may also be, for example, other switched capacitor converters or buck converters having any conversion ratio.

Any regulation technique for regulating Vrect1 and Vrect2 to match Vref1 and Vref2 and/or for regulating I1 and I2 to match Iref1 and Iref2 described above may be used with this technique.

Figure 34:
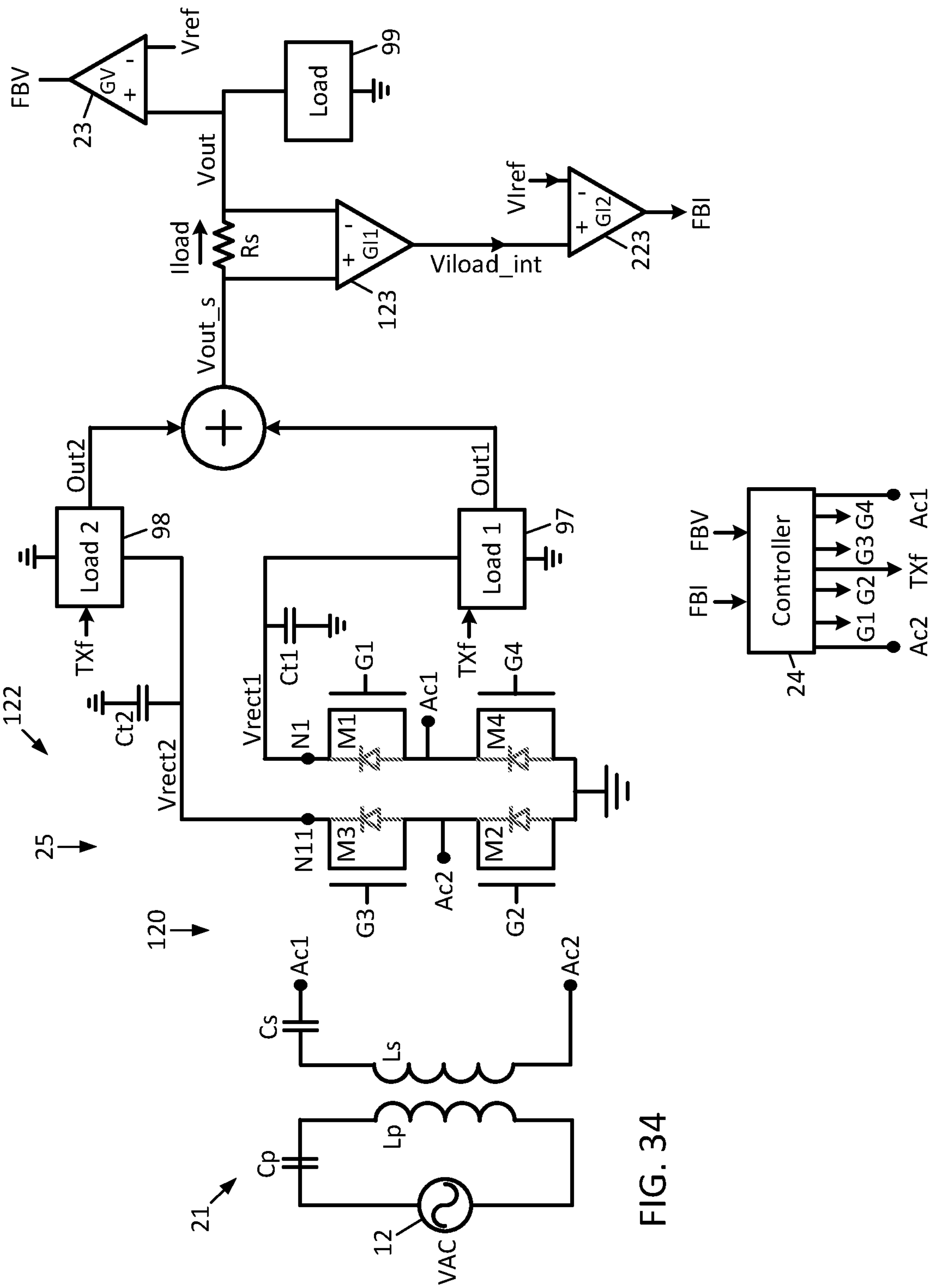
FIG. 34 is a schematic block diagram of a wireless power transmission system disclosed herein in which the regtifier operates as two half-bridge rectifiers that power two power converters that synchronize to power a single load, regulating based on voltage and current measured at the load.

In the example embodiment of the FIG. 31, feedback is taken from each rectified output voltage Vrect1 and Vrect2, and from the output currents I1 and I2. Instead, feedback may be taken at the load 99. This is shown in FIG. 34, where there is a single sense resistor Rs connected to receive the current Iload flowing into the load. In this example, the voltage feedback signal FBV is produced by the amplifier 23 which receives the load voltage Vout at its non-inverting input and the reference voltage Vref at its inverting terminal. The amplifier 123 converts the voltage across the sense resistor Rs to a voltage VIload_int representative of the load current Iload, and the amplifier 223 generates the current feedback signal FBI as representative of the difference between VIload_int and a voltage VIref representative of a reference current Iref, the reference current Iref being a threshold amount higher than Iload during steady state operation.

Figure 35:
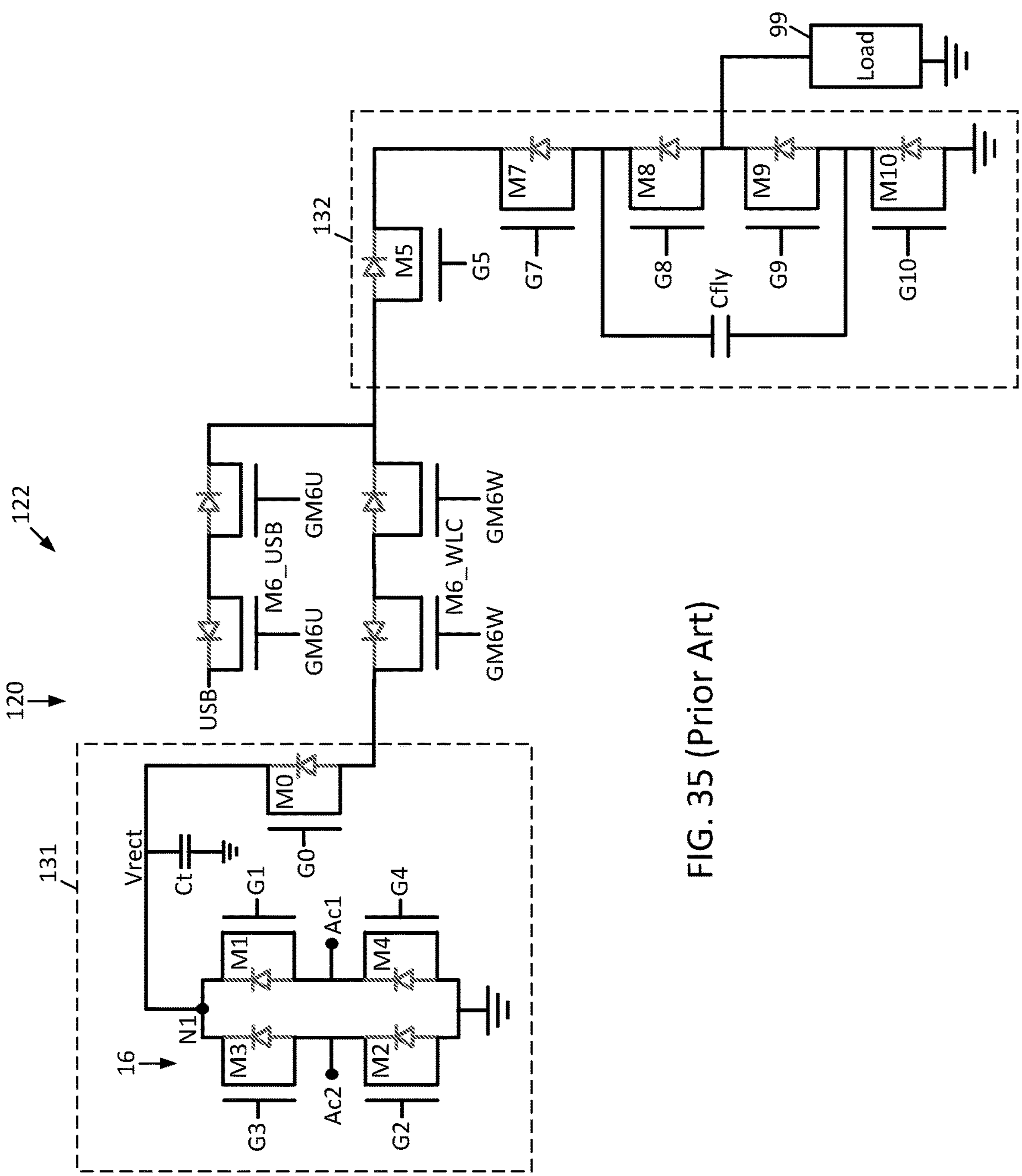
FIG. 35 is a schematic diagram of a prior art rectifier and LDO system, cascaded with a prior art free running clock switched power converter.

I. Embodiment of Dual Output Regtifier Having 2:1 Switched Capacitor Converters as Synchronized Loads For discussion, shown in FIG. 35 is a simplified schematic for a prior art rectifier 16 providing power to a switched capacitor converter 132, which powers a load 99 such as a battery. The feedback mechanism is not shown, but may be conventional voltage based feedback. Of note here is that the rectifier 16 is located on a receiver integrated circuit (IC) 131 that operates at a frequency of, for example, 80-150 kHz, while the switched capacitor converter 132 is located on a separate IC that operates at a frequency of, for example, 500 kHz to 1 MHz. As a result of this mismatch, the converter 132 cannot be directly connected to the rectifier, so the converter 132 includes blocking transistor M7 for use in coupling the converter 132 to the regtifier 131. Also, it uses an additional transistor M5, which is required as safety protection. With this system, protection is required against overcurrent and overvoltages, and in the event that the input to the converter 132 is not as required, the converter 132 may stop operation. Transistors M5 and M7, however, result in additional power losses.

Figure 36:
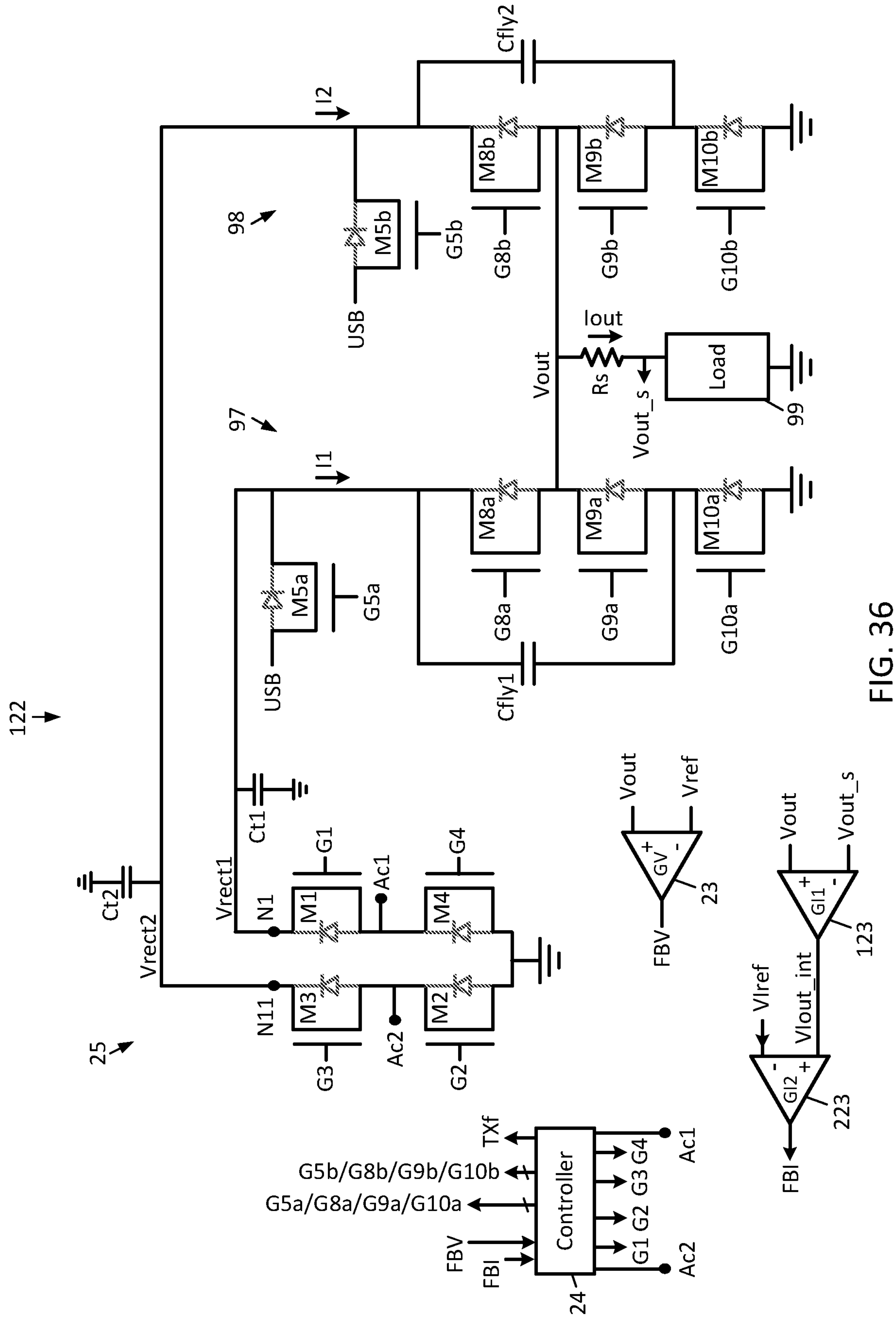
FIG. 36 is a detailed schematic diagram of a possible implementation of the wireless power transmission system of FIG. 34.

As such, the embodiment of FIG. 36 has been developed. Here, the regtifier 25 is configured as two half-bridge rectifiers respectively formed by transistors M1/M4 and M3/M2, each with a switched capacitor converter 97 and 98 coupled thereto, with both switched capacitor converters 97 and 98 coupled to a load 99 through a sense resistor Rs.

The converter 97 is a switched capacitor converter with an updated design. The converter 97 here includes: an n-channel transistor M8*a* having its drain coupled to node N1, its source coupled to the load 99 through sense resistor Rs, and its gate operated by a gate drive signal M8*a*; an n-channel transistor M9*a* having its drain coupled to the load 99 through sense resistor Rs, its source coupled to the drain of n-channel transistor M10*a*, and its gate operated by a gate drive signal G9*a*; and the n-channel transistor M10*a*, which has its drain coupled to the source of n-channel transistor M9*a*, its source coupled to ground, and its gate operated by gate drive signal G10*a*. The converter 97 includes a first flyback capacitor Cfly1 coupled between the drain of transistor M8*a* and the source of transistor M9*a*.

The converter 98 has the same design as that of 97, and includes: an n-channel transistor M8*b* having its drain coupled to node N11, its source coupled to the load 99 through sense resistor Rs, and its gate operated by gate drive signal G8*b*; an n-channel transistor M9*b* having its drain coupled to the load 99 through sense resistor Rs, its source coupled to the drain of n-channel transistor M10*b*, and its gate operated by gate drive signal G9*b*; and an n-channel transistor M10*b* having its drain coupled to the source of n-channel transistor M9*b*, its source coupled to ground, and its gate operated by gate drive signal G10*b*. The converter 97 includes a second flyback capacitor Cfly2 coupled between the drain of transistor M8*b* and the source of transistor M9*b*.

The load 99 is coupled to the sources of transistors M8*a* and M8*b* through the sense resistor Rs. Voltage and current feedback is performed as described above, with the voltage feedback signal FBV being generated by amplifier 23 based upon the difference between the voltage Vout and the reference voltage Vref, and the current feedback signal FBI being generated by amplifier 223 based upon the difference between the voltage VIout_int representative of the load current Iout and a voltage VIref representative of a reference current Iref (set to be a threshold amount above the expected current Iout during steady state operation). VIout_int is generated by the amplifier 123. It is to be noted that the sensing of the current is represented using an explicit sensing element Rs for sake of clarity of the function. However, those skilled in then art will appreciate that the current sensing function could be implemented within the active MOSFETs themselves using, for example, active mirroring technics or others, and hence possibly offering further power loss reduction.

Figure 37A:
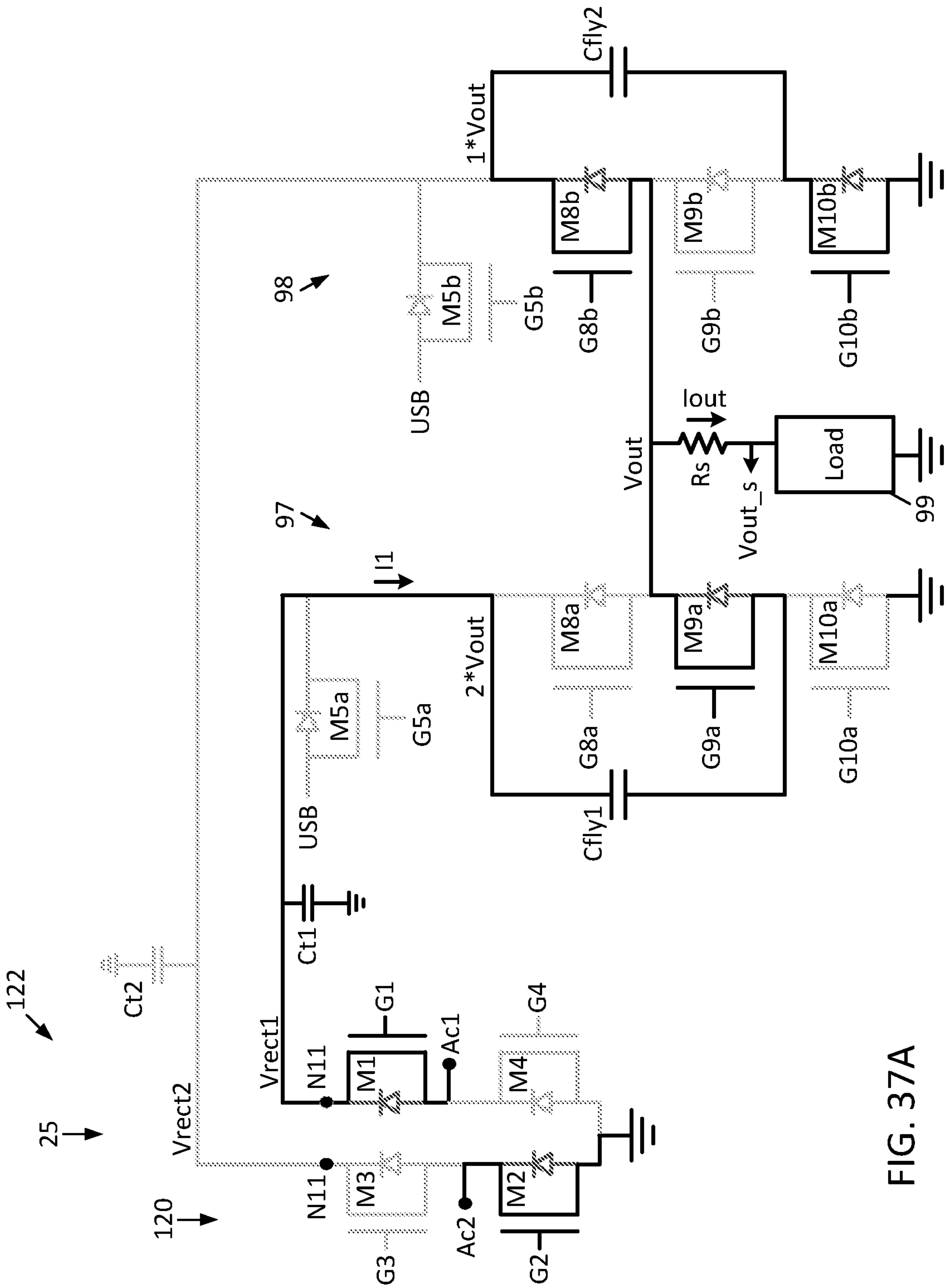
FIGS. 37A-37D are versions of the detailed schematic diagram of FIG. 36 in different modes of operation with current flow shown.
Figure 37B:
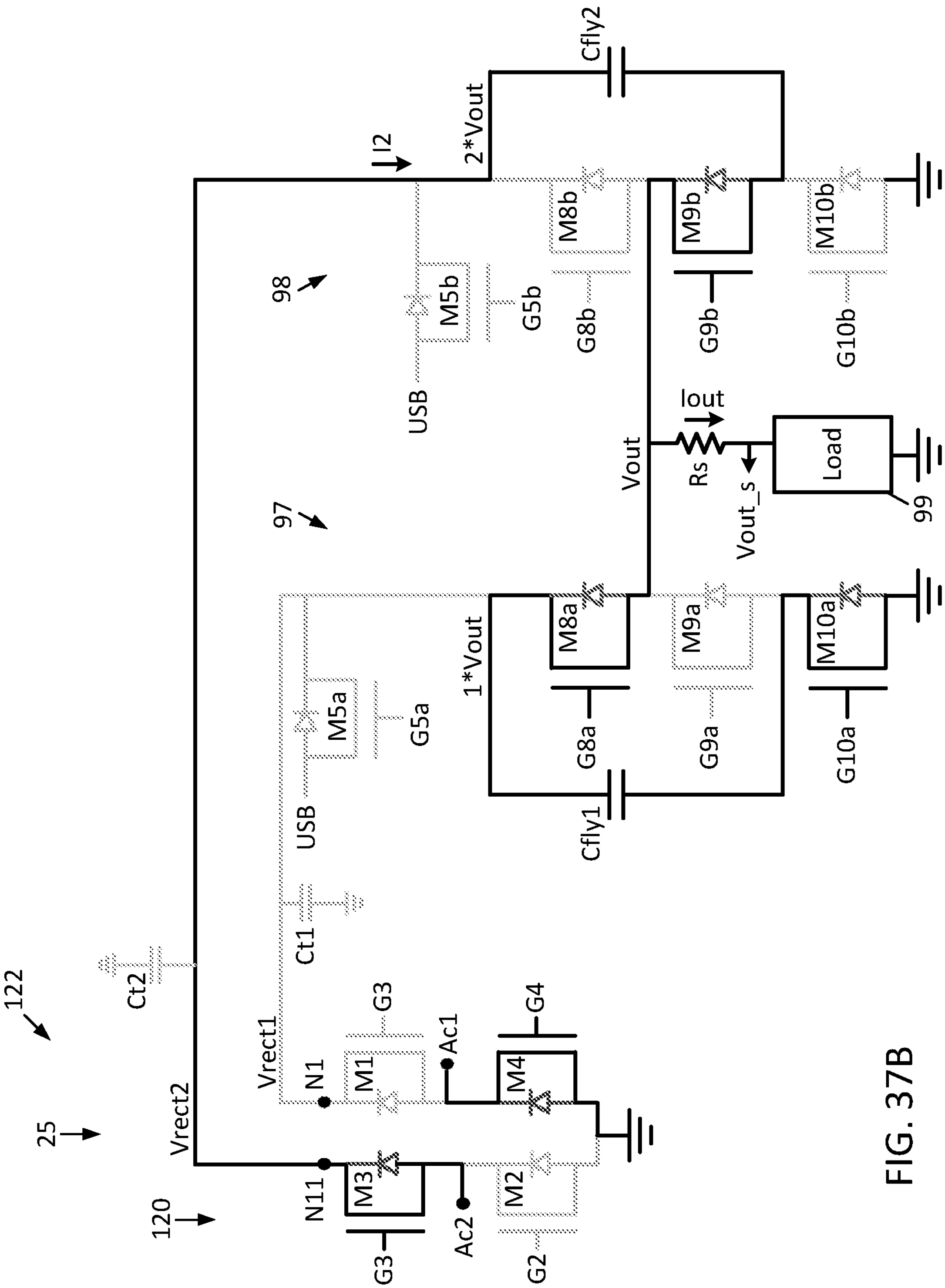

Operation is best understood with additional reference to FIGS. 37A-37B. The regtifier 25 and switched capacitor converters 97/98 are shown in the first phase of operation (phase A) in FIG. 37A. In phase A, transistors M1, M9*a*, M8*b*, and M10*b* are on, forming a series connection from Ac1, through transistor M1, through flyback capacitor Cfly1 and transistor M9*a* to the output terminal at which the output voltage Vout is generated. As such, the flyback capacitor Cfly1 is coupled in series with the capacitance in the load 99, forming an effective tank capacitor that is charged during phase A. Continuing with the connection path, flyback capacitor Cfly2 is coupled in parallel with the output terminal through transistors M8*b* and M1 Ob. Therefore, as explained above, first load (converter 97) will be configured in a first configuration such that its flyback capacitor Cfly1 is charged by the current I1 and is connected in series with the load 99, while the second load 98 will be configured in a second configuration such that its flyback capacitor Cfly2 is connected in parallel with the load 99. Thus, the load 97 in this phase is receiving power from the regtifier 25 and is delivering power to the load 99, while the load 98 in this phase is delivering power to the load 99 through charge sharing.

The regtifier 25 and switched capacitor converters 97/98 are shown in the second phase of operation (phase B) in FIG. 37B. In phase B, transistors M3, M9*b*, M8*a*, and M10*a* are on, forming a series connection from Ac2, through transistor M3, through flyback capacitor Cfly2 and transistor M9*b* to the output terminal at which the output voltage Vout is generated. As such, the flyback capacitor Cfly2 is coupled in series with the capacitance in the load 99, forming an effective tank capacitor that is charged during phase B. Continuing with the connection path, flyback capacitor Cfly1 is coupled in parallel with the output terminal through transistors M8*a* and M10*a*. Therefore, as explained above, second load (converter 98) will be configured in a first configuration such that its flyback capacitor Cfly2 is charged by the current I2 and is connected in series with the load 99, while the first load 97 will be configured in a first configuration such that its flyback capacitor Cfly1 is connected in parallel with the load 99. Thus, the load 98 in this phase is receiving power from the regtifier 25 and is delivering power to the load 99, while the load 97 in this phase is delivering power to the load 99 through charge sharing.

The design of the switched capacitor converters 97 and 98 in FIG. 36 reduces the number of transistors utilized, and therefore reduces the area consumed and reduces power consumption.

It is to be noted that tank capacitors Ct1 and Ct2 were previously mentioned being optional. The remark takes its importance at this point. While Ct1 and Ct2 (generally few tens of microfarads) are beneficial and help to stabilize ripple in the rectified output voltages Vrect1 and Vrect2 in the general case where Vrect1 and Vrect2 are the two stable inputs of loads 97 and 98 referring to FIG. 26, Ct1 and Ct2 are detrimental in terms of power efficiency, when it comes to the operation of FIG. 36. Indeed, as N1 and N11 are moving up and down as the powers converters 97 and 98 are operating, Ct1 and Ct2 should be maintained as low as possible from a power efficiency perspective for avoiding charge sharing between Cfly1 and Ct1, and Cfly2 and CT2 when N1 and N11 are pushed up. As a practical matter, it is limited to the parasitic capacitances of the MOSFETs but additional few tens of pF may be added as well for stabilizing Vrect1 and Vrect2 during high-impedance configuration without overly penalizing the power efficiency of the system.

Figure 37C:
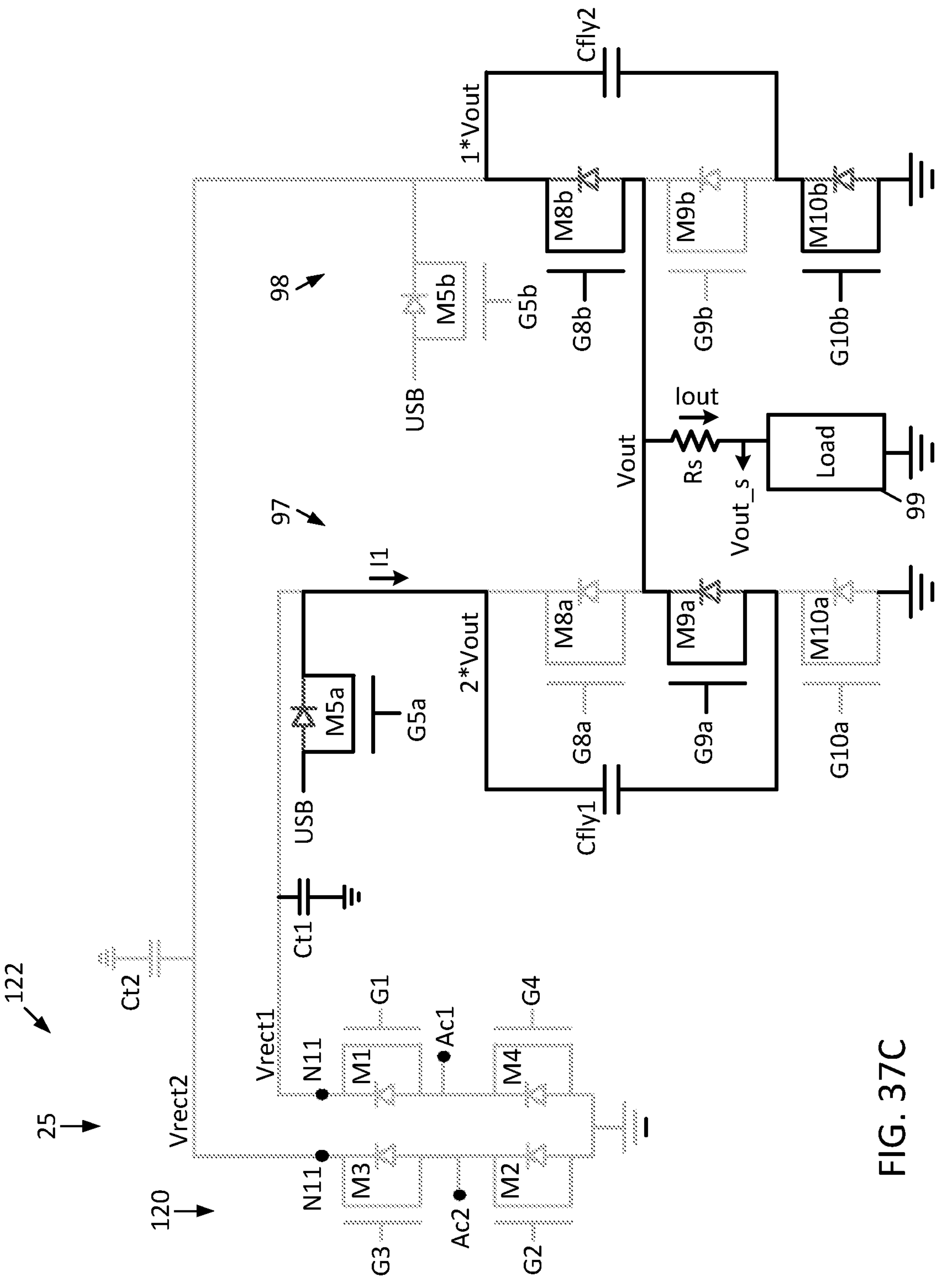
Figure 37D:
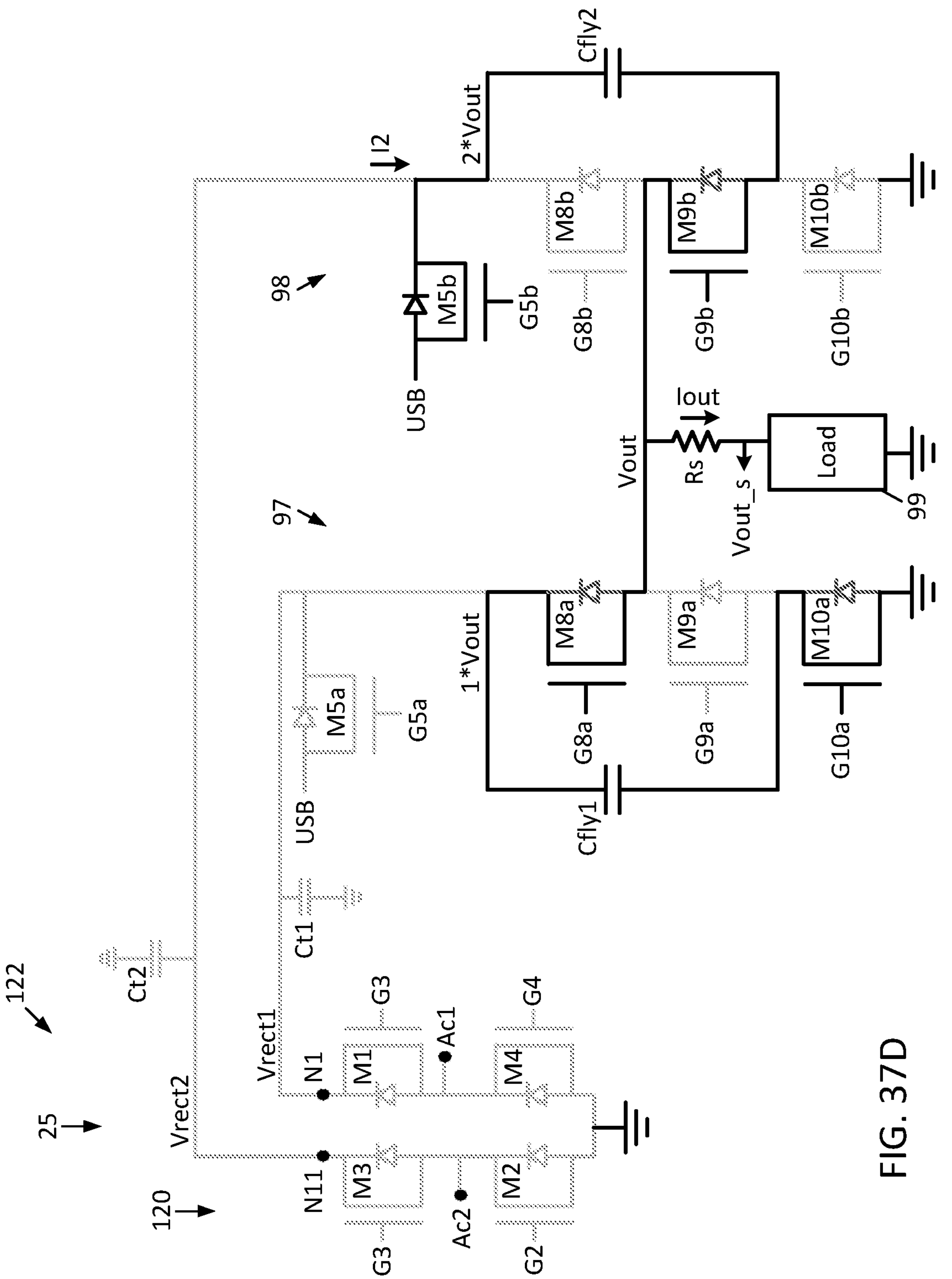

Operation of the switched capacitor converters 97 and 98 when receiving power from a universal serial bus (USB) connection is the same as described above with respect to FIGS. 37A and 37B, except the power source is the USB connection as opposed to the regtifier 25. Operation in the first phase (phase A) when charging from USB is shown in FIG. 37C and operates as the operation in the first phase when charging from the rectified power provided by the regtifier 25 shown in FIG. 37A. Operation in the first phase (phase B) when charging from USB is shown in FIG. 37D and operates as the operation in the second phase when charging from the rectified power provided by the regtifier 25 shown in FIG. 37B.

Figure 38:
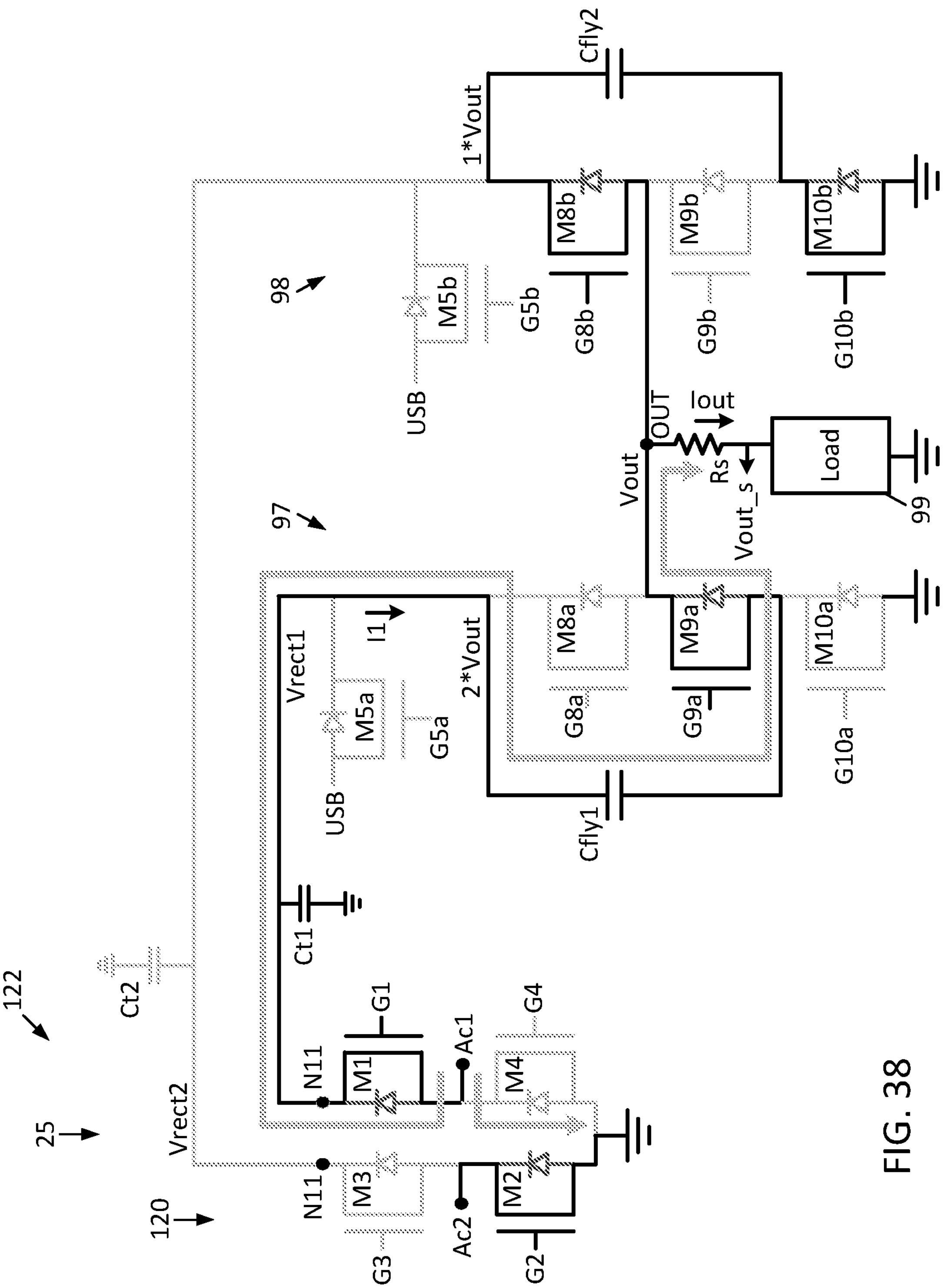
FIG. 38 is a schematic diagram of the regtifier and switched capacitor converters of FIG. 36 during startup, illustrating the control of the inrush current using anti-phase regulation based upon current feedback.

As stated, in-phase or anti-phase regulation based upon voltage and/or current may be used with the above wireless power transmission systems 120 using the switched capacitor converters 97 and 98 described above. During startup, as also explained above, anti-phase regulation upon the current feedback signal FBI is used to protect against a high inrush current, with excess power being dissipated by the anti-phase transistors in the regtifier 25, as shown in FIG. 38. This technique allows the removal of blocking MOSFETs M5/M7, referring to FIG. 35.

J. Embodiment of Dual Output Regtifier Having 4:1 Switched Capacitor Converters as Synchronized Loads The above regulation techniques and load synchronizations were described with reference to a 2:1 switched capacitor converter, but as shown in the schematic of FIG. 39 may also be applied to a 4:1 switched capacitor converter.

Figure 39:
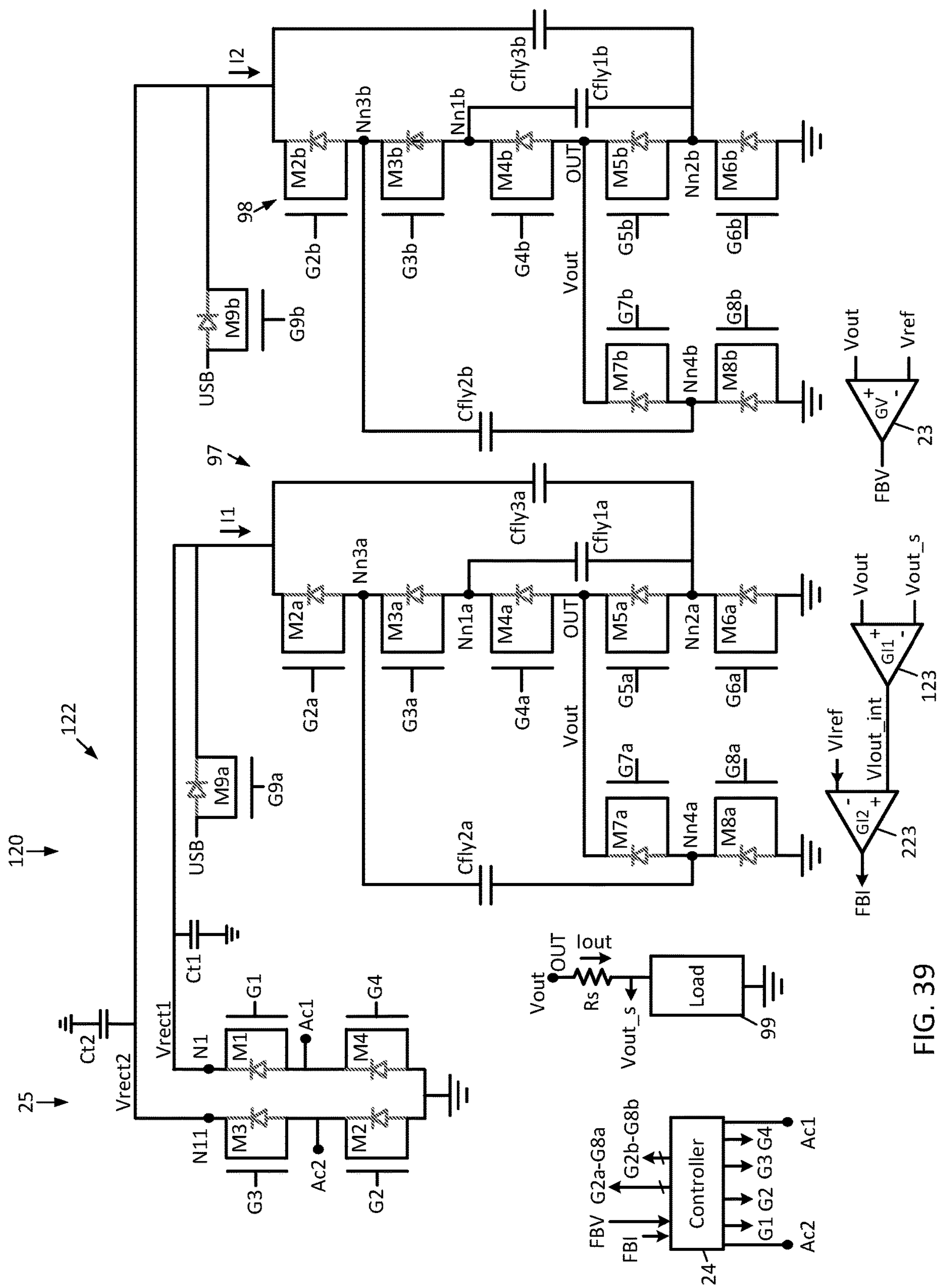
FIG. 39 is a detailed schematic diagram of another possible implementation of the wireless power transmission system of FIG. 34.

In FIG. 39, a modified Dickson design is used. Here, the regtifier 25 is configured as two half-bridge rectifiers respectively formed by transistors M1/M4 and M3/M2, each with a switched capacitor converter 97 and 98 coupled thereto, with both switched capacitor converters 97 and 98 coupled to a load 99 through a sense resistor Rs.

The first switched capacitor controller 97 includes: an n-channel transistor M2*a* having its drain coupled to node N1, its source coupled to node Nn3*a*, and its gate controlled by a gate drive signal G2*a*; an n-channel transistor M3*a* having its drain coupled to the source of transistor M2*a*, its source coupled to node Nn1*a*, and its gate controlled by a gate drive signal G3*a*; an n-channel transistor M4*a* having its drain coupled to node Nn1*a*, its source coupled to the output node OUT, and its gate controlled by a gate drive signal G4*a*; an n-channel transistor M5*a* having its drain coupled to the output node OUT, its source coupled to node Nn2*a*, and its gate controlled by a gate drive signal G5*a*; an n-channel transistor M6*a* having its drain coupled to node Nn2*a*, its source coupled to ground, and its gate controlled by a gate drive signal G6*a*; an n-channel transistor M7*a* having its drain coupled to the output node OUT, its source coupled to node Nn4*a*, and its gate controlled by a gate drive signal G1*a*; and an n-channel transistor M8*a* having its drain coupled to node Nn4*a*, its source coupled to ground, and its gate controlled by a gate drive signal G8*a*. A flyback capacitor Cfly1*a* is coupled between nodes Nn1*a* and Nn2*a*, a flyback capacitor Cfly3*a* is coupled between nodes N1 and Nn2*a*, and a flyback capacitor Cfly2*a* is coupled between nodes Nn3*a* and Nn4*a*. An n-channel transistor M9*a*, to provide for USB power input to the converter 97 when the regtifier 25 is deactivated, has a drain coupled to node N1, a source coupled to a USB input, and a gate controlled by a gate drive signal G9*a*.

Here, the second switched capacitor controller 98 includes: an n-channel transistor M2*b* having its drain coupled to node N11, its source coupled to node Nn3*b*, and its gate controlled by a gate drive signal G2*b*; an n-channel transistor M3*b* having its drain coupled to the source of transistor M2*b*, its source coupled to node Nn1*b*, and its gate controlled by a gate drive signal G3*b*; an n-channel transistor M4*b* having its drain coupled to node Nn1*b*, its source coupled to the output node OUT, and its gate controlled by a gate drive signal G4*b*; an n-channel transistor M5*b* having its drain coupled to the output node OUT, its source coupled to node Nn2*b*, and its gate controlled by a gate drive signal G5*b*; an n-channel transistor M6*b* having its drain coupled to node Nn2*b*, its source coupled to ground, and its gate controlled by a gate drive signal G6*b*; an n-channel transistor M7*b* having its drain coupled to the output node OUT, its source coupled to node Nn4*b*, and its gate controlled by a gate drive signal G7*b*; and an n-channel transistor M8*b* having its drain coupled to node Nn4*b*, its source coupled to ground, and its gate controlled by a gate drive signal G8*b*. A flyback capacitor Cfly1*b* is coupled between nodes Nn1*b* and Nn2*b*, a flyback capacitor Cfly3*b* is coupled between nodes N11 and Nn2*b*, and a flyback capacitor Cfly2*b* is coupled between nodes Nn3*b* and Nn4*b*. An n-channel transistor M9*b*, to provide for USB power input to the converter 97 when the regtifier 25 is deactivated, has a drain coupled to node N11, a source coupled to a USB input, and a gate controlled by a gate drive signal G9*b*.

Current and voltage feedback is taken at the output node OUT. The voltage feedback signal FBV is produced by the amplifier 23 which receives the load voltage Vout at its non-inverting input and the reference voltage Vref at its inverting terminal. The amplifier 123 converts the voltage across the sense resistor Rs to a voltage VIload_int representative of the load current Iload, and the amplifier 223 generates the current feedback signal FBI as representative of the difference between VIload_int and a voltage VIref representative of a reference current Iref, the reference current Iref being a threshold amount higher than Iload during steady state operation. For feedback purposed, the controller 24 generates the gate drive signals G1-G4 for the transistors M1-M4 of the regtifier as described above to perform regulation based upon voltage and/or current in anti-phase and/or in-phase mode. The controller 24 also generates the gate drive signals G2*a*-G8*a* and G2*b*-G8*b* for synchronizing the configuration of the power converters 97 and 98 (between phases A and B) with the switching frequency of the regtifier 25.

Figure 40A:
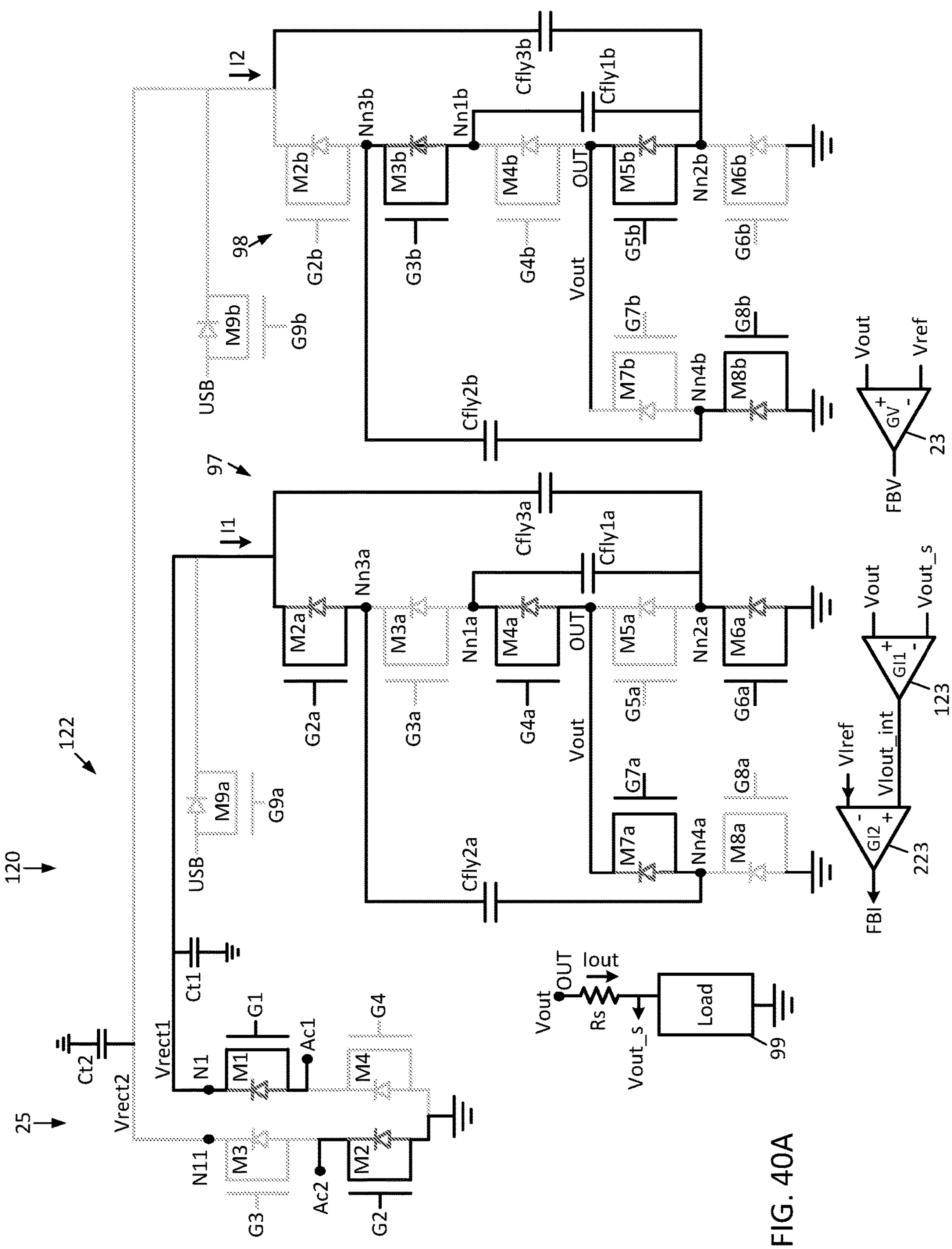
FIGS. 40A and 40B show the two first and second phase configurations possible for the power converters of FIG. 39.
Figure 40B:
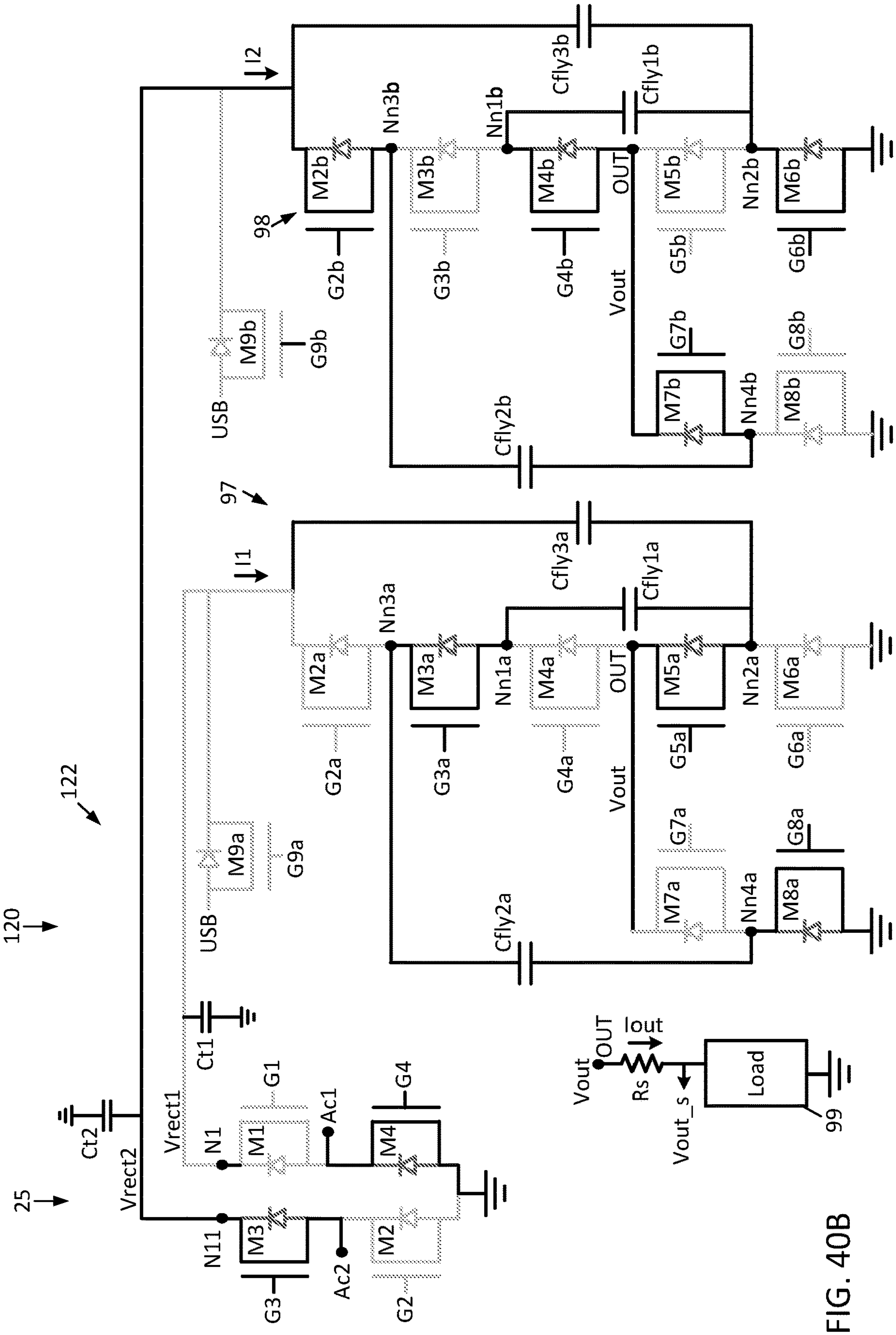

Operation is best understood with additional reference to FIGS. 40A-40B. The regtifier 25 and switched capacitor converters 97/98 are shown in the first phase of operation (phase A) in FIG. 40A. In phase A, transistors M1, M2*a*, and M7*a* are on, forming a series connection from Ac1, through transistor M1 to transistor M2*a*, through flyback capacitor Cfly2*a* and transistor M7*a* to the output terminal OUT. Also, a series connection is formed through transistor M1, through flyback capacitor Cfly3*a* to ground through transistor M6*a*. Still further, flyback capacitor Cfly1*a* is coupled in parallel between the output node OUT and ground by transistor M4*a* and transistor M6*a*. As a result, during phase A, flyback capacitors Cfly2*a* and Cfly3*a* are being charged by current from the activated half bridge containing transistor M1, while flyback capacitor Cfly1*a* is sharing charge with the load 99 through the output node OUT. Also, during phase A, flyback capacitors Cfly1*b*, Cfly2*b* are connected to the load 99 to share charge while Cfly3*b* is just holding N11 at 3*Vout to help ensure M3 is blocked.

In the second phase of operation (phase B), shown in FIG. 40B, the transistors M3, M2*b*, and M7*b* are on, forming a series connection from Ac2, through transistor M3 to transistor M2*b*, through flyback capacitor Cfly2*b* and transistor M7*b* to the output terminal OUT. Also, a series connection is formed through transistor M3, through flyback capacitor Cfly3*b* to ground through transistor M6*b*. Flyback capacitor Cfly1*b* is coupled in parallel between the output node OUT and ground by transistor M4*b* and transistor M6*b*. As a result, during phase B, flyback capacitors Cfly2*b* and Cfly3*b* are being charged by current from the activated half bridge containing transistor M3, while flyback capacitor Cfly1*b* is sharing charge with the load 99 through the output node OUT. Also, during phase B, flyback capacitors Cfly1*a*, Cfly2*a* are connected to the load 99 to share charge, while Cfly3*b* is just holding N1 at 3*Vout helping to ensure N1 is blocked.

By switching the converters 97 and 98 between phase A and phase B synchronously with the switching of the regtifier 25, as shown in the sequence of FIGS. 40A-40B, the load 99 can be continuously charged at the desired voltage, without the need for transistors between the regtifier 25 and converters 97 and 98.

Figure 41:
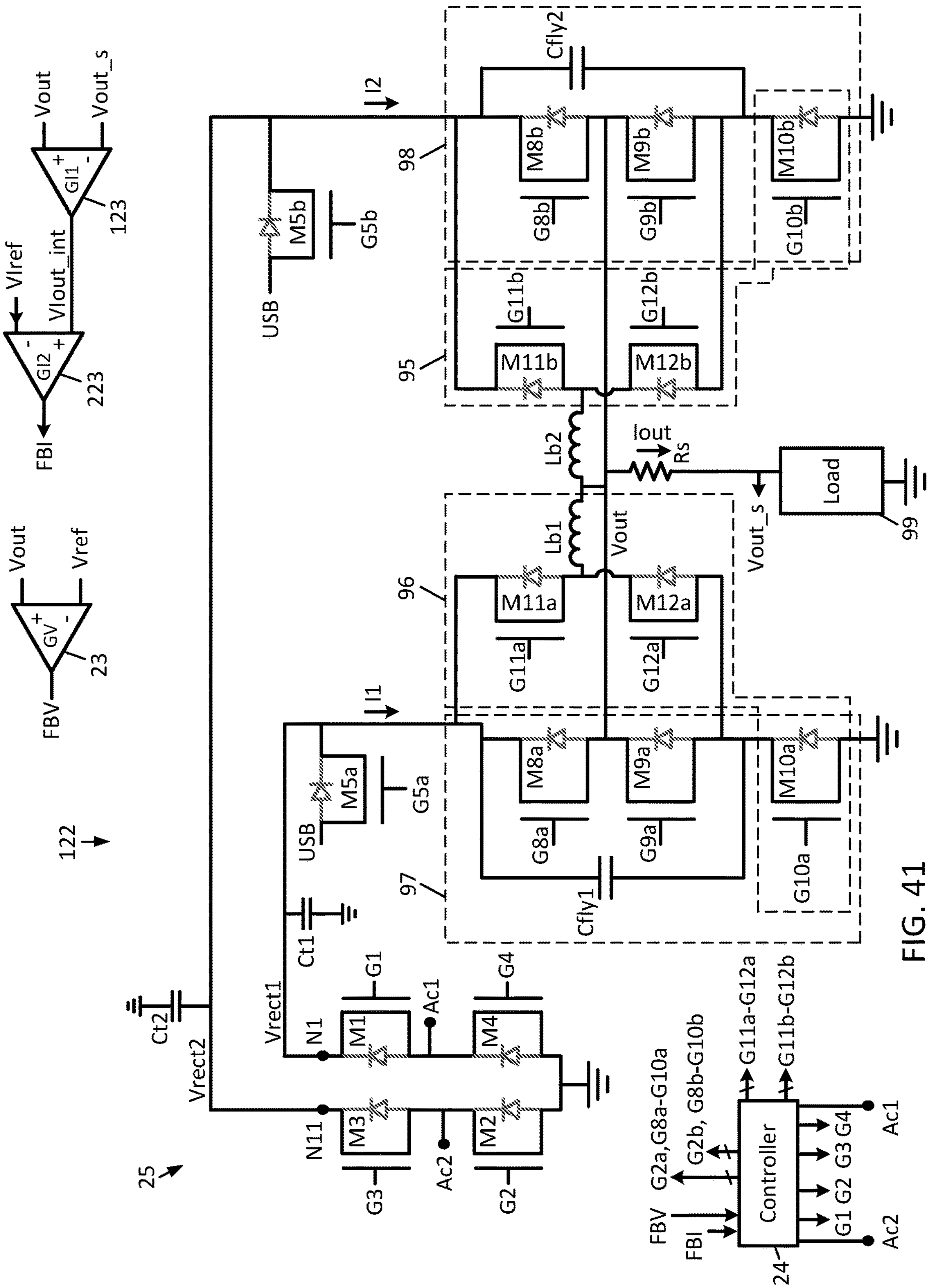
FIG. 41 is a detailed schematic diagram of a further possible implementation of the wireless power transmission system of FIG. 34 in which two buck converters have been added to charge the load.

Referring now to FIG. 41, 3 L buck converters may be added to the design of FIG. 36 to produce a wireless charging system 120 including a receiver 120 using switched capacitor converters 97 and 98 operating synchronously with the half-bridges of the regtifier 25 to charge the load 99, and once the load 99 is fully charged, using 3 L buck converters 96 and 95 operating synchronously with the half-bridges to maintain charging of the load 99 at a trickle.

As compared to the design of FIG. 36, the 3 L buck converters 95 and 96 have been added. The buck converter 96 includes: an n-channel transistor M11*a* having a drain coupled to node N1, a source coupled to the output node OUT through inductor Lb1, and a gate controlled by the gate control voltage Gila; and an n-channel transistor M12*a* having a drain coupled to the first terminal of inductor Lb1, a source coupled to the drain of the n-channel transistor M10*a*, and a gate controlled by gate control signal G12*a*. The buck converter 96 shares n-channel transistor M10*a* with the switched capacitor converter 97.

The buck converter 95 includes: an n-channel transistor M11*b* having a drain coupled to node N11, a source coupled to the output node OUT through inductor L21, and a gate controlled by the gate control voltage G11*b*; and an n-channel transistor M12*b* having a drain coupled to the first terminal of inductor Lb2, a source coupled to the drain of the n-channel transistor M10*b*, and a gate controlled by gate control signal G12*b*. The buck converter 95 shares n-channel transistor M10*b* with the switched capacitor converter 98.

In operation, until full charge (or close to full charge) of load 99 is reached, the switched capacitor converters 97 and 98 operate synchronously with the switching of the regtifier 25 as explained in detail above. Once full charge or close to is reached, the buck converters 96 and 95 synchronously switch together with the switched capacitor converters 97 and 98 to thereby provide a tickle charge to the load 99.

Figure 42:
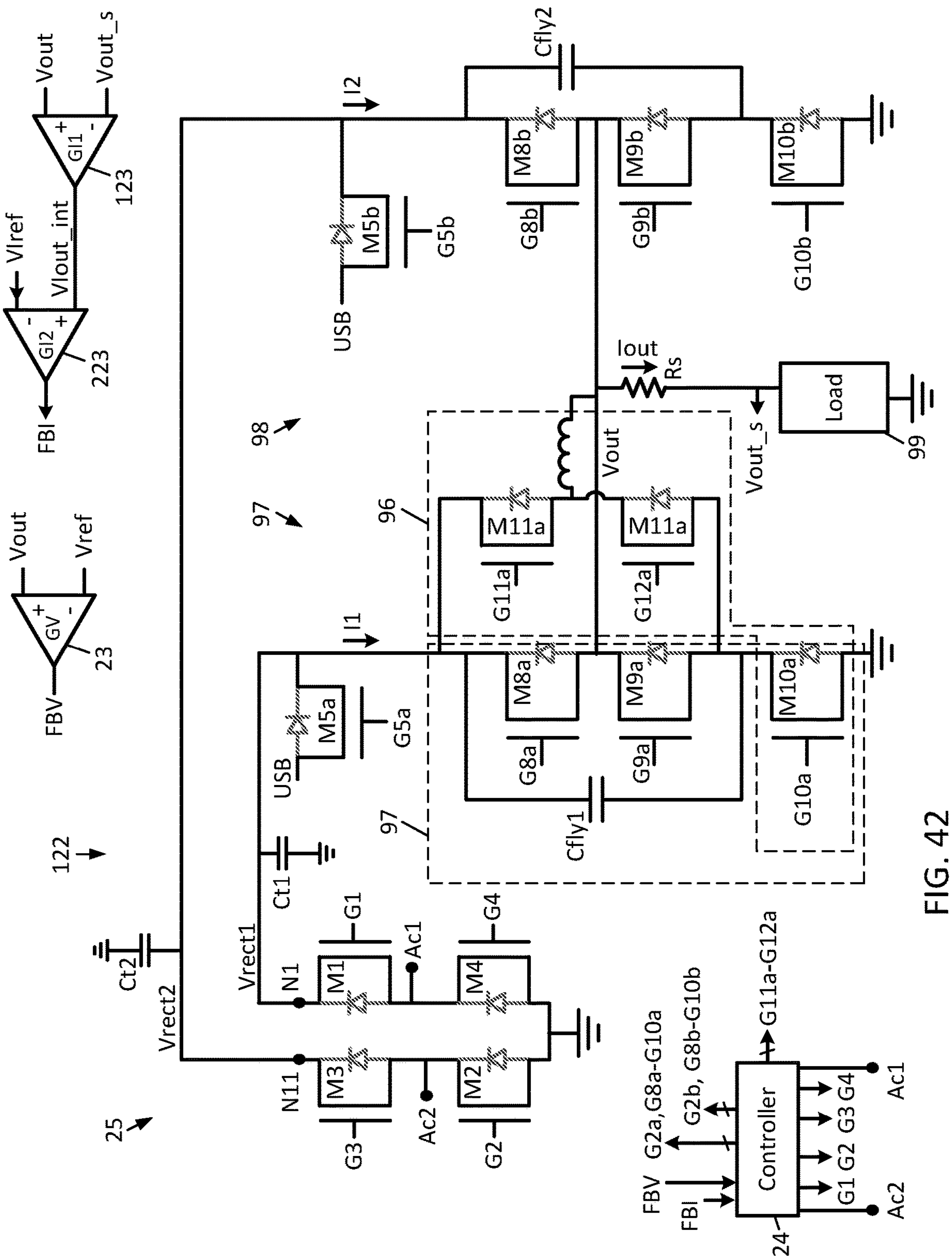
FIG. 42 is a detailed schematic diagram of a further possible implementation of the wireless power transmission system of FIG. 34 in which a single buck converter has been added to trickle charge the load.

Referring now to FIG. 42, due to the usage of the buck converter 96 to provide a trickle charge to the load 99 when fully charged or close to it, the buck converter 95 may be eliminated as trickle uses moderate power and the system could operate on one Ac1 positive alternance for example.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power reception system, comprising:

a bridge rectifier arrangement of transistors receiving an input time varying power signal and being configured as first and second half-bridges, the first half-bridge being coupled between a first output node and ground, the second half-bridge being coupled between a second output node and ground;

a first voltage feedback circuit configured to compare a voltage at a first load node to a first reference voltage and generate a first feedback voltage based thereupon;

a second voltage feedback circuit configured to compare a voltage at a second load node to a second reference voltage and generate a second feedback voltage based thereupon;

a control circuit configured to receive the input time varying power signal and the first and second feedback voltages, and generate gate voltages for the transistors of the bridge rectifier arrangement based upon the input time varying power signal, and the first and second feedback voltages to cause:

turn on of a first transistor of the first half-bridge during a first phase, and turn on of a second transistor of the first half-bridge during a second phase, to thereby cause rectification of the input time varying power signal to produce a first output voltage at the first output node;

turn on of a second transistor of the second half-bridge during the first phase, and turn on of a first transistor of the second half-bridge during the second phase, to thereby cause rectification of the input time varying power signal to produce a second output voltage at the second output node;

modulation of a gate voltage of the first transistor of the first half-bridge or a gate voltage of the second transistor of the first half-bridge during the first phase based upon the first feedback voltage, modulation of the gate voltage of the second transistor of the first half-bridge or the gate voltage of the first transistor of the first half-bridge during the second phase based upon the first feedback voltage, modulation of a gate voltage of the second transistor of the second half-bridge or a gate voltage of the first transistor of the second half-bridge during the first phase based upon the second feedback voltage, and modulation of the gate voltage of the first transistor of the second half-bridge or the gate voltage of the second transistor of the second half-bridge during the second phase based upon the second feedback voltage, to thereby cause dissipation of excess power delivered by the input time varying power signal and therefore perform output voltage regulation on top of rectification.

2. The wireless power reception system of claim 1, further comprising:

a first current sensor coupled between the first output node and the first load node and configured to sense a first current flowing from the first output node to the first load node;

a second current sensor coupled between the second output node and the second load node and configured to sense a second current flowing from the second output node to the second load node;

a first current feedback circuit configured to compare the sensed first current to a first reference current and generate a third feedback voltage based thereupon; and a second current feedback circuit configured to compare the sensed second current to a second reference current and generate a fourth feedback voltage based thereupon; and wherein the control circuit causes the modulation of the gate voltage of the first transistor of the first half-bridge or the gate voltage of the second transistor of the first half-bridge during the first phase based upon the first and third feedback voltages, modulation of the gate voltage of the second transistor of the first half-bridge or the gate voltage of the first transistor of the first half-bridge during the second phase based upon the first and third feedback voltages; and wherein the control circuit causes the modulation of the gate voltage of the second transistor of the second half-bridge or the gate voltage of the first transistor of the second half-bridge during the first phase based upon the second and fourth feedback voltages, and modulation of the gate voltage of the first transistor of the second half-bridge or the gate voltage of the second transistor of the second half-bridge during the second phase based upon the second and fourth feedback voltages.

3. The wireless power reception system of claim 2, wherein the control circuit causes modulation of the gate voltage of the first transistor of the first half-bridge during the first phase, and modulation of the gate voltage of the second transistor of the first half-bridge during the second phase; and wherein the control circuit causes modulation of the gate voltage of the second transistor of the second half-bridge during the first phase, and modulation of the gate voltage of the first transistor of the second half-bridge during the second phase, thereby performing output voltage regulation in an in-phase mode.

4. The wireless power reception system of claim 2, wherein the control circuit causes modulation of the gate voltage of the second transistor of the first half-bridge during the first phase, and modulation of the gate voltage of the first transistor of the first half-bridge during the second phase; and wherein the control circuit causes modulation of the gate voltage of the first transistor of the second half-bridge during the first phase, and modulation of the gate voltage of the second transistor of the second half-bridge during the second phase, thereby performing output voltage regulation in an anti-phase mode.

5. The wireless power reception system of claim 2, wherein the control circuit causes modulation of the gate voltage of the first transistor of the first half-bridge during the first phase, and modulation of the gate voltage of the second transistor of the first half-bridge during the second phase; wherein the control circuit causes modulation of the gate voltage of the second transistor of the second half-bridge during the first phase, and modulation of the gate voltage of the first transistor of the second half-bridge during the second phase, thereby performing output voltage regulation in an in-phase mode; wherein the control circuit causes modulation of the gate voltage of the second transistor of the first half-bridge during the first phase, and modulation of the gate voltage of the first transistor of the first half-bridge during the second phase; and wherein the control circuit causes modulation of the gate voltage of the first transistor of the second half-bridge during the first phase, and modulation of the gate voltage of the second transistor of the second half-bridge during the second phase, thereby performing output voltage regulation in an anti-phase mode.

6. The wireless power reception system of claim 5, wherein the control circuit performs output voltage regulation in the anti-phase mode at startup until a threshold voltage is reached, and performs output voltage regulation in either anti-phase mode or in-phase mode until a final voltage is reached.

7. The wireless power reception system of claim 1, further comprising:

a first switched capacitor voltage converter coupled between the first load node and ground, and providing a first output to an output node at which a load is coupled;

a second switched capacitor voltage converter coupled between the second load node and ground, and providing a second output to the output node at which the load is coupled.

8. The wireless power reception system of claim 7, further comprising:

a first current sensor coupled between the first output node and the first load node and configured to sense a first current flowing from the first output node to the first load node;

a second current sensor coupled between the second output node and the second load node and configured to sense a second current flowing from the second output node to the second load node;

a first current feedback circuit configured to compare the sensed first current to a first reference current and generate a third feedback voltage based thereupon; and a second current feedback circuit configured to compare the sensed second current to a second reference current and generate a fourth feedback voltage based thereupon; and wherein the control circuit causes the modulation of the gate voltage of the first transistor of the first half-bridge or the gate voltage of the second transistor of the first half-bridge during the first phase based upon the first and third feedback voltages, modulation of the gate voltage of the second transistor of the first half-bridge or the gate voltage of the first transistor of the first half-bridge during the second phase based upon the first and third feedback voltages; and wherein the control circuit causes the modulation of the gate voltage of the second transistor of the second half-bridge or the gate voltage of the first transistor of the second half-bridge during the first phase based upon the second and fourth feedback voltages, and modulation of the gate voltage of the first transistor of the second half-bridge or the gate voltage of the second transistor of the second half-bridge during the second phase based upon the second and fourth feedback voltages.

9. A wireless power reception system, comprising:

a bridge rectifier arrangement of transistors receiving an input time varying power signal and being configured as first and second half-bridges, the first half-bridge being coupled between a first output node and ground, the second half-bridge being coupled between a second output node and ground;

a first switched capacitor voltage converter coupled between the first output node and ground, and providing a first output to an intermediate output node;

a second switched capacitor voltage converter coupled between the second output node and ground, and providing a second output to the intermediate output node;

a current sensor coupled between the intermediate output node and an output node at which a load is coupled;

a voltage feedback circuit configured to compare a voltage at the intermediate output node to a reference voltage, and generate a first feedback voltage based thereupon;

a current feedback circuit configured to compare a current sensed by the current sensor to a voltage representative of a reference current, and generate a second feedback voltage based thereupon;

a control circuit configured to receive the input time varying power signal and the first and second feedback signal voltages, and generate gate voltages for the transistors of the bridge rectifier arrangement based upon the input time varying power signal, and the first and second feedback voltages to cause:

turn on of a first transistor of the first half-bridge during a first phase, and turn on of a second transistor of the first half-bridge during a second phase, to thereby cause rectification of the input time varying power signal to produce a first output voltage at the first output node;

turn on of a second transistor of the second half-bridge during the first phase, and turn on of a first transistor of the second half-bridge during the second phase, to thereby cause rectification of the input time varying power signal to produce a second output voltage at the second output node;

modulation of a gate voltage of the first transistor of the first half-bridge or a gate voltage of the second transistor of the first half-bridge during the first phase based upon the first feedback voltage, modulation of the gate voltage of the second transistor of the first half-bridge or the gate voltage of the first transistor of the first half-bridge during the second phase based upon the first feedback voltage, modulation of a gate voltage of the second transistor of the second half-bridge or a gate voltage of first transistor of the second half-bridge during the first phase based upon the second feedback voltage, and modulation of the gate voltage of the first transistor of the second half-bridge or the gate voltage of the second transistor of the second half-bridge during the second phase based upon the second feedback voltage, to thereby cause dissipation of excess power delivered by the input time varying power signal and therefore perform output voltage regulation on top of rectification.

10. The wireless power reception system of claim 9, wherein the control circuit causes modulation of the gate voltage of the first transistor of the first half-bridge during the first phase, and modulation of the gate voltage of the second transistor of the first half-bridge during the second phase; and wherein the control circuit causes modulation of the gate voltage of the second transistor of the second half-bridge during the first phase, and modulation of the gate voltage of the first transistor of the second half-bridge during the second phase, thereby performing output voltage regulation in an in-phase mode.

11. The wireless power reception system of claim 9, wherein the control circuit causes modulation of the gate voltage of the second transistor of the first half-bridge during the first phase, and modulation of the gate voltage of the first transistor of the first half-bridge during the second phase; and wherein the control circuit causes modulation of the gate voltage of the first transistor of the second half-bridge during the first phase, and modulation of the gate voltage of the second transistor of the second half-bridge during the second phase, thereby performing output voltage regulation in an anti-phase mode.

12. The wireless power reception system of claim 9, wherein the first switched capacitor voltage converter is switchable between first and second configurations, with the first switched capacitor voltage converter being coupled to the first half-bridge during the first phase and decoupled from the first half-bridge during the second phase;

wherein the first switched capacitor voltage circuit is switched by the control circuit into its first configuration during the first phase and into its second configuration during the second phase; and wherein the first switched capacitor voltage converter is charged by the first half-bridge when in its first configuration and shares charge with the load when in its second configuration.

13. The wireless power reception system of claim 12, wherein the second switched capacitor voltage converter is switchable between first and second configurations, with the second switched capacitor voltage converter being coupled to the second half-bridge during the second phase and decoupled from the second half-bridge during the first phase;

wherein the second switched capacitor voltage circuit is switched by the control circuit into its second configuration during the first phase and into its first configuration during the second phase; and wherein the second switched capacitor voltage converter is charged by the second half-bridge when in its second configuration and shares charge with the load when in its first configuration.

14. The wireless power reception system of claim 12, further comprising a buck voltage converter coupled between the first output node and the output node, the control circuit activating the buck voltage converter when the load is within a threshold of a final charging voltage.

15. The wireless power reception system of claim 14, wherein the buck voltage converter shares at least one transistor with the first switched capacitor converter.

16. The wireless power reception system of claim 15, wherein the buck voltage converter comprises a three-level buck converter.

17. The wireless power reception system of claim 14, wherein the first switched capacitor voltage converter comprises a 2:1 switched capacitor converter.

18. The wireless power reception system of claim 12, wherein the first switched capacitor voltage converter comprises a 2:1 switched capacitor converter.

19. The wireless power reception system of claim 12, wherein the first switched capacitor voltage converter comprises a 4:1 switched capacitor converter.

* * * * *